US011980095B2

(12) United States Patent
Jeon et al.

(10) Patent No.: US 11,980,095 B2
(45) Date of Patent: May 7, 2024

(54) HEAT CONVERTER

(71) Applicant: LG INNOTEK CO., LTD., Seoul (KR)

(72) Inventors: Seong Jae Jeon, Seoul (KR); Un Hak Lee, Seoul (KR); Jong Hyun Kang, Seoul (KR); Young Sam Yoo, Seoul (KR); Tae Woong Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 705 days.

(21) Appl. No.: 17/041,267

(22) PCT Filed: Apr. 4, 2019

(86) PCT No.: PCT/KR2019/003984
§ 371 (c)(1),
(2) Date: Sep. 24, 2020

(87) PCT Pub. No.: WO2019/194595
PCT Pub. Date: Oct. 10, 2019

(65) Prior Publication Data
US 2021/0074901 A1    Mar. 11, 2021

(30) Foreign Application Priority Data

Apr. 6, 2018    (KR) .................. 10-2018-0040278
Aug. 2, 2018    (KR) .................. 10-2018-0090499
Nov. 30, 2018   (KR) .................. 10-2018-0152540

(51) Int. Cl.
*H10N 10/13*    (2023.01)
*H10N 10/17*    (2023.01)
*H10N 10/80*    (2023.01)

(52) U.S. Cl.
CPC ............. *H10N 10/13* (2023.02); *H10N 10/17* (2023.02); *H10N 10/80* (2023.02)

(58) Field of Classification Search
CPC ......... H10N 10/13; H10N 10/17; H10N 10/80
See application file for complete search history.

(56) References Cited

U.S. PATENT DOCUMENTS

| 2011/0197597 A1 | 8/2011 | Chen et al. |
| 2016/0118567 A1 | 4/2016 | Kim |
| 2017/0108252 A1 | 4/2017 | Lee |

FOREIGN PATENT DOCUMENTS

| EP | 2713412 | 4/2014 |
| JP | H10-191670 | 7/1998 |

(Continued)

OTHER PUBLICATIONS

European Search Report dated Dec. 17, 2021 issued in Application No. 19782246.3.

(Continued)

*Primary Examiner* — Lindsey A Buck
(74) *Attorney, Agent, or Firm* — KED & Associates LLP

(57) ABSTRACT

A heat converter according to one embodiment of the present invention comprises: a plurality of unit modules respectively arranged in a first direction and a second direction that intersects the first direction; and a frame, which supports the plurality of unit modules, allows cooling water to flow in through one surface arranged in the first direction, and allows the cooling water to be discharged through the other surface arranged in the first direction, wherein each unit module includes: a cooling water passage chamber having first and second surfaces arranged to be spaced in the first direction, third and fourth surfaces arranged to be spaced in a third direction that intersects the first direction and the second direction, a fifth surface arranged to be spaced in the second direction such that cooing water flows therein, and a sixth surface from which cooling water is discharged; a first thermoelectric module arranged on the first surface; and a second thermoelectric module arranged on the second surface, the first thermoelectric module includes a plurality of group thermoelectric elements, each group thermoelectric element includes a plurality of thermoelectric elements, which have the same (Continued)

minimum spacing distance from the fourth surface in the third direction, and the plurality of thermoelectric elements in at least one group thermoelectric element of the plurality of group thermoelectric elements are electrically connected to each other.

19 Claims, 36 Drawing Sheets

(56) References Cited

FOREIGN PATENT DOCUMENTS

| | | |
|---|---|---|
| JP | 2008-186974 | 8/2008 |
| JP | 2017-034132 | 2/2017 |
| KR | 10-0986657 | 10/2010 |
| KR | 10-2013-0096410 | 8/2013 |
| KR | 10-2014-0073703 | 6/2014 |
| KR | 10-2015-0132209 | 11/2015 |
| KR | 10-2017-0011156 | 2/2017 |
| KR | 10-2018-0022427 | 3/2018 |
| WO | WO 2014/145293 | 9/2014 |
| WO | WO 2016/193453 | 12/2016 |
| WO | WO 2017/106966 | 6/2017 |

OTHER PUBLICATIONS

International Search Report dated Jul. 11, 2019 issued in Application No. PCT/KR2019/003984.
Japanese Office Action dated Apr. 25, 2023 issued in Application No. 2020-554210.
Korean Office Action dated Sep. 29, 2022 issued in Application No. 10-2018-0152540.
Korean Office Action dated Sep. 29, 2022 issued in Application No. 10-2018-0090499.

[FIG.1]
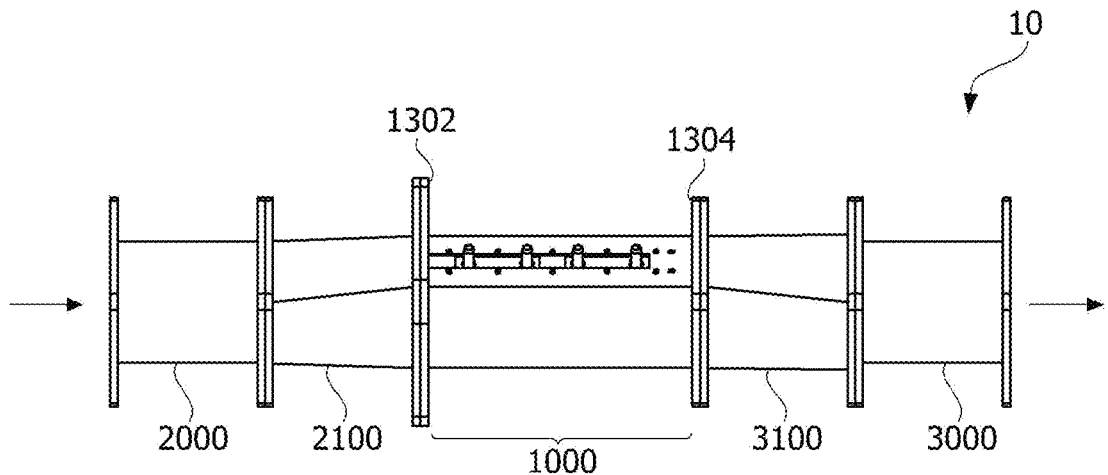
[FIG.2]
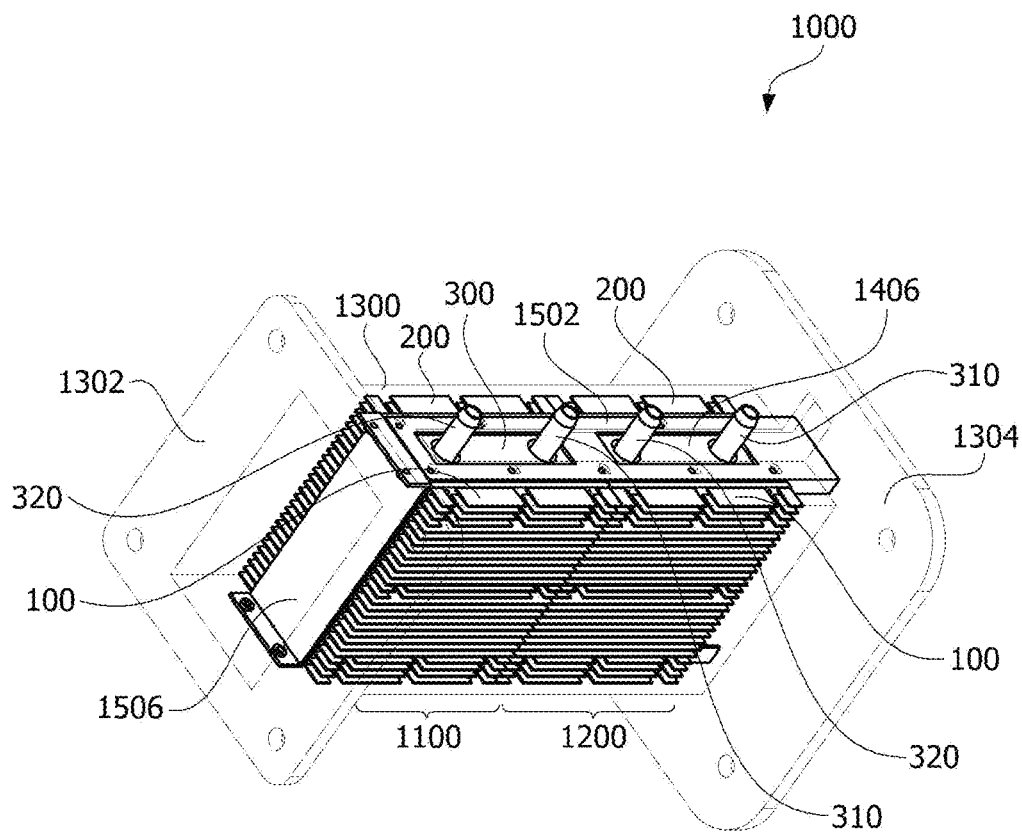

[FIG.3]
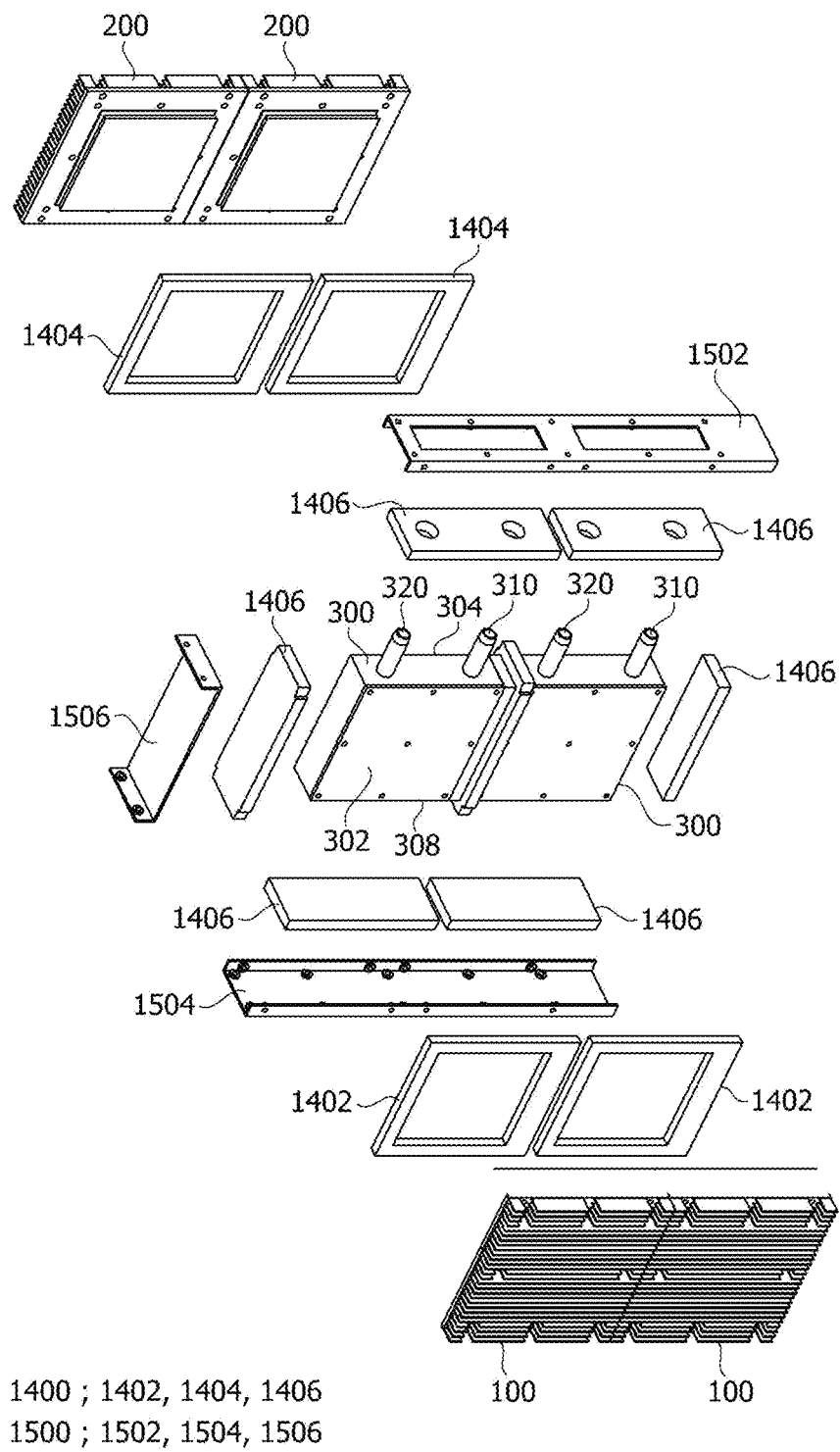

[FIG.4A]
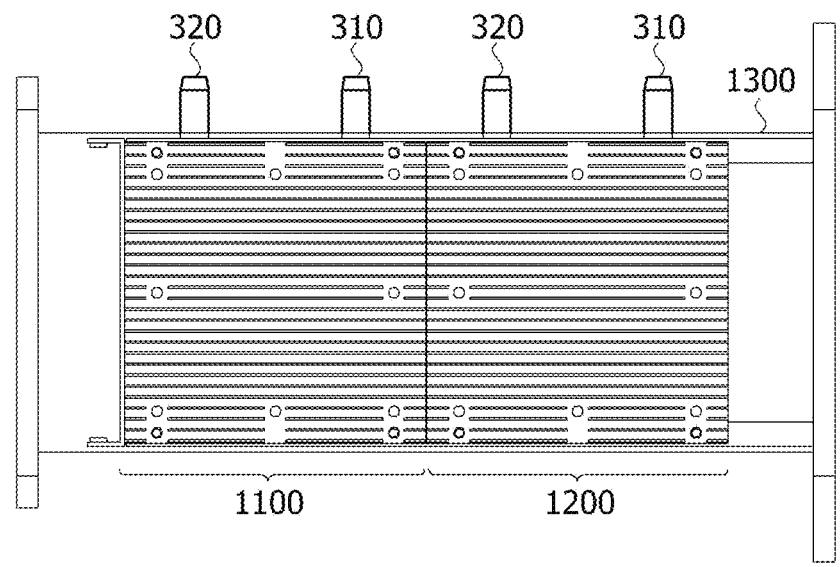
[FIG.4B]
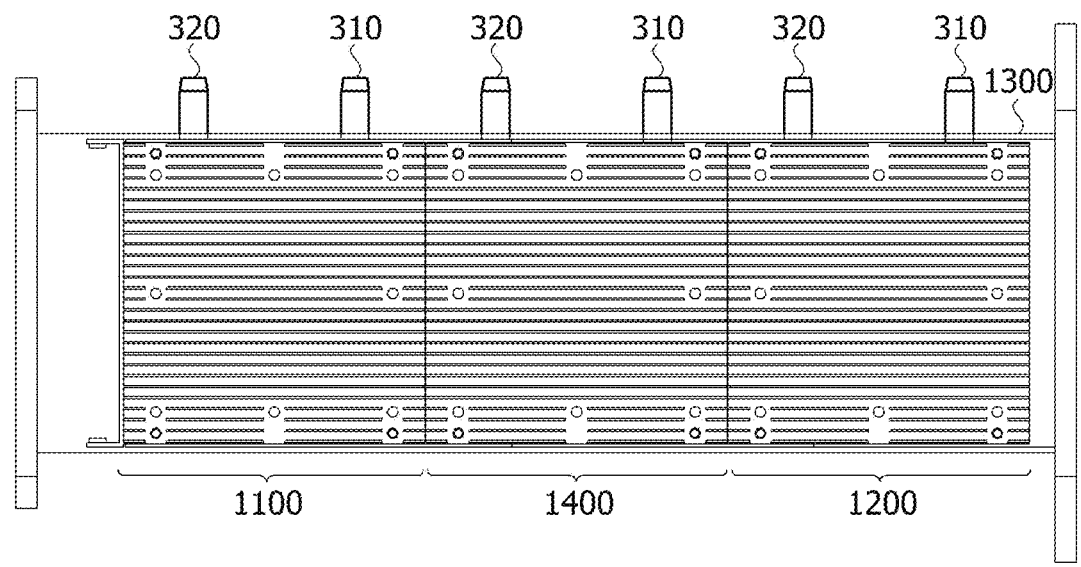

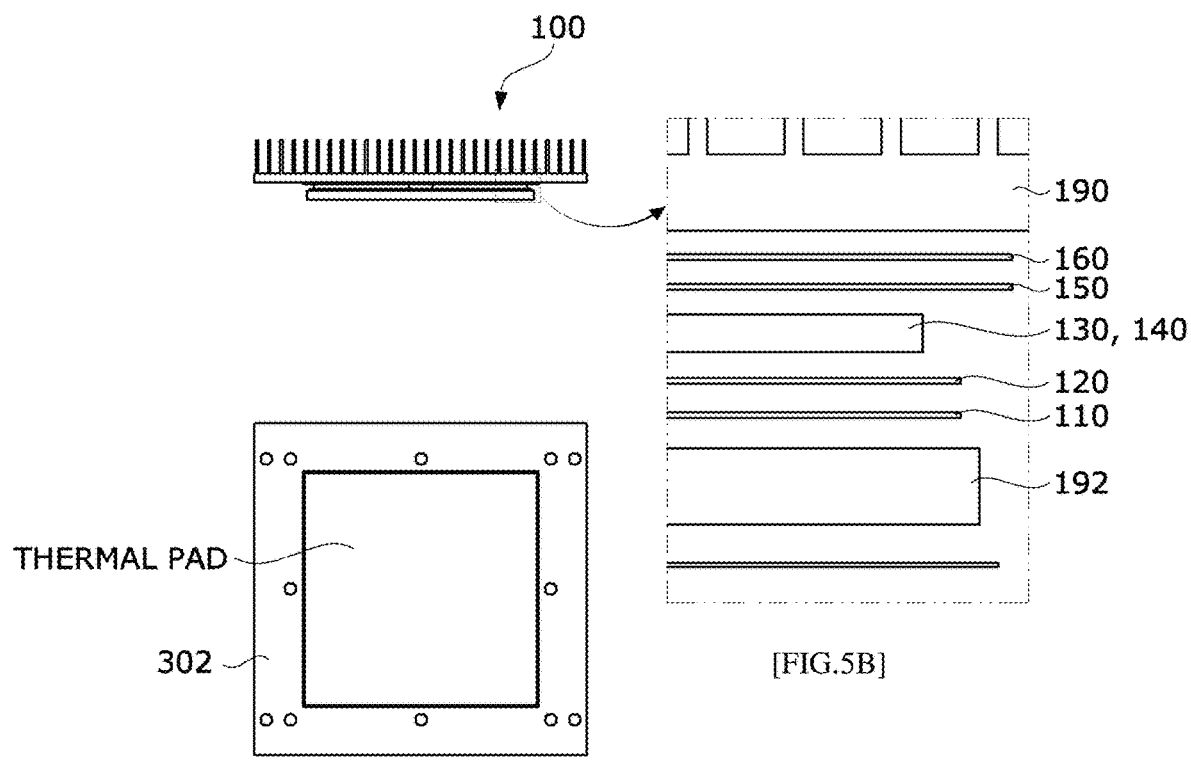

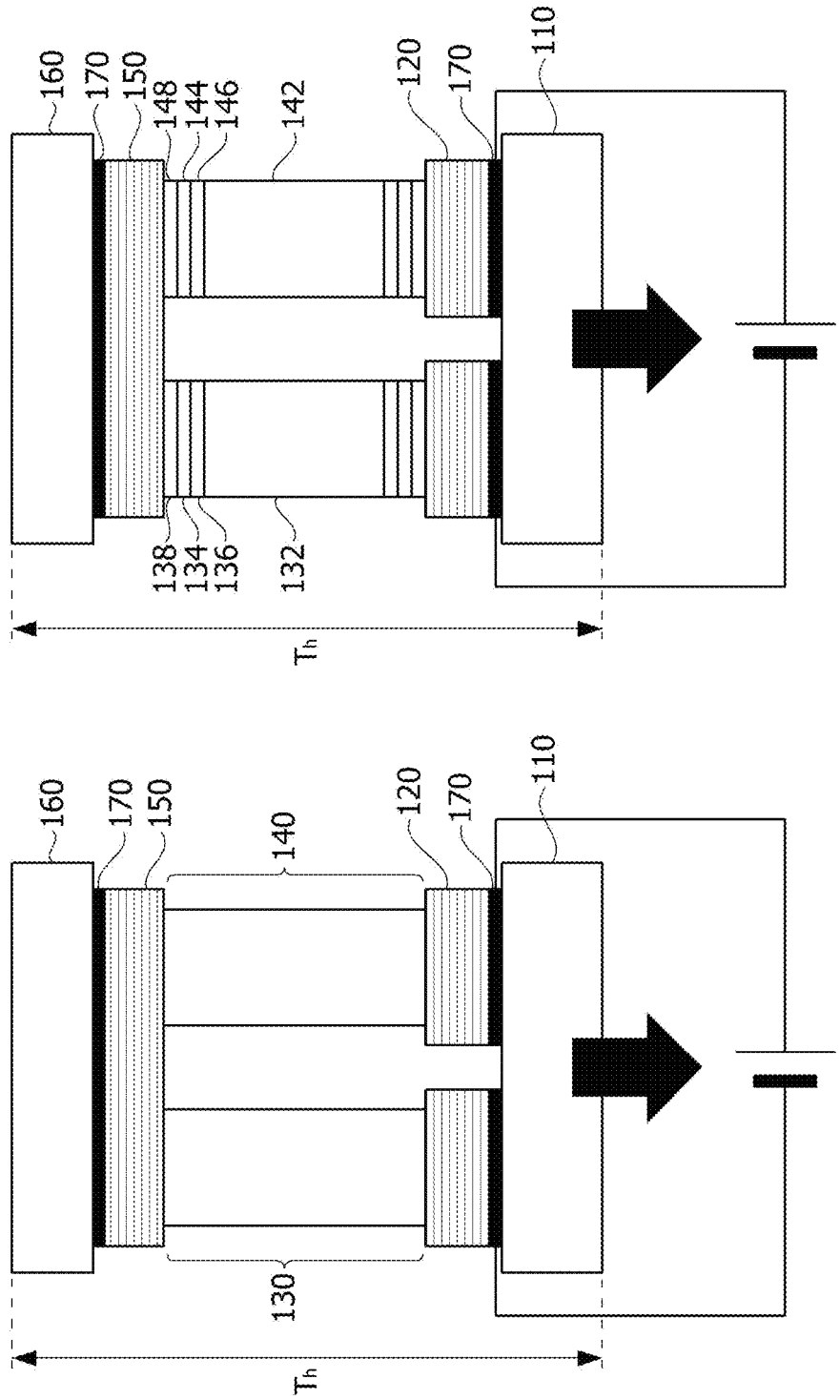

[FIG.7]
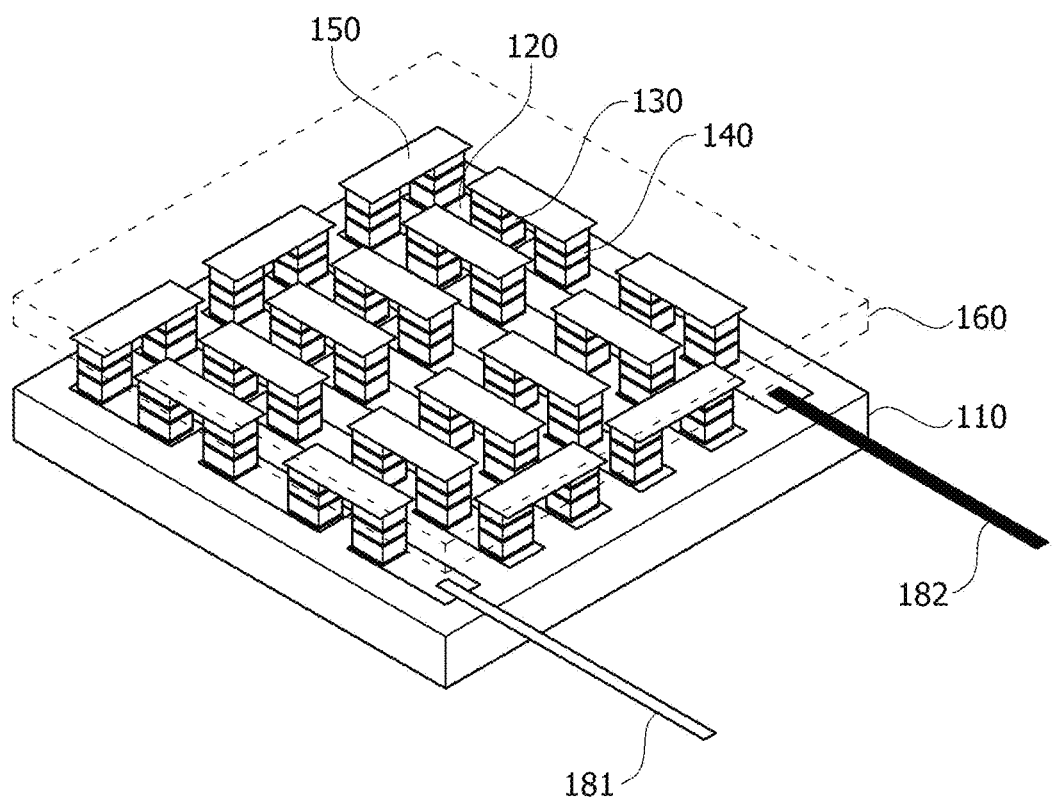

[FIG.8A]
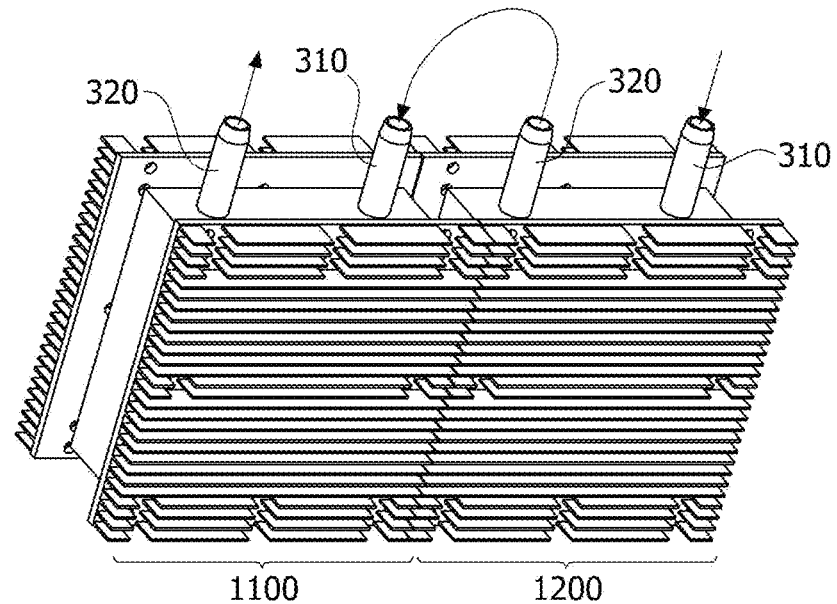
[FIG.8B]
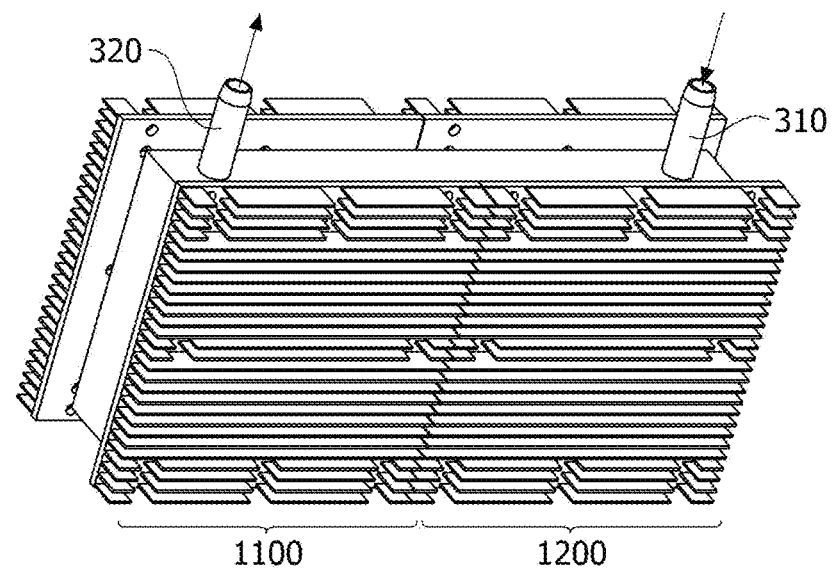

[FIG.9A]
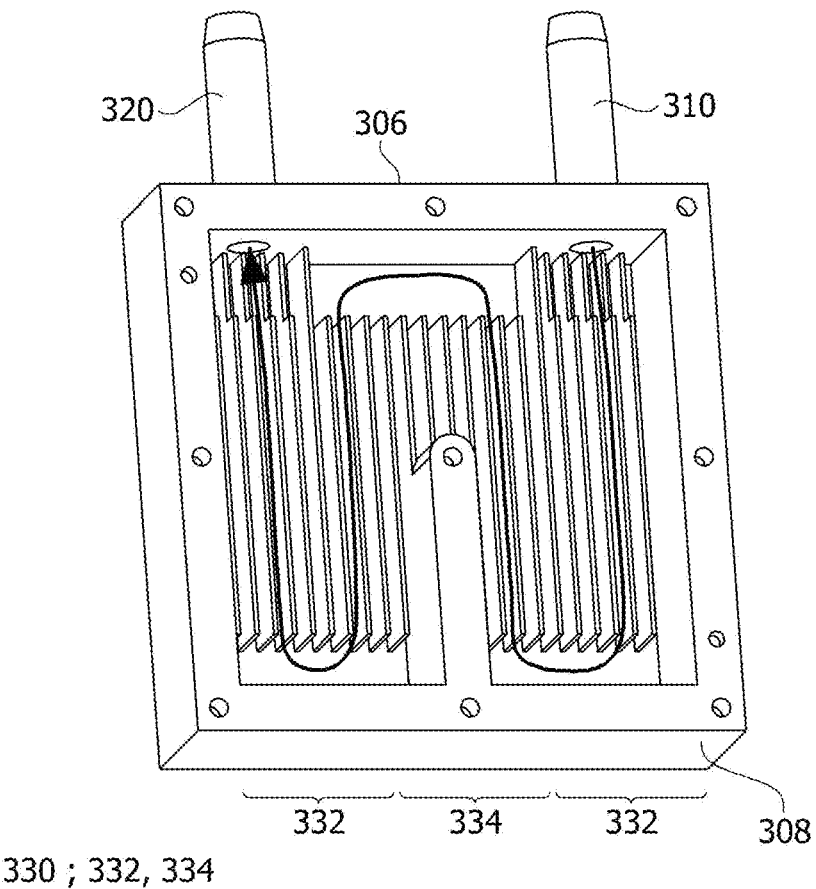
330 ; 332, 334
[FIG.9B]
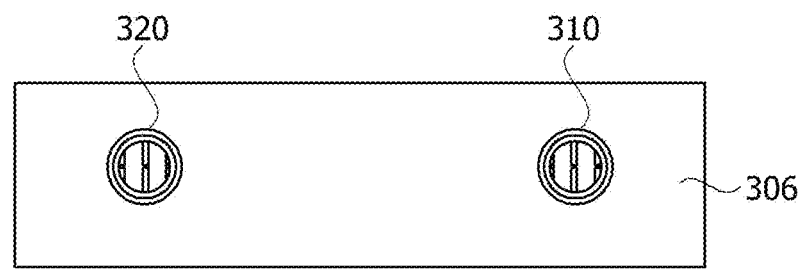

[FIG.10]
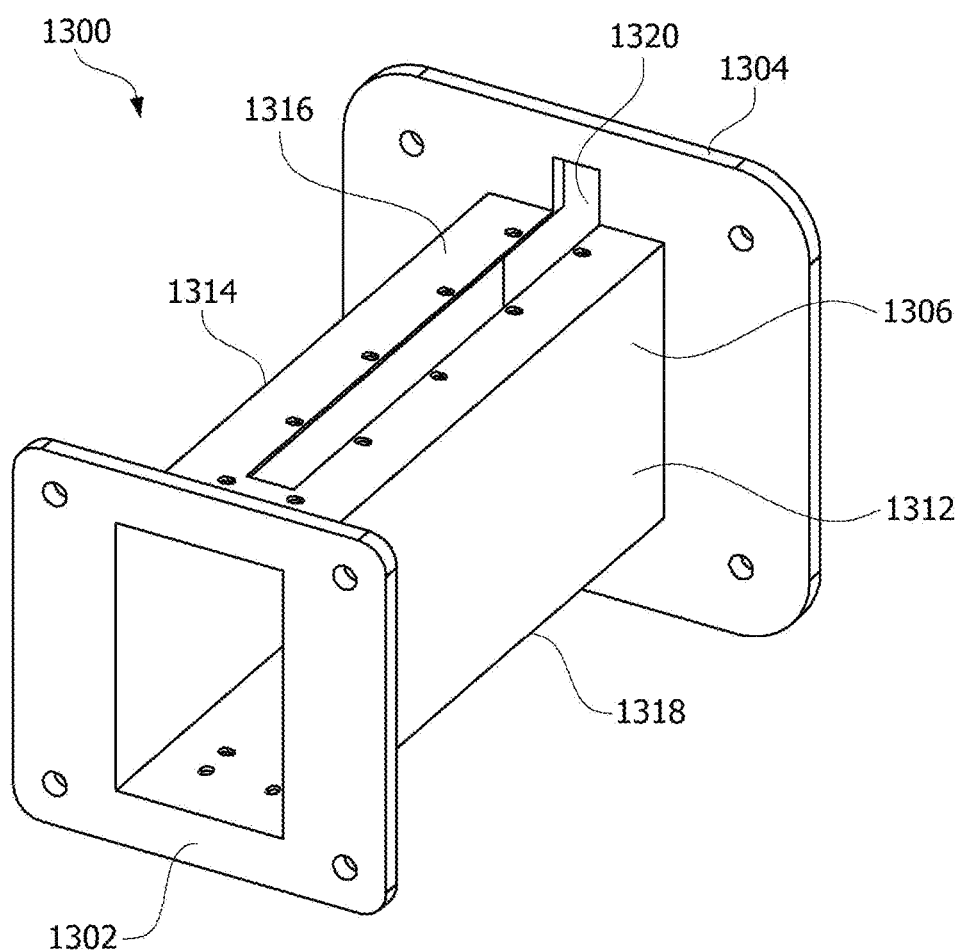

[FIG.11A]
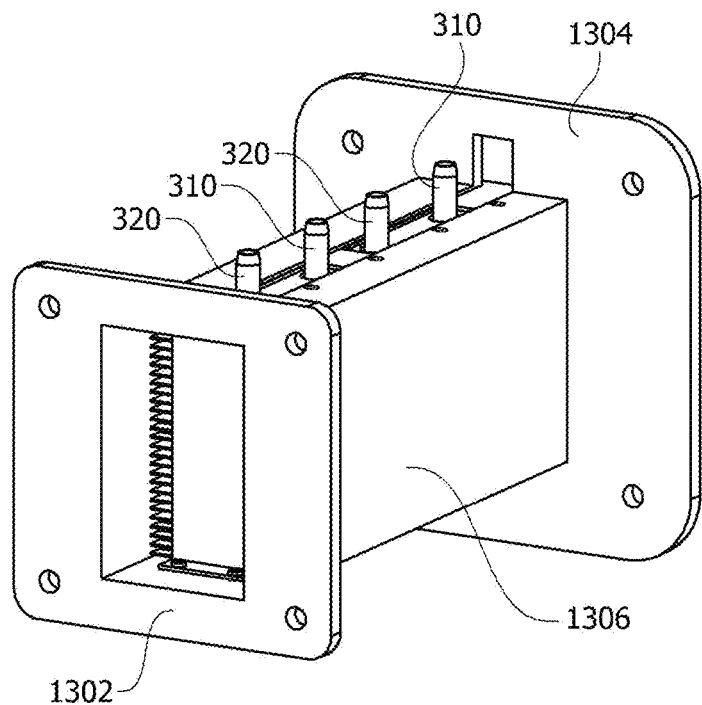
[FIG.11B]
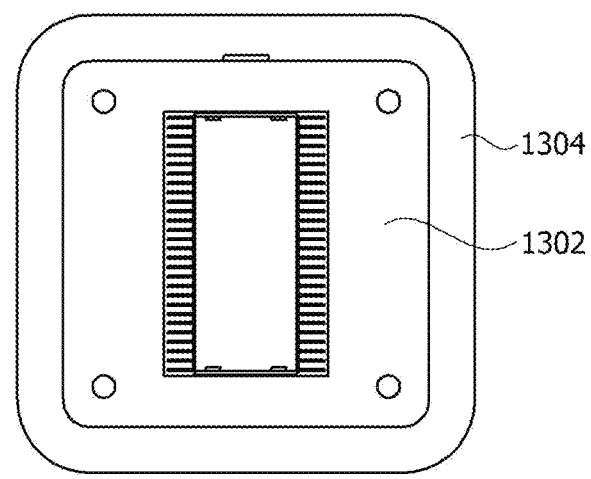

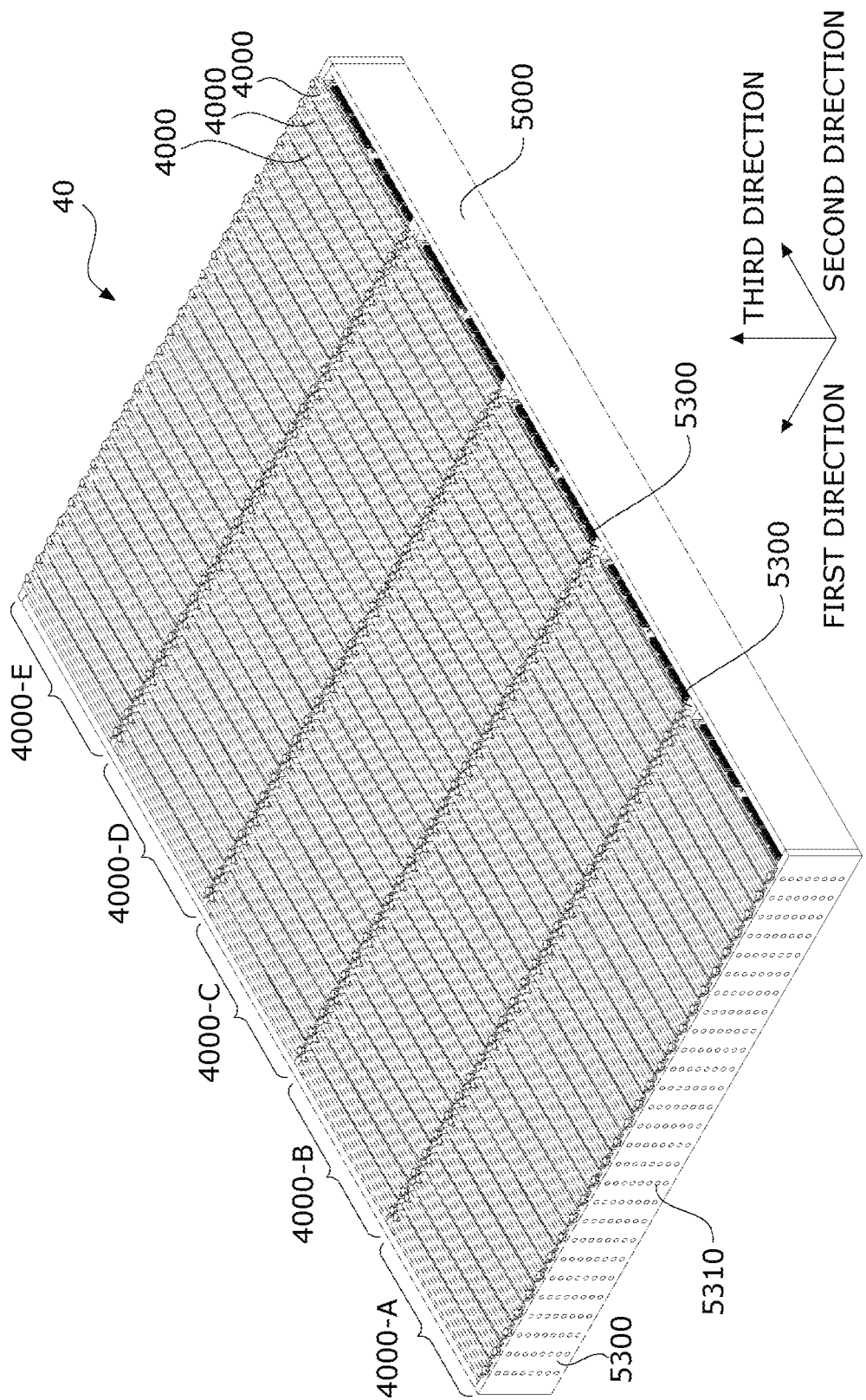
[FIG.12]

[FIG.13]
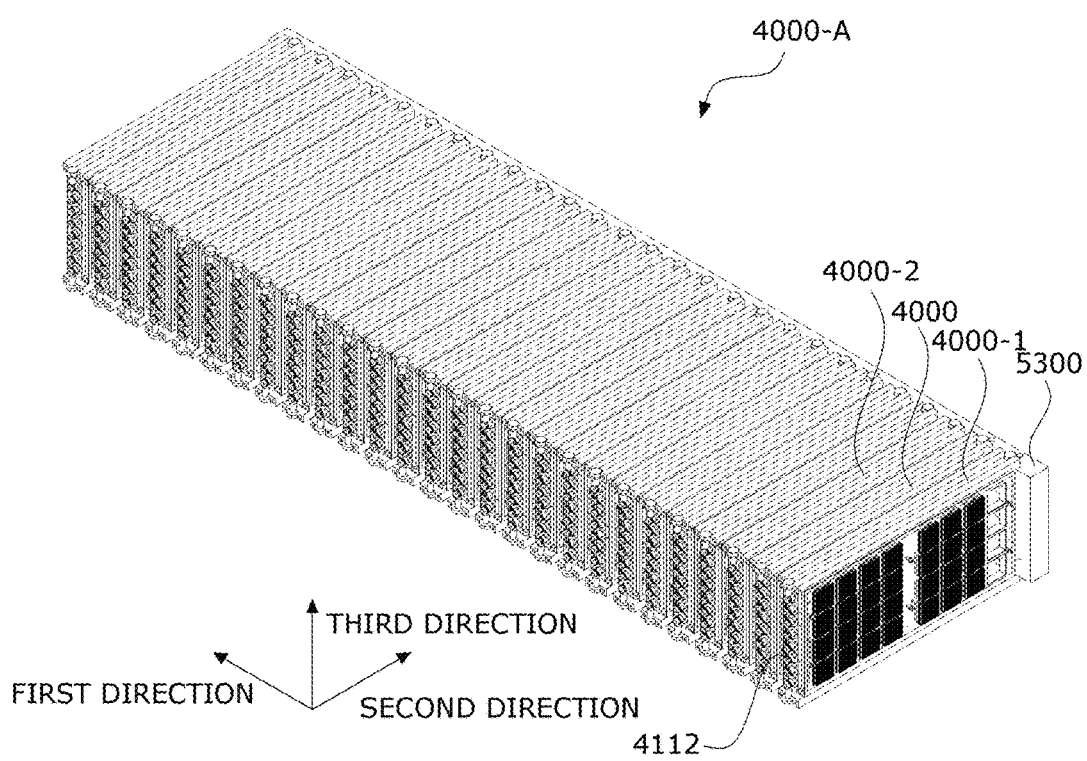

[FIG.14]
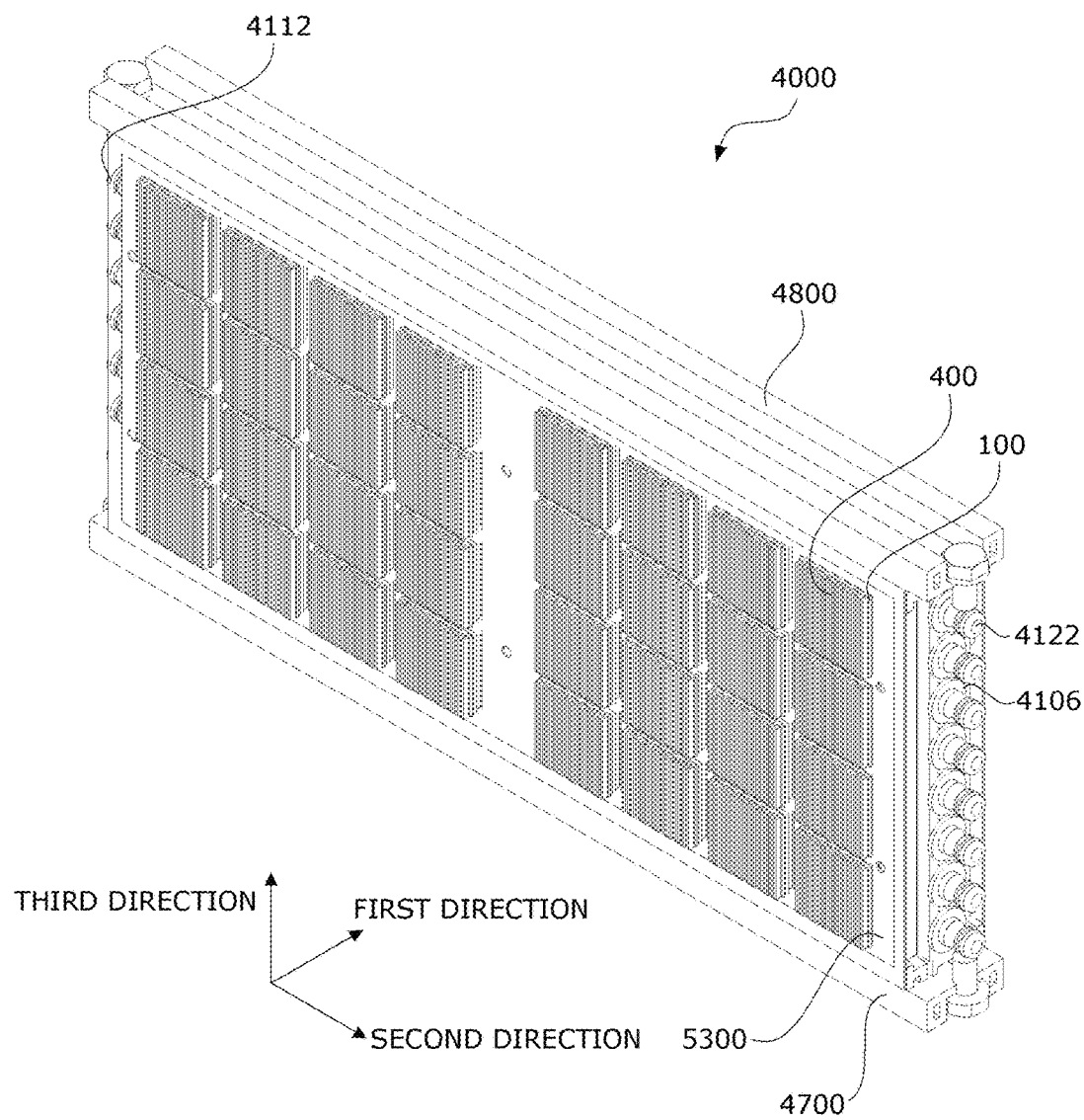

[FIG.15]
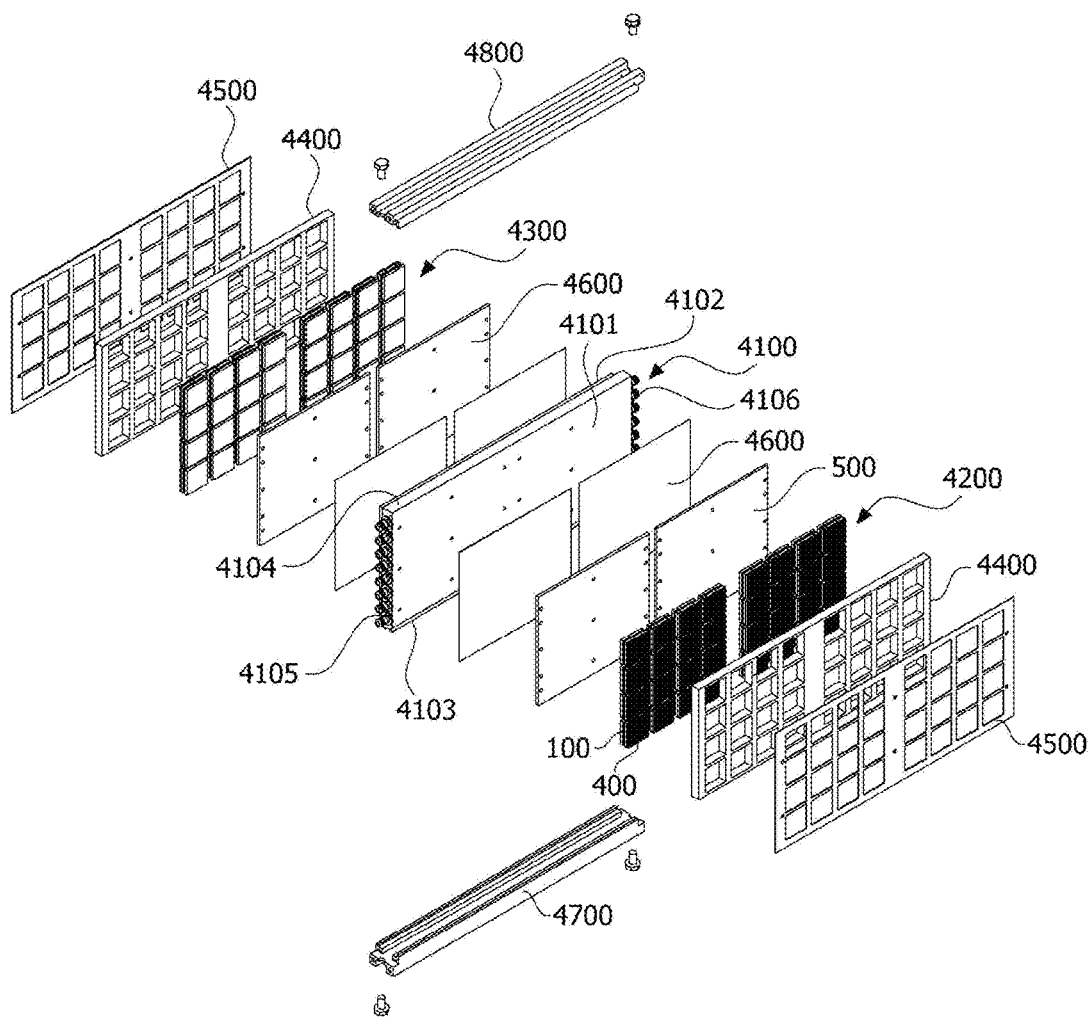

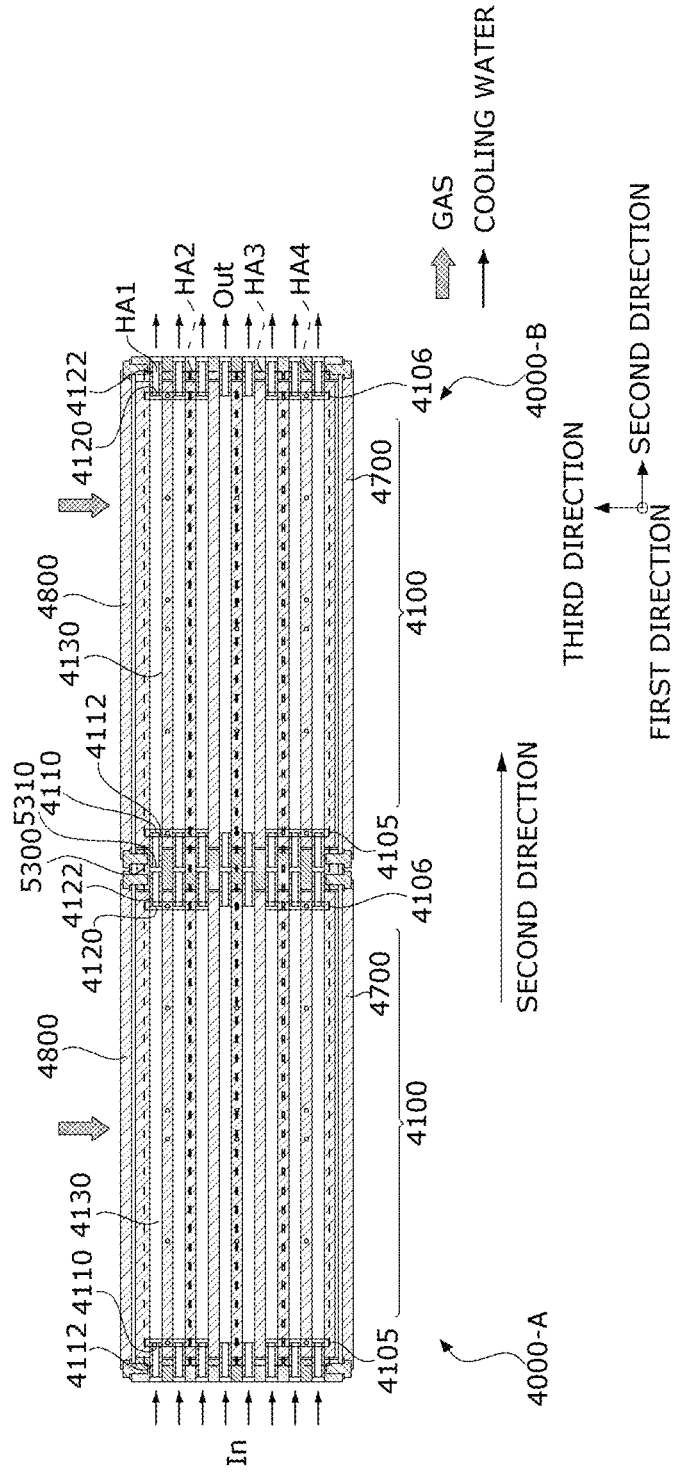

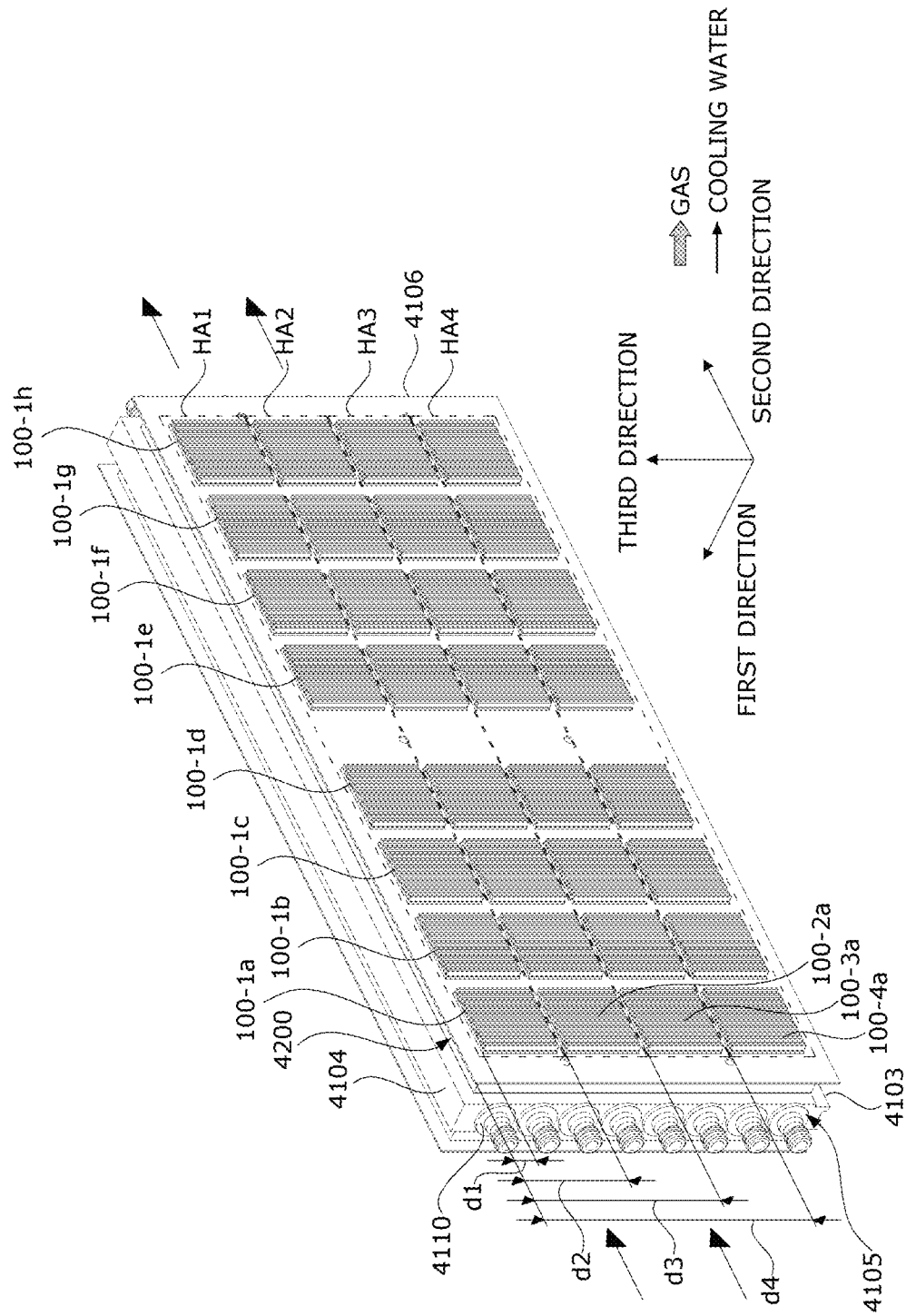

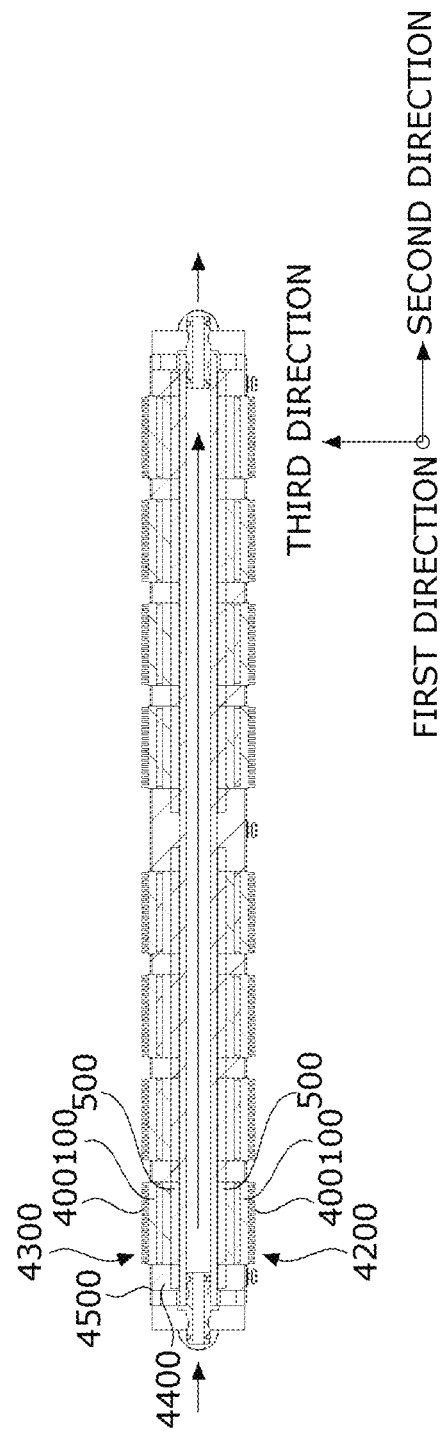
[FIG.18]

[FIG.19]
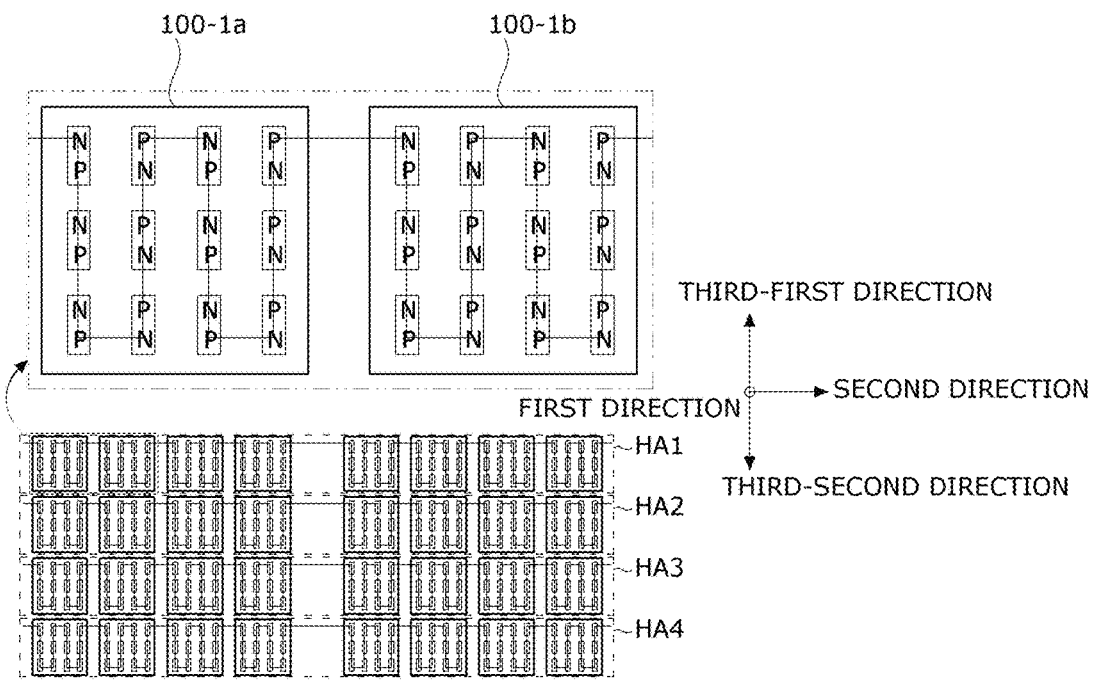

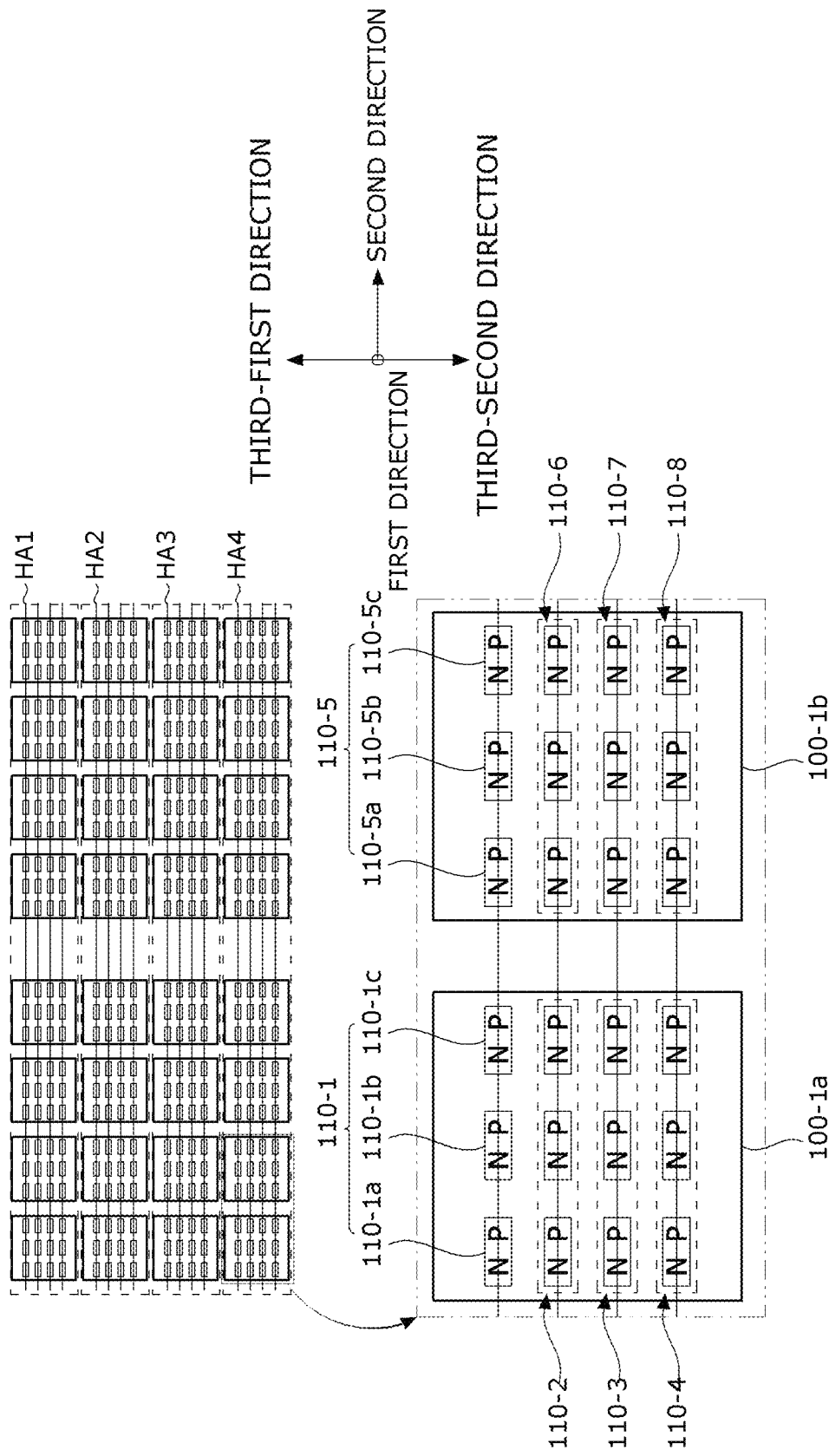

[FIG.21]
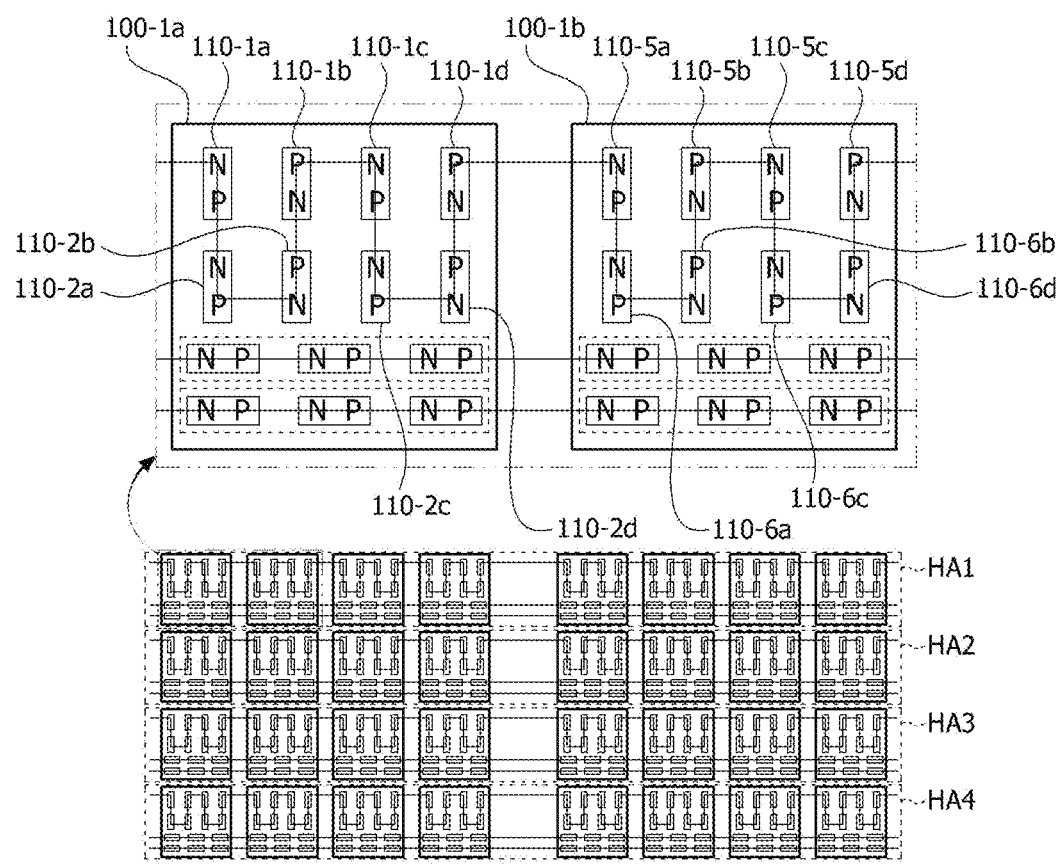

[FIG.22]
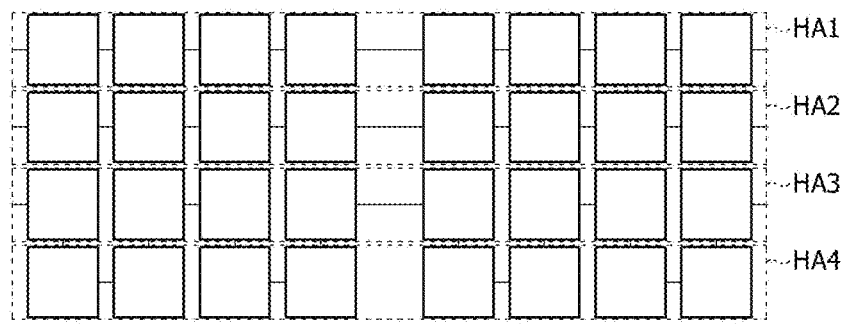
[FIG.23]
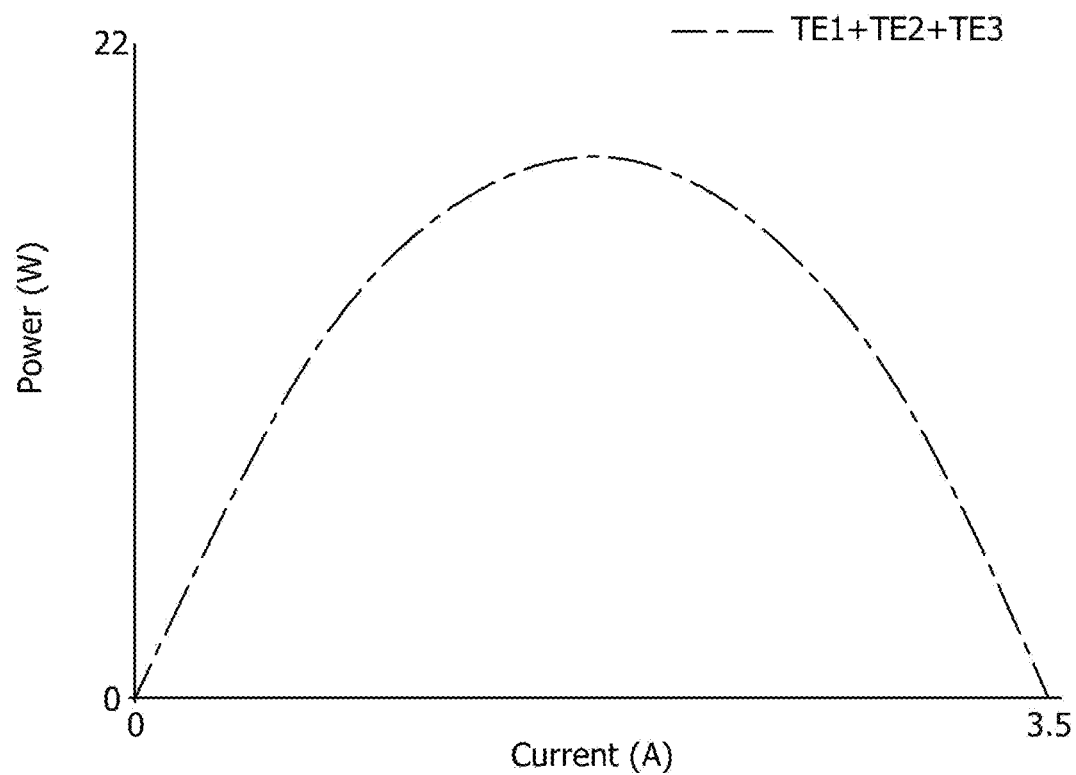

[FIG.24]
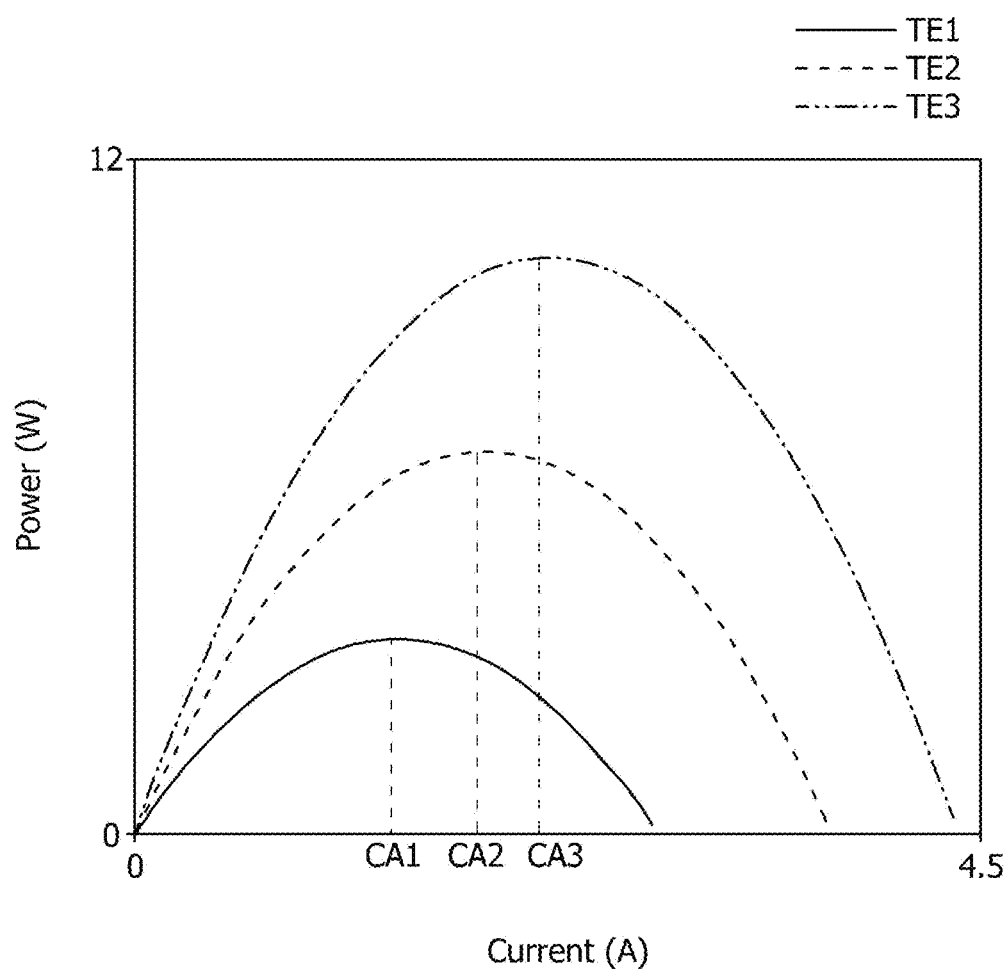

[FIG.25]
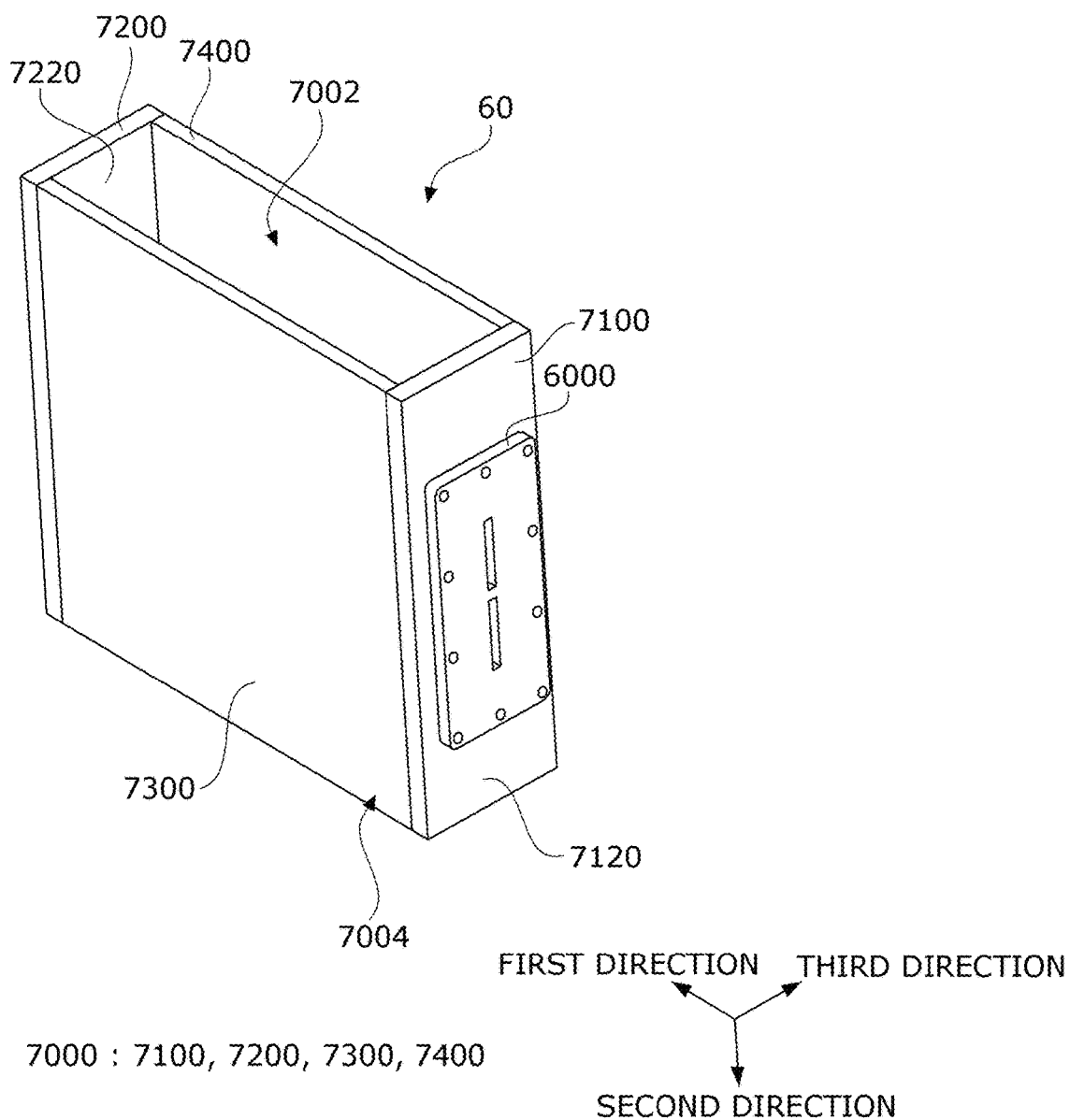

[FIG.26]
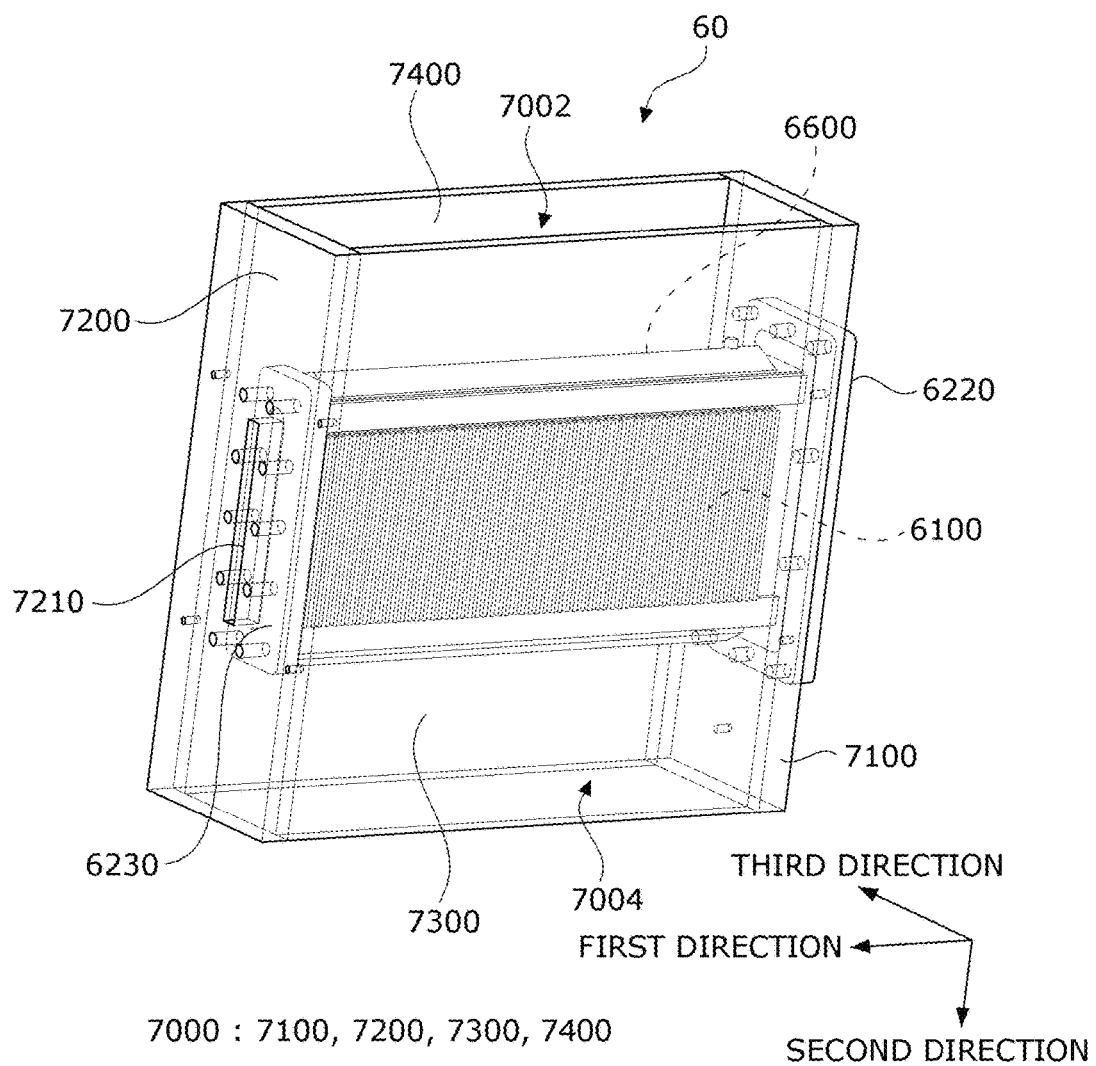

[FIG.27]
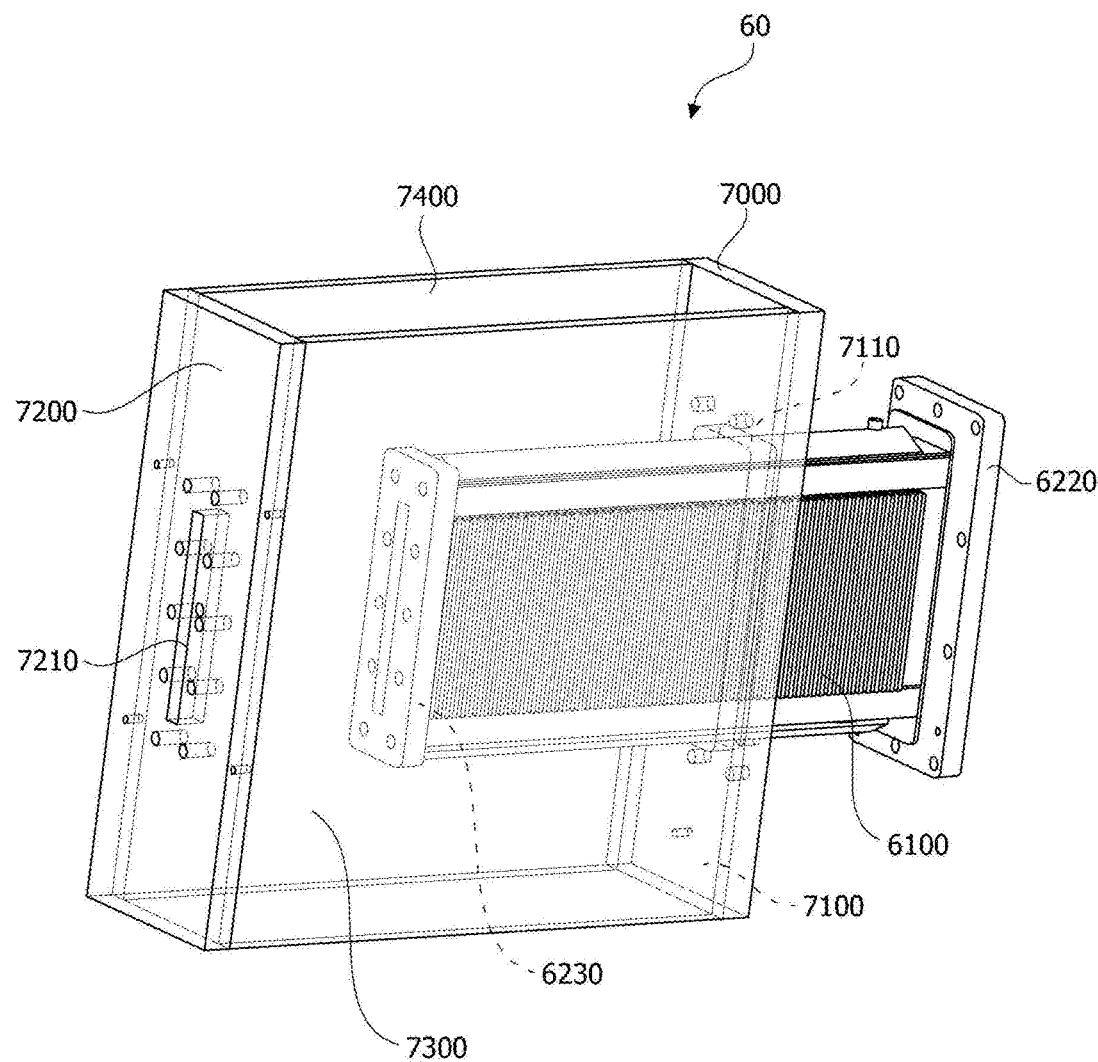

[FIG.28]
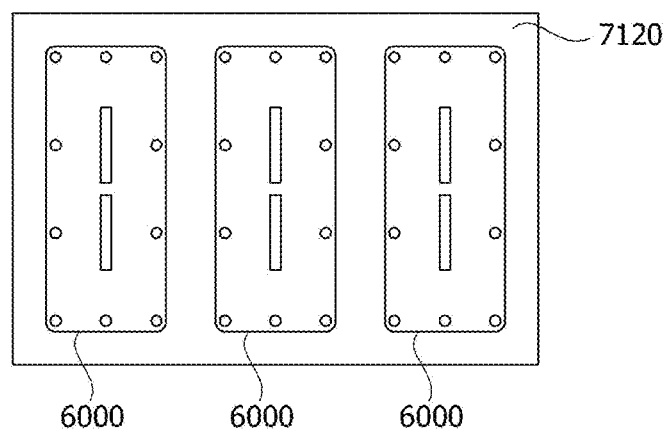

[FIG.29]
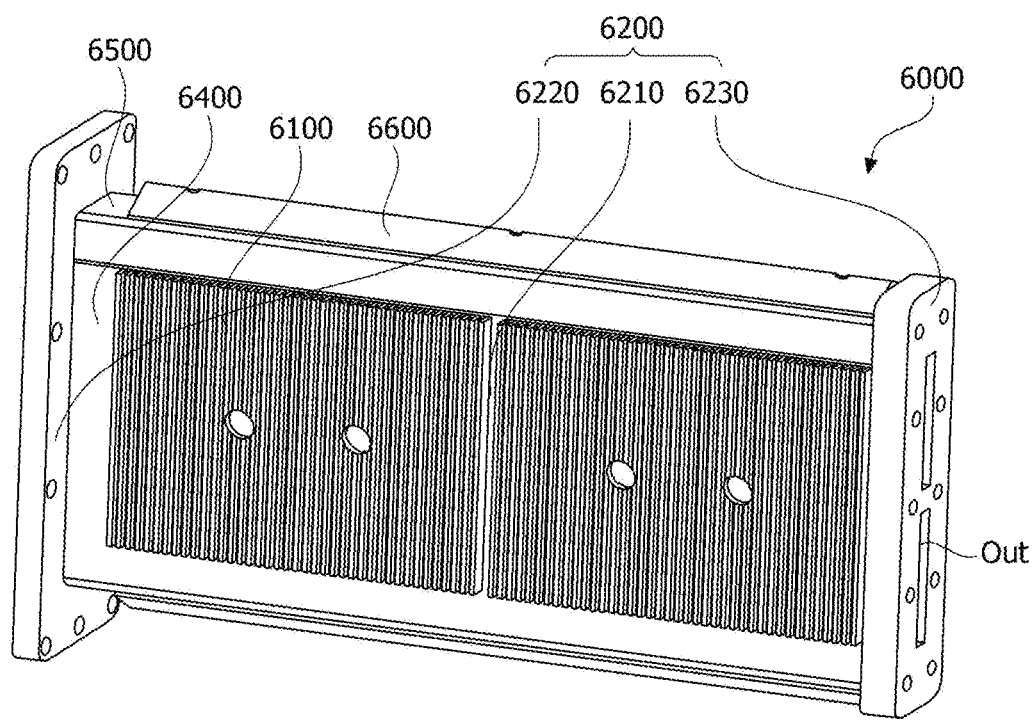

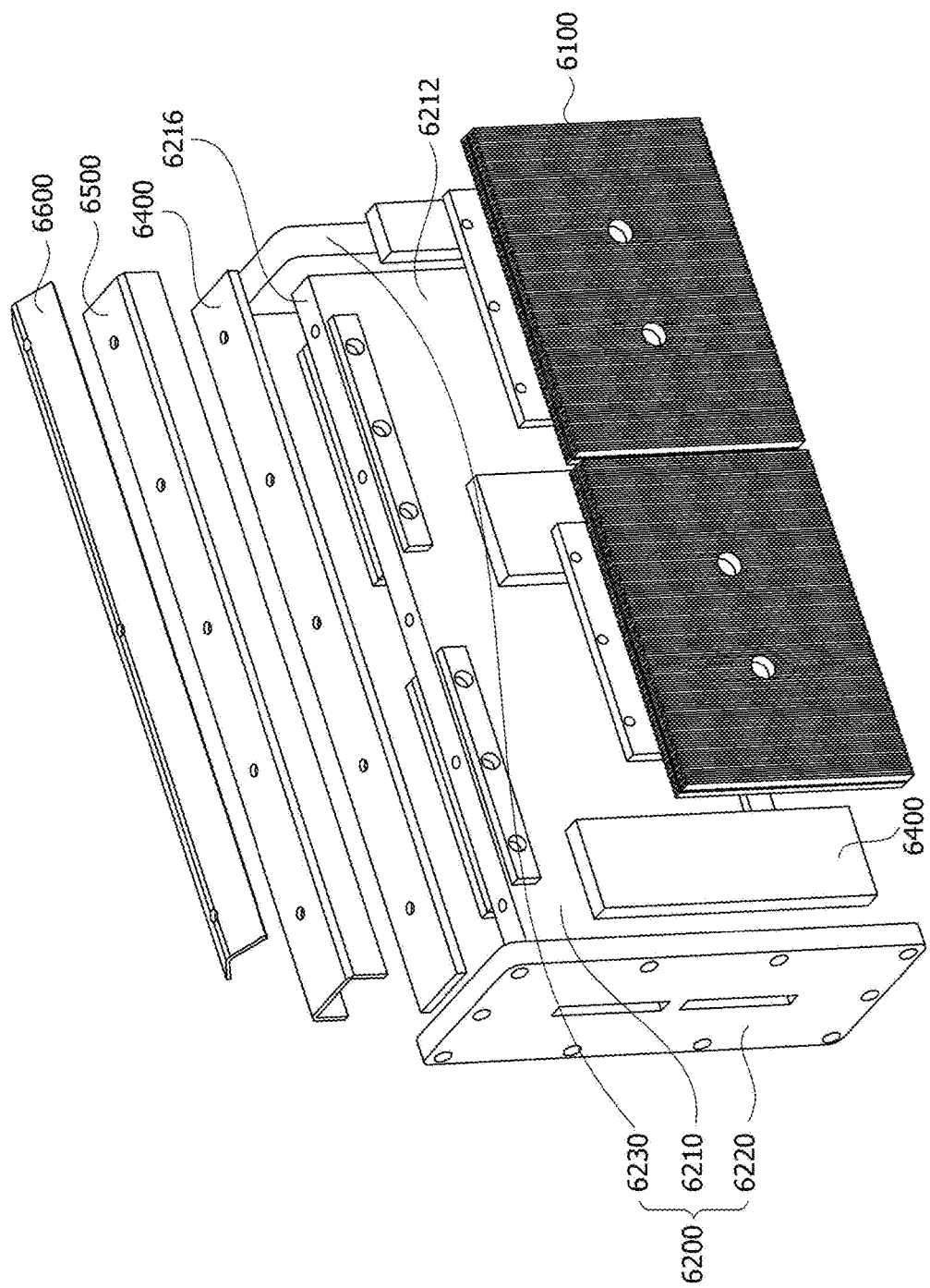
[FIG.30]

[FIG.31]
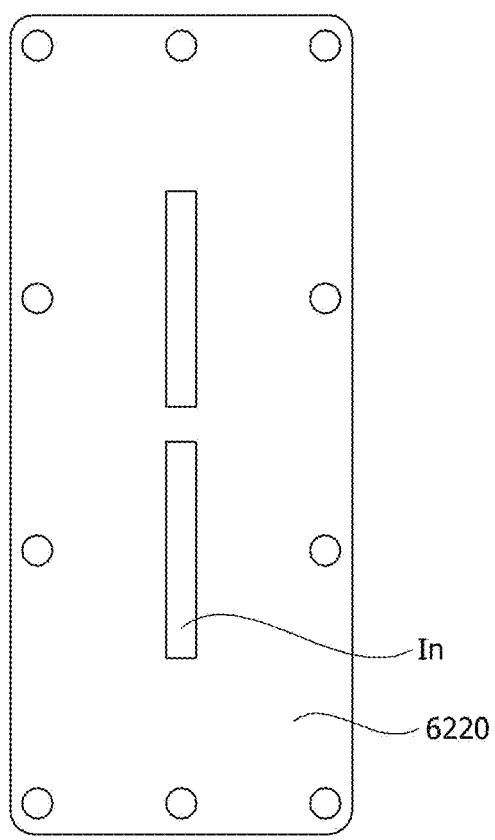

[FIG.32]
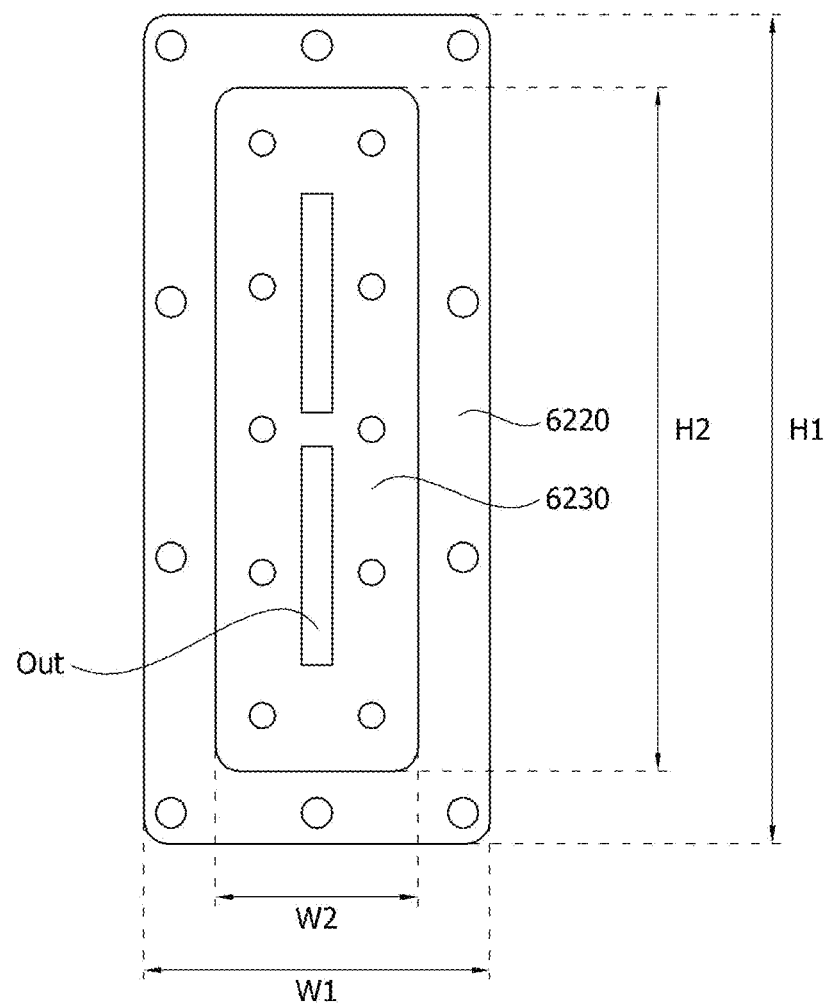

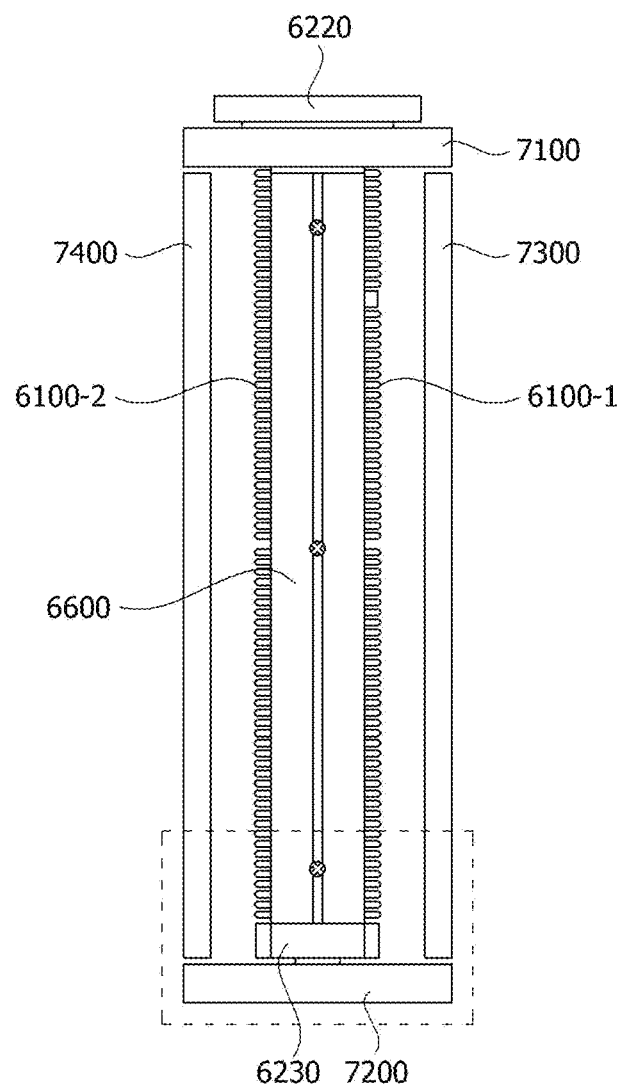
[FIG.33]

[FIG.34]
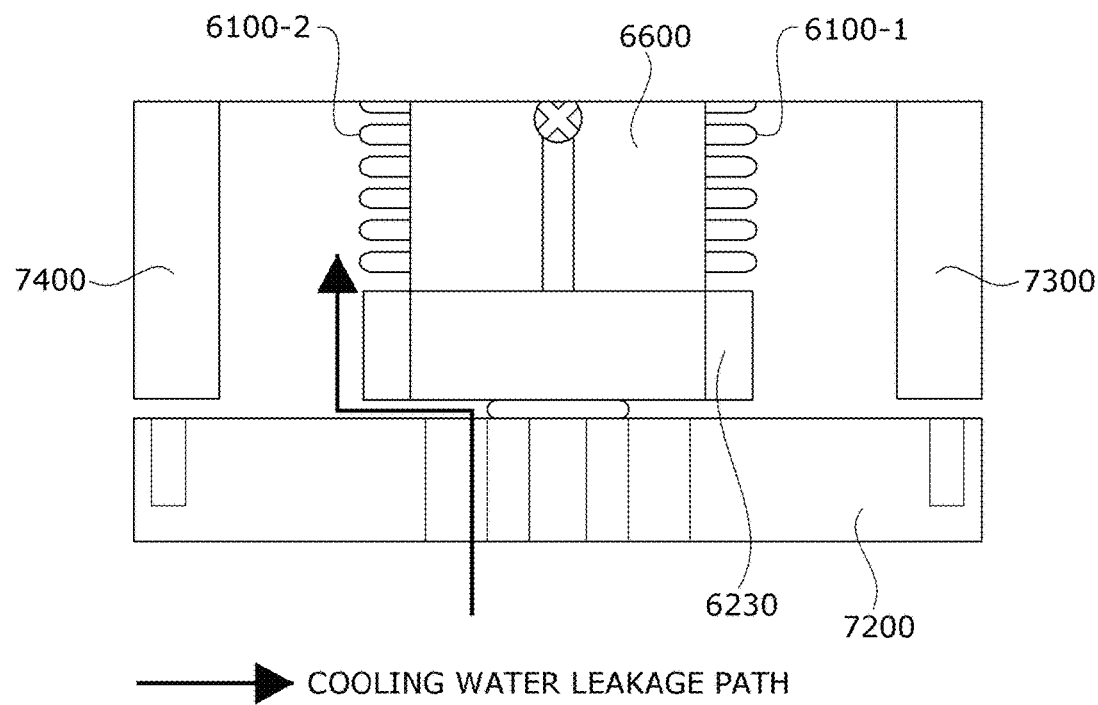
COOLING WATER LEAKAGE PATH

[FIG.35]
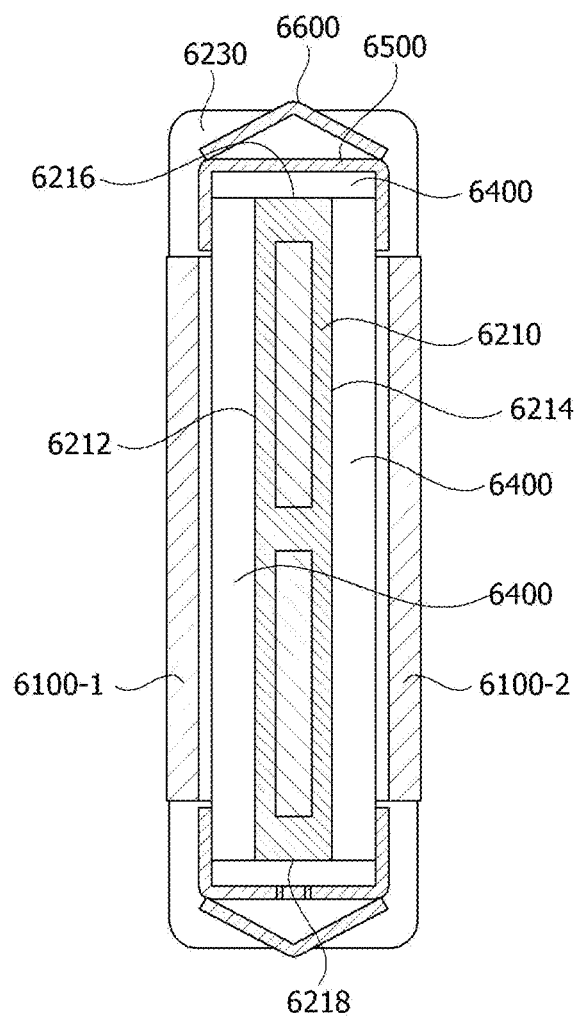

[FIG.36A]
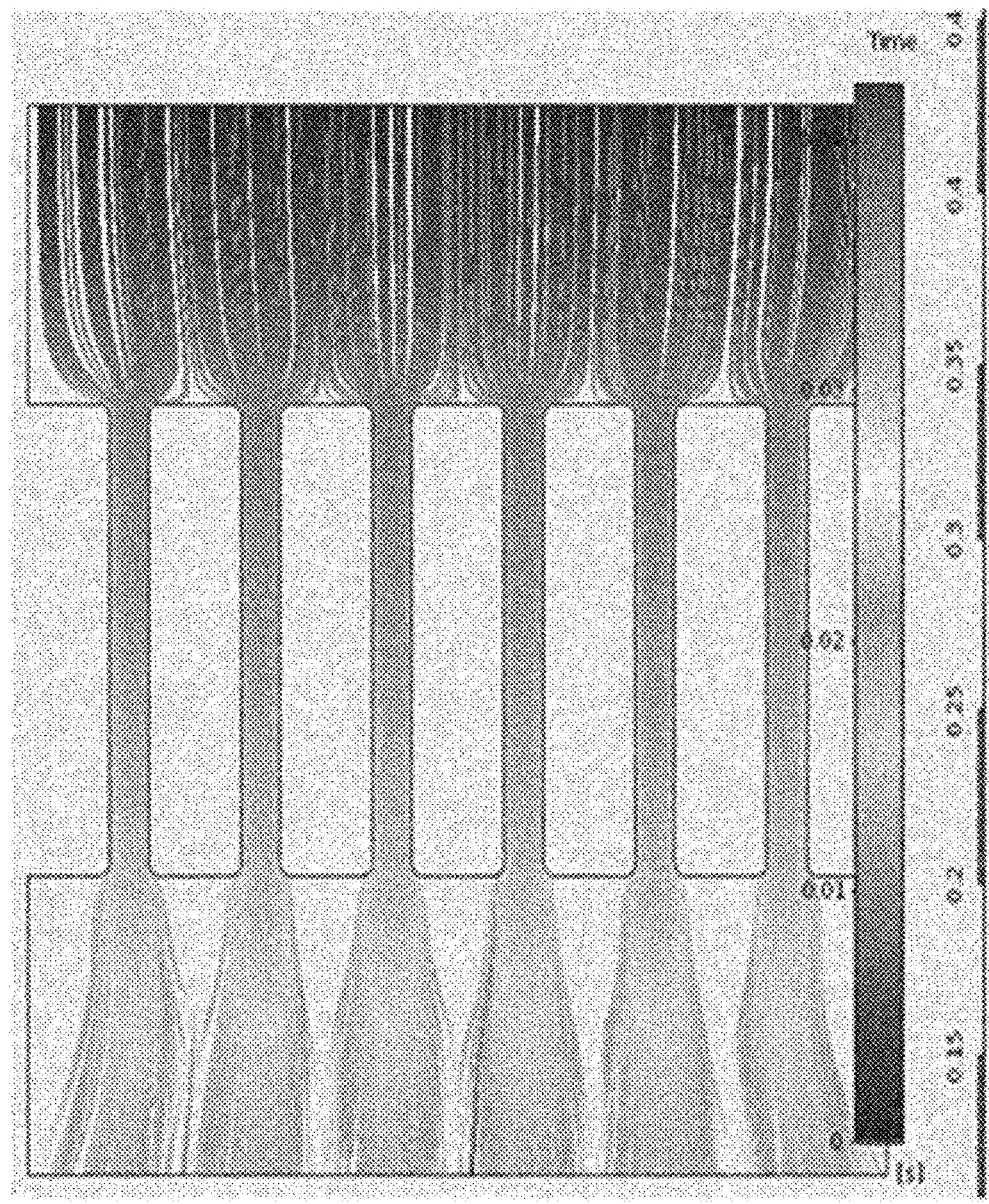

[FIG.36B]
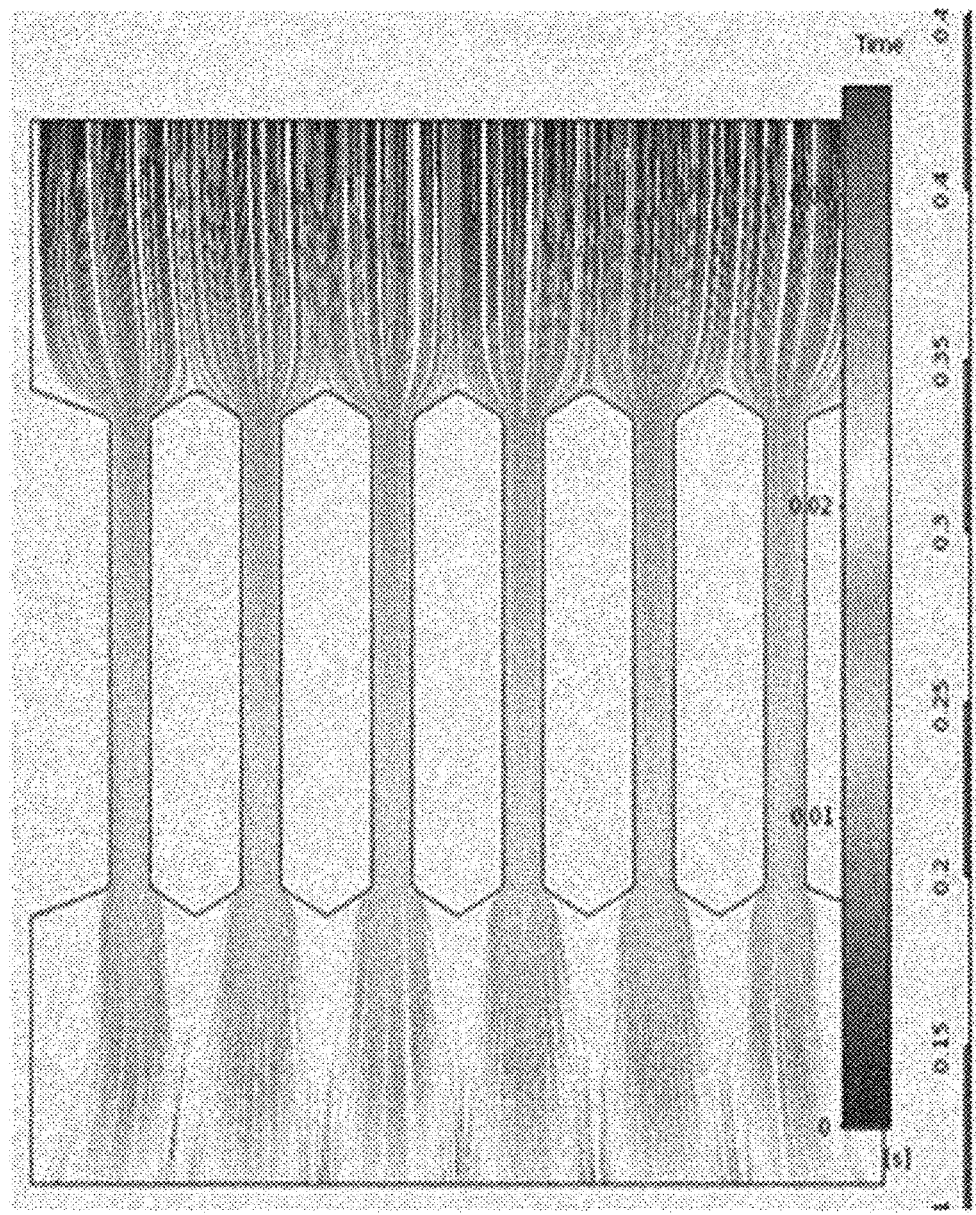

[FIG.36C]
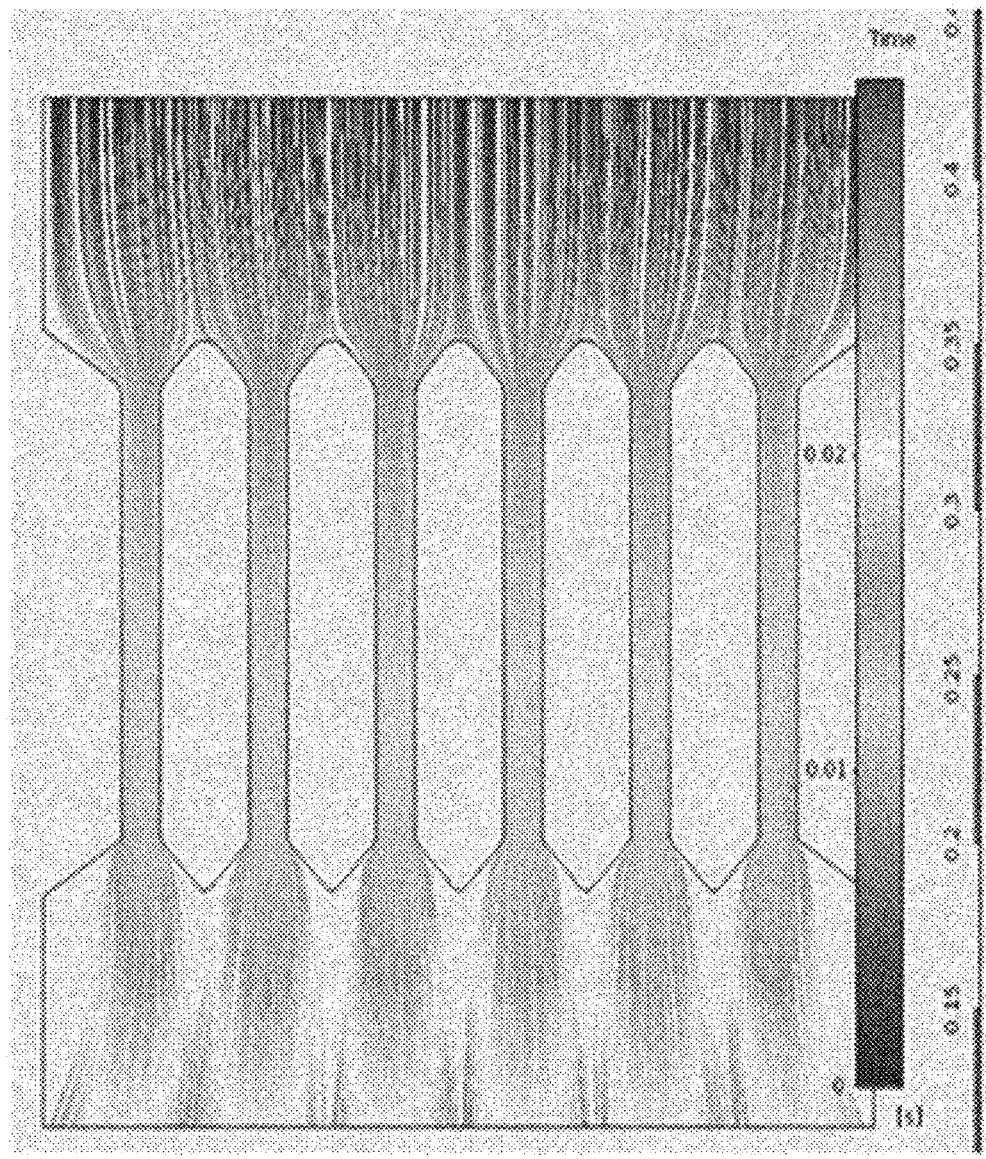

HEAT CONVERTER

CROSS-REFERENCE TO RELATED PATENT APPLICATIONS

This application is a U.S. National Stage Application under 35 U.S.C. § 371 of PCT Application No. PCT/KR2019/003984, filed Apr. 4, 2019, which claims priority to Korean Patent Application Nos. 10-2018-0040278, filed Apr. 6, 2018, 10-2018-0090499, filed Aug. 2, 2018 and 10-2018-0152540, filed Nov. 30, 2018, whose entire disclosures are hereby incorporated by reference.

TECHNICAL FIELD

The present invention relates to a heat converter, and more particularly, to a heat converter which generates power using heat of hot air.

BACKGROUND ART

A thermoelectric phenomenon is a phenomenon occurring due to movement of electrons and holes in a material and means direct energy conversion between heat and electricity.

A thermoelectric element is a generic term for elements in which the thermoelectric phenomenon is used and has a structure in which P-type thermoelectric materials and N-type thermoelectric materials are joined between metal electrodes to form PN junction pairs.

The thermoelectric elements may be divided into elements which use a change in electrical resistance according to a change in temperature, elements which use the Seebeck effect in which an electromotive force is generated due to a difference in temperature, and elements which use the Peltier effect in which heat absorption or heating occurs due to a current.

The thermoelectric elements are variously applied to home appliances, electronic components, communication components, and the like. For example, the thermoelectric elements may be applied to cooling devices, heating devices, power generation devices, and the like. Accordingly, the demand for thermoelectric performance of the thermoelectric elements is gradually increasing.

Recently, there is a need to generate electricity using thermoelectric elements and waste heat generated from engines of vehicles, ships, and the like. In this case, a structure to increase power generation performance is required.

In the case of a power generation device using the above-described waste heat, assemblability needs to be improved, some modules need to be interchangeable, and a cooling water circulation structure needs to be efficient.

DISCLOSURE

Technical Problem

The present invention is directed to providing a heat converter using waste heat.

Technical Solution

One aspect of the present invention provides a heat converter including a plurality of unit modules arranged in both a first direction and a second direction intersecting the first direction, and a frame which supports the plurality of unit modules and has one surface disposed in the first direction through which cooling water is introduced and the other surface disposed in the first direction through which the cooling water is discharged, wherein each of the unit modules includes a cooling water passage chamber including a first surface and a second surface disposed to be spaced apart from each other in the first direction, a third surface and a fourth surface disposed to be spaced apart from each other in a third direction intersecting the first direction and the second direction, and a fifth surface and a sixth surface disposed to be spaced apart from each other in the second direction such that the cooling water is introduced into the fifth surface and discharged from the sixth surface, a first thermoelectric module disposed on the first surface, and a second thermoelectric module disposed on the second surface, the first thermoelectric module includes a plurality of group thermoelectric elements, each of the group thermoelectric elements includes a plurality of thermoelectric elements having the same minimum separation distance from the fourth surface in the third direction, and the plurality of thermoelectric elements in at least one group thermoelectric element among the plurality of group thermoelectric elements are electrically connected to each other.

The plurality of group thermoelectric elements may include a first group thermoelectric element and a second group thermoelectric element disposed to be spaced apart from the first group thermoelectric element, and a minimum separation distance from the first group thermoelectric element to the fourth surface in the third direction may be greater than a minimum separation distance from the second group thermoelectric element to the fourth surface in the third direction.

Each of the thermoelectric elements may include a first substrate, a plurality of first electrodes disposed on the first substrate, a plurality of P-type thermoelectric legs and a plurality of N-type thermoelectric legs disposed on the plurality of first electrodes, a plurality of second electrodes disposed on the plurality of P-type thermoelectric legs and the plurality of N-type thermoelectric legs, and a second substrate disposed on the plurality of second electrodes, and some of the plurality of first electrodes of one thermoelectric element among the plurality of thermoelectric elements included in each of the group thermoelectric elements may be electrically connected to some of the plurality of first electrodes of the adjacent thermoelectric element in the same group thermoelectric element.

A maximum temperature difference in each of the group thermoelectric elements may be greater than a minimum temperature difference between adjacent group thermoelectric elements, the maximum temperature difference may be a difference between a highest temperature difference and a lowest temperature difference between a heating part and a heat-absorbing part in each of the group thermoelectric elements, and the minimum temperature difference may be a minimum deviation of temperature differences between heating parts and heat-absorbing parts of the adjacent group thermoelectric elements.

A first cooling water inlet may be formed on one surface of the frame, a first cooling water outlet may be formed on the other surface of the frame, a plurality of second cooling water inlets may be formed in one side of each of the unit modules toward the second direction, and a plurality of second cooling water outlets may be formed in the other side of each of the unit modules toward the second direction.

The plurality of unit modules may include a first unit module group including a plurality of unit modules disposed in the first direction and a second unit module group including a plurality of unit modules disposed in the first direction, the first unit module group and the second unit module group may be disposed to be spaced apart from each other in the second direction, and the frame may include a support wall disposed between the first unit module group and the second unit module group.

Holes corresponding to the plurality of second cooling water inlets and the plurality of second cooling water outlets may be formed in the support wall, and the plurality of second cooling water outlets disposed in each of the unit modules included in the first unit module group may be connected to the plurality of second cooling water inlets disposed in each of the unit modules included in the second unit module group through the holes.

The cooling water passage chamber of each of the unit modules included in the first unit module group may include a first flange disposed on a side of each of the plurality of second cooling water inlets, the cooling water passage chamber of each of the unit modules included in the second unit module group may include a second flange disposed on a side of the plurality of second cooling water outlets, and each of the first flange and the second flange may disposed on an outer wall surface of the frame.

A gas having a temperature higher than a temperature of the cooling water may pass between the plurality of unit modules in the third direction.

A cooling water passage pipe connected from the second cooling water inlet to the second cooling water outlet may be formed in the cooling water passage chamber, and the cooling water may flow in the second direction through the cooling water passage pipe.

Another aspect of the present invention provides a heat converter including a first unit module, a second unit module disposed on a side surface of the first unit module, an air passage pipe integrally surrounding the first unit module and the second unit module so as to be spaced apart from the first unit module and the second unit module at a predetermined interval, an air inlet pipe connected to the air passage pipe at a side of the first unit module, and an air outlet pipe connected to the air passage pipe at a side of the second unit module, wherein each of the first unit module and the second unit module includes a cooling water passage pipe having a first surface, a second surface disposed opposite to the first surface, a third surface disposed between the first surface and the second surface, and a fourth surface disposed between the first surface and the second surface to be opposite to the third surface, a first thermoelectric module disposed on the first surface, and a second thermoelectric module disposed on the second surface.

A cooling water inlet and a cooling water outlet may be disposed on the third surface of each cooling water passage pipe.

Air may be introduced into the air inlet pipe and pass through the air passage pipe and then move in a direction in which the air is discharged from the air outlet pipe, and cooling water may be introduced into the cooling water inlet of the cooling water passage pipe included in the second unit module and move in a direction in which the cooling water is discharged from the cooling water outlet of the cooling water passage pipe included in the first unit module.

Each of the first thermoelectric module and the second thermoelectric module may include the thermoelectric element disposed on the first surface or the second surface and a heat sink disposed on the thermoelectric element to face an inner surface of the air passage pipe, and the heat sink may be spaced apart from the inner surface of the air passage pipe at a predetermined interval.

The cooling water discharged from the cooling water outlet of the cooling water passage pipe included in the second unit module may be introduced into the cooling water inlet of the cooling water passage pipe included in the first unit module.

A plurality of fins having a direction from an inner side of the third surface to an inner side of the fourth surface may be disposed in each cooling water passage pipe, some fins of the plurality of fins may be disposed to be in contact with the inner side of the third surface, the remaining fins of the plurality of fins may be disposed so as not to be in contact with the inner side of the third surface, and the plurality of fins disposed so as not to be in contact with the inner side of the third surface may be disposed between the plurality of fins disposed to be in contact with the inner side of the third surface.

The plurality of fins disposed to be in contact with the inner side of the third surface may be disposed so as not to be in contact with the inner side of the fourth surface, and at least a portion of the plurality of fins disposed so as not to be in contact with the inner side of the third surface may also be disposed so as not to be in contact with the inner side of the fourth surface.

An inner wall disposed in a direction from the inner side of the fourth surface toward the inner side of the third surface to be in contact with the inner side of the fourth surface may be further provided between the plurality of fins disposed so as not to be in contact with both of the inner side of the third surface and the inner side of the fourth surface.

The air passage pipe may include a first flange joined to the air inlet pipe, a second flange joined to the air outlet pipe, and a pipe connecting between the first flange and the second flange, the pipe may include a fifth surface, a sixth surface, a seventh surface, and an eighth surface respectively corresponding to the first surface, the second surface, the third surface, and the fourth surface, a hole extending from the first flange to the seventh surface or from the second flange to the seventh surface may be formed, and a height of the hole formed in the first flange or the second flange may be greater than a height of each of the cooling water inlet and the cooling water outlet formed on the third surface of each cooling water passage pipe.

At least one unit module may be further disposed between the first unit module and the second unit module.

Still another aspect of the present invention provides a heat converter including a cooling member including a cooling water passage pipe, a first flange disposed at a cooling water inlet of the cooling water passage pipe, and a second flange disposed at a cooling water outlet of the cooling water passage pipe, a first thermoelectric module disposed on a first outer wall surface of the cooling water passage pipe, a second thermoelectric module disposed on a second outer wall surface of the cooling water passage pipe, and a frame accommodating the cooling water passage pipe, the second flange, the first thermoelectric module, and the second thermoelectric module, wherein the frame includes a first wall in which a first hole corresponding to the cooling water inlet is formed, a second wall facing the first wall and in which a second hole corresponding to the cooling water outlet is formed, a third wall disposed between the first wall and the second wall to be spaced apart from and to face the first thermoelectric module, and a fourth wall disposed between the first wall and the second wall to be spaced apart from and to face the second thermoelectric module, a size of the first flange is greater than a size of the second flange, the first flange is disposed on an outer wall surface of the first wall, and the second flange is disposed on an inner wall surface of the second wall.

Cooling water may flow in a direction from the first flange toward the second flange, and a gas having a temperature higher than a temperature of the cooling water may flow between the first thermoelectric module and the third wall and between the second thermoelectric module and the fourth wall to be parallel to a direction in which the first thermoelectric module and the second thermoelectric module are disposed and to be perpendicular to a direction in which the cooling water flows.

The frame may further include a first opening surrounded by the first wall, the second wall, the third wall, and the fourth wall and a second opening surrounded by the first wall, the second wall, the third wall, and the fourth wall, and the gas may be introduced through the first opening and discharged through the second opening.

The cooling water passage pipe may further include a third outer wall surface disposed between the first outer wall surface and the second outer wall surface to face a direction in which the gas is introduced and a fourth outer wall surface disposed between the first outer wall surface and the second outer wall surface to face a direction in which the gas is discharged, and may further include a gas guide member that is disposed on the third outer wall surface and has a shape in which a distance from the third outer wall surface increases toward a center between the first outer wall surface and the second outer wall surface.

A heat-insulating layer disposed between the third outer wall surface and the gas guide member may be further provided.

Thermal conductivity of the cooling member may be greater than thermal conductivity of the frame.

The cooling member may be made of aluminum and the frame may be made of stainless steel.

A size of the first hole may be less than a size of the first flange and may be greater than the size of the second flange, and a size of the second hole may be less than the size of the second flange.

The first flange may be fastened to the first wall, and the second flange may be fastened to the second wall.

A sealing material may be disposed between the first flange and an outer wall surface of the first wall and between the second flange and an inner wall surface of the second wall.

Yet another aspect of the present invention provides a heat converter including a plurality of unit modules arranged to be parallel and a frame, wherein each of the unit modules includes a cooling member including a cooling water passage pipe, a first flange disposed at a cooling water inlet of the cooling water passage pipe, and a second flange disposed at a cooling water outlet of the cooling water passage pipe, a first thermoelectric module disposed on a first outer wall surface of the cooling water passage pipe, and a second thermoelectric module disposed on a second outer wall surface of the cooling water passage pipe. The first thermoelectric module of each of the unit modules is disposed to be spaced apart from and to face the second thermoelectric module of the adjust unit module, the frame accommodates the cooling water passage pipe, the second flange, the first thermoelectric module, and the second thermoelectric module of each of the unit modules, the frame includes a first wall in which a plurality of first holes corresponding to the cooling water inlets are formed, a second wall facing the first wall and in which a plurality of second holes corresponding to the cooling water outlets are formed, a third wall disposed between the first wall and the second wall to be parallel to the first thermoelectric module and the second thermoelectric module, and a fourth wall disposed between the first wall and the second wall to face the third wall, a size of the first flange is greater than a size of the second flange, the first flange is disposed on an outer wall surface of the first wall, and the second flange is disposed on an inner wall surface of the second wall.

Advantageous Effects

According to an embodiment of the present invention, a heat converter having excellent power generation performance can be obtained. In particular, according to embodiments of the present invention, a heat converter that is easy to assemble and has a simple structure can be obtained.

Further, according to an embodiment of the present invention, it is possible to obtain a heat converter which facilitates a size thereof to be easily adjusted according to a space to be installed and a required amount of power generation.

Further, according to an embodiment of the present invention, it is possible to obtain a heat converter of which some modules are replaceable and having an improved temperature gradient that changes electrical connections of thermoelectric legs according to the temperature difference.

Further, according to an embodiment of the present invention, an additional design of a thermoelectric module can be easily performed, and when a failure occurs in some thermoelectric modules, only a failed thermoelectric module can be replaced without the need to replace all thermoelectric modules.

Further, according to an embodiment of the present invention, cooling water can be uniformly circulated and is less likely to be lost so that cooling performance can be improved.

Further, according to embodiments of the present invention, high-temperature gas can flow uniformly so that power generation efficiency can be improved.

DESCRIPTION OF DRAWINGS

FIG. 1 is a perspective view of a heat converter according to one embodiment of the present invention.

FIG. 2 is a perspective view of a body part included in the heat converter according to one embodiment of the present invention.

FIG. 3 is an exploded perspective view of the body part included in the heat converter according to one embodiment of the present invention.

FIG. 4A is a view illustrating an example of the body part included in the heat converter according to one embodiment of the present invention.

FIG. 4B is a view illustrating another example of the body part included in the heat converter according to one embodiment of the present invention.

FIG. 5A is a cross-sectional view of a thermoelectric module included in the body part of the heat converter according to one embodiment of the present invention.

FIG. 5B is an exploded cross-sectional view of the thermoelectric module included in the body part of the heat converter according to one embodiment of the present invention.

FIG. 5C is a top view of a cooling water passage pipe in which the thermoelectric module included in the body part of the heat converter according to one embodiment of the present invention is disposed.

FIGS. 6A and 6B are a set of cross-sectional views of a thermoelectric element included in the thermoelectric module of the heat converter according to one embodiment of the present invention.

FIG. 7 is a perspective view of the thermoelectric element included in the thermoelectric module of the heat converter according to one embodiment of the present invention.

FIG. 8A is a view illustrating an example of a plurality of unit modules included in the heat converter according to one embodiment of the present invention.

FIG. 8B is a view illustrating another example of the plurality of unit modules included in the heat converter according to one embodiment of the present invention.

FIG. 9A is a view illustrating an internal structure of the cooling water passage pipe and a cooling water moving path according to one embodiment of the present invention.

FIG. 9B is a view illustrating an example of a cooling water inlet and a cooling water outlet of the cooling water passage pipe according to one embodiment of the present invention.

FIG. 10 is a perspective view of an air passage pipe of the heat converter according to one embodiment of the present invention.

FIG. 11A is a perspective view of the body part in which the air passage pipe of FIG. 10 is coupled.

FIG. 11B is a plan view of the body part in which the air passage pipe is coupled viewed from an air inlet side.

FIG. 12 is a perspective view of a heat converter according to a second embodiment of the present invention.

FIG. 13 is an enlarged view of a portion of the heat converter according to the second embodiment of the present invention.

FIG. 14 is a perspective view of a unit module included in the heat converter according to the second embodiment of the present invention.

FIG. 15 is an exploded view of the unit module of FIG. 14.

FIG. 16 is a cross-sectional view of the heat converter according to the second embodiment of the present invention.

FIG. 17 is a view for describing an operation of high-temperature gas and cooling water flowing in the heat converter according to the second embodiment of the present invention.

FIG. 18 is a cross-sectional view of the heat converter according to the second embodiment of the present invention.

FIG. 19 is a view illustrating a first thermoelectric module and a first thermoelectric element in the heat converter according to the second embodiment of the present invention.

FIG. 20 is a view illustrating a first thermoelectric module and a first thermoelectric element in a heat converter according to another embodiment of the present invention.

FIG. 21 is a view illustrating a first thermoelectric module and a first thermoelectric element in a heat converter according to still another embodiment of the present invention.

FIG. 22 is a view illustrating a modified example of FIG. 19.

FIGS. 23 and 24 are graphs describing the effect of the first thermoelectric modules according to the second embodiment.

FIG. 25 is a perspective view of a heat converter according to a third embodiment of the present invention.

FIGS. 26 and 27 illustrate an interior of a frame of the heat converter of FIG. 25.

FIG. 28 is a front view of a cooling water inlet of a heat converter according to another embodiment of the present invention.

FIG. 29 is a perspective view of a structure in which the frame is removed from the heat converter of FIG. 25.

FIG. 30 is an exploded perspective view of the structure in which the frame is removed from the heat converter of FIG. 25.

FIG. 31 is a front view of the structure in which the frame is removed from the heat converter of FIG. 25 viewed from a cooling water inlet side.

FIG. 32 is a front view of the structure in which the frame is removed from the heat converter of FIG. 25 viewed from a cooling water outlet side.

FIG. 33 is a cross-sectional view of the heat converter of FIG. 25 in a first direction.

FIG. 34 is a partially enlarged view of FIG. 33.

FIG. 35 is a cross-sectional view of the structure in which the frame is removed from the heat converter of FIG. 25 in a second direction.

FIGS. 36A to 36C are a set of views illustrating results obtained by simulating gas flows.

MODES OF THE INVENTION

The present invention may be modified in various forms and have various embodiments, and thus particular embodiments thereof will be illustrated in the accompanying drawings and described in the detailed description. It should be understood, however, that there is no intent to limit the present invention to the particular forms disclosed, but on the contrary, the present invention is to cover all modifications, equivalents, and alternatives falling within the spirit and scope of the present invention.

It will be understood that, although the terms "first," "second," and the like may be used herein to describe various elements, these elements should not be limited by these terms. The terms are used only for the purpose of distinguishing one element from another element. For example, without departing from the scope of the present invention, a second element could be referred to as a first element, and, similarly, a first element may also be referred to as a second element. The term "and/or" includes a combination of a plurality of related listed items or any one item of the plurality of related listed items.

It should be understood that when an element is referred to as being "connected" or "coupled" to another element, it may be directly connected or coupled to the other element or intervening elements may be present. In contrast, when an element is referred to as being "directly connected," or "directly coupled" to another element, it should be understood that still another element may not be present between the element and another element.

The terms used herein are for the purpose of describing particular embodiments only and are not intended to be limiting to the present invention. It is to be understood that the singular forms include plural forms unless the context clearly dictates otherwise. In the present specification, it will be further understood that the terms "comprise," "comprising," "include," and/or "including" when used in this specification, specify the presence of stated features, integers, steps, operations, elements, components and/or groups thereof, but do not preclude the presence or addition of one or more other features, integers, steps, operations, elements, components and/or groups thereof.

Unless otherwise defined, all terms used herein, including technical and scientific terms, have the same meaning as commonly understood by one of ordinary skill in the art to which the present invention belongs. Terms, such as those defined in commonly used dictionaries, should be interpreted as having a meaning that is consistent with their meaning in the context of the relevant art and will not be interpreted in an idealized or overly formal sense unless clearly defined in the present application.

Hereinafter, embodiments will be described below in detail with reference to the accompanying drawings, but equal or corresponding elements will be referred to as the same reference numerals regardless of drawing signs, and redundant descriptions thereof will be omitted.

Hereinafter, a heat converter according to a first embodiment of the present invention will be described.

FIG. 1 is a perspective view of the heat converter according to the first embodiment of the present invention, FIG. 2 is a perspective view of a body part included in the heat converter according to the first embodiment of the present invention, and FIG. 3 is an exploded perspective view of the body part included in the heat converter according to the first embodiment of the present invention. FIG. 4A is a view illustrating an example of the body part included in the heat converter according to the first embodiment of the present invention, and FIG. 4B is a view illustrating another example of the body part included in the heat converter according to the first embodiment of the present invention. FIG. 5A is a cross-sectional view of a thermoelectric module included in the body part of the heat converter according to the first embodiment of the present invention, FIG. 5B is an exploded cross-sectional view of the thermoelectric module included in the body part of the heat converter according to the first embodiment of the present invention, and FIG. 5C is a top view of a cooling water passage pipe in which the thermoelectric module included in the body part of the heat converter according to the first embodiment of the present invention is disposed. FIG. 6 is a set of cross-sectional views of a thermoelectric element included in the thermoelectric module of the heat converter according to the first embodiment of the present invention, and FIG. 7 is a perspective view of the thermoelectric element included in the thermoelectric module of the heat converter according to the first embodiment of the present invention.

Referring to FIGS. 1 to 4, a heat converter 10 according to the first embodiment of the present invention includes a body part 1000, an air inlet pipe 2000, and an air outlet pipe 3000.

A temperature of air discharged from the air outlet pipe 3000 is lower than a temperature of air introduced into the air inlet pipe 2000. For example, the air introduced into the air inlet pipe 2000 may be air with waste heat generated by an engine of a vehicle, a ship, or the like, but the present invention is not limited thereto. For example, the temperature of air introduced into the air inlet pipe 2000 may be 100° C. or more, preferably 200° C. or more, and more preferably, in a range of 220° C. to 250° C., but the present invention is not limited thereto.

The air is introduced into the air inlet pipe 2000 and passes through the body part 1000 and then moves in a direction in which the air is discharged from the air outlet pipe 3000. When the cross-sectional shape of each of the air inlet pipe 2000 and the air outlet pipe 3000 is different from the cross-sectional shape of the body part 1000, the heat converter 10 may further include a first connection pipe 2100 connecting the air inlet pipe 2000 to the body part 1000 and a second connection pipe 3100 connecting the body part 1000 to the air outlet pipe 3000. For example, the air inlet pipe 2000 and the air outlet pipe 3000 may generally have cylindrical shapes. In contrast, a thermoelectric module 100 included in the body part 1000 may need to be disposed on a plane to increase thermoelectric performance. Accordingly, the air inlet pipe 2000 and one end portion of the body part 1000 may be connected and the air outlet pipe 3000 and the other end portion of the body part 1000 may be connected respectively through the first connection pipe 2100 and the second connection pipe 3100 which each have one end portion formed in a cylindrical shape and the other end portion formed in a quadrilateral shape.

Here, connections of the air inlet pipe 2000 and the first connection pipe 2100, the first connection pipe 2100 and the body part 1000, the body part 1000 and the second connection pipe 3100, and the second connection pipe 3100 and the air outlet pipe 3000 may be made through fastening members.

The heat converter 10 according to the first embodiment of the present invention may generate power through the body part 1000 using a temperature difference between air and cooling water flowing with the thermoelectric module 100 therebetween, that is, a temperature difference between heat-absorbing surfaces and heating surfaces of the thermoelectric module 100.

To this end, the body part 1000 includes a plurality of unit modules 1100, 1200, and 1400 and an air passage pipe 1300. Hereinafter, for convenience of description, descriptions are focused on the embodiment in which the plurality of unit modules are a first unit module 1100 and a second unit module 1200 as shown in FIG. 4A, but the present invention is not limited thereto, and the plurality of unit modules may include two or more unit modules. For example, as shown in FIG. 4B, an additional unit module, for example, a third unit module 1400, may be further disposed between the first unit module 1100 and the second unit module 1200. The number of additional unit modules may vary depending on a space to be installed and a required amount of power generation.

The second unit module 1200 is disposed on a side surface of the first unit module 1100, and the air passage pipe 1300 may integrally surround the first unit module 1100 and the second unit module 1200 by being spaced apart from the first unit module 1100 and the second unit module 1200 by a predetermined interval.

The air inlet pipe 2000 may be directly connected to one flange 1302 of the air passage pipe 1300 at a side of the first unit module 1100 or through the first connection pipe 2100, and the air outlet pipe 3000 may be directly connected to the other flange 1304 of the air passage pipe 1300 at a side of the second unit module 1200 or through the second connection pipe 3100.

Here, each of the first unit module 1100 and the second unit module 1200 includes a first thermoelectric module 100, a second thermoelectric module 200, and a cooling water passage pipe 300.

In this case, the cooling water passage pipe 300 may include a first surface 302, a second surface 304 disposed opposite to the first surface 302, a third surface 306 disposed between the first surface 302 and the second surface 304, and a fourth surface 308 disposed between the first surface 302 and the second surface 304 to be opposite to the third surface 306, and cooling water may pass through an interior space formed by the first surface 302, the second surface 304, the third surface 306, and the fourth surface 308. For example, a cooling fluid may be water but is not limited thereto and may be various kinds of fluids having cooling performance. A temperature of the cooling fluid introduced into the cooling water passage pipe 300 may be less than 100° C., preferably less than 50° C., and more preferably less than 40° C., but the present invention is not limited thereto. The temperature of the cooling fluid passing through the cooling water passage pipe 300 and then being discharged may be higher than the temperature of the cooling fluid introduced into the cooling water passage pipe 300.

In addition, the first thermoelectric module 100 may be disposed on one outer surface of the cooling water passage pipe 300, for example, an outer side of the first surface 302, and the second thermoelectric module 200 may be disposed on another outer surface of the cooling water passage pipe 300, for example, an outer side of the second surface 304.

As described above, according to one embodiment of the present invention, there may be provided a structure in which the cooling water flows through the cooling water passage pipe 300 disposed at a center portion of the body part 1000, the thermoelectric modules 100 and 200 are disposed on the outer surfaces of the cooling water passage pipe 300, and an air passage pipe 1300 is disposed to surround the thermoelectric modules 100 and 200 by being spaced apart from the thermoelectric modules 100 and 200 by a predetermined interval. Accordingly, the heat converter 10 according to the embodiment of the present invention may generate power using a temperature difference between the cooling fluid flowing through the cooling water passage pipe 300 and the high-temperature gas passing through the air passage pipe 1300, that is, a temperature difference between a low-temperature part and a high-temperature part of the thermoelectric modules 100 and 200. In particular, according to one embodiment of the present invention, the thermoelectric modules 100 and 200, for example, a heat sink of the thermoelectric modules 100 and 200, may be directly exposed to the high-temperature gas flowing through the air passage pipe 1300, and thus the temperature difference between the low-temperature part and the high-temperature part of the thermoelectric modules 100 and 200 is increased so that power generation efficiency may be increased.

Here, a heat-insulating layer may be further disposed on an inner surface of the air passage pipe 1300. Accordingly, the temperature of the air passing through the air passage pipe 1300 may not be lost to the outside, and the temperature difference between the low-temperature part and the high-temperature part of the thermoelectric modules 100 and 200 may be maximized.

Here, a cooling water inlet 310 and a cooling water outlet 320 may be disposed on the third surface 306 of each cooling water passage pipe 300. When air is introduced into the air inlet pipe 2000 and passes through the air passage pipe 1300 and then moves in a direction in which the air is discharged from the air outlet pipe 3000, cooling water may be introduced into the cooling water inlet 310 of the cooling water passage pipe 300 included in the second unit module 1200 and move in a direction in which the cooling water is discharged from the cooling water outlet 320 of the cooling water passage pipe 300 included in the first unit module 1100. The temperature of the air is higher in a direction closer to the air inlet pipe 2000 and is lower in a direction closer to the air outlet pipe 3000, and the temperature of the cooling water is lower in a direction closer to the second unit module 1200 and is higher in a direction closer to the first unit module 1100 so that the temperature difference between a hot side and a cold side of the thermoelectric modules 100 and 200, that is, ΔT, may be uniformly maintained, thereby obtaining uniform power generation performance through the entire region of the body part 1000.

Meanwhile, the body part 1000 may further include a heat-insulating layer 1400 and a shield layer 1500.

The heat-insulating layer 1400 may be disposed to surround the outer surfaces of the cooling water passage pipe 300 excluding a region, in which the thermoelectric modules 100 and 200 are disposed, of the outer surfaces of the cooling water passage pipe 300. In particular, heat insulation between the hot side and the cold side of the thermoelectric modules 100 and 200 may be maintained due to heat-insulating layers 1402 and 1404 disposed on the first surface 302 and the second surface 304 on which the thermoelectric modules 100 and 200 are disposed, respectively, among the outer surfaces of the cooling water passage pipe 300 so that power generation efficiency may be increased.

In addition, the shield layer 1500 may include a first shield layer 1502 integrally covering the third surface 306 of the cooling water passage pipe 300 included in the first unit module 1100 and the third surface 306 of the cooling water passage pipe 300 included in the second unit module 1200 and a second shield layer 1504 integrally covering the fourth surface 308 of the cooling water passage pipe 300 included in the first unit module 1100 and the fourth surface 308 of the cooling water passage pipe 300 included in the second unit module 1200. Accordingly, it is possible to connect the plurality of unit modules 1100 and 1200 to be parallel.

The shield layer 1500 may further include a third shield layer 1506 disposed on a side surface of the first unit module 1100 facing the air inlet pipe 2000. At this point, the third shield layer 1506 may be fastened to the inner surface of the air passage pipe 1300 using screws and may be disposed in a region other than a region in which a heat sink 190 is disposed. Accordingly, the air introduced into the air inlet pipe 2000 may pass through the air passage pipe 1300 by being uniformly distributed toward the first thermoelectric module 100 and the second thermoelectric module 200.

Referring to FIGS. 5 to 7, the first thermoelectric module 100 and the second thermoelectric module 200 may be fastened to the cooling water passage pipe 300 using a screw S. Accordingly, the first thermoelectric module 100 and the second thermoelectric module 200 may be stably coupled to the surfaces of the cooling water passage pipe 300. Alternatively, the cooling water passage pipe 300 may be adhered to the surface of the cooling water passage pipe 300 through a thermal pad.

For convenience of description, the first thermoelectric module 100 is described as an example, but the same content may be applied to the second thermoelectric module 200.

The first thermoelectric module 100 includes thermoelectric elements disposed on the outer side of the first surface 302 of the cooling water passage pipe 300 and a heat sink 190 disposed on the thermoelectric elements. At this point, the heat sink 190 is disposed to face the inner surface of the air passage pipe 1300 and may be spaced apart from the inner surface of the air passage pipe 1300 by a predetermined interval. Accordingly, the temperature of the air passing through the air passage pipe 1300 may be efficiently transferred to the hot side of the thermoelectric element through the heat sink 190. In addition, an aluminum plate 192 may be further disposed between the outer side of the first surface 302 of the cooling water passage pipe 300 and the thermoelectric elements. Since the aluminum plate 192 has a high heat transfer efficiency, the temperature of the cooling water passing through the cooling water passage pipe 300 may be efficiently transferred to the cold side of the thermoelectric element through the aluminum plate 192.

Each of the thermoelectric elements includes a first substrate 110, a plurality of first electrodes 120 disposed on the first substrate 110, a plurality of P-type thermoelectric legs 130 and a plurality of N-type thermoelectric legs 140 disposed on the plurality of first electrodes 120, a plurality of second electrodes 150 disposed on the plurality of P-type thermoelectric legs 130 and the plurality of N-type thermoelectric legs 140, and a second substrate 160 disposed on the plurality of second electrodes 150.

Here, the first electrodes 120 are disposed between the first substrate 110 and lower bottom surfaces of the P-type thermoelectric legs 130 and the N-type thermoelectric legs 140, and the second electrodes 150 are disposed between the second substrate 160 and upper surfaces of the P-type thermoelectric legs 130 and the N-type thermoelectric legs 140. Accordingly, the plurality of P-type thermoelectric legs 130 and the plurality of N-type thermoelectric legs 140 may be electrically connected by the first electrodes 120 and the second electrodes 150. A pair of the P-type thermoelectric leg 130 and the N-type thermoelectric leg 140, which are disposed between the first electrode 120 and the second electrode 150 and electrically connected to each other, may form a unit cell.

Here, the P-type thermoelectric leg 130 and the N-type thermoelectric leg 140 may be bismuth telluride (Bi—Te)-based thermoelectric legs including bismuth (Bi) and tellurium (Te) as a main material. The P-type thermoelectric leg 130 may be a thermoelectric leg including a Bi—Te-based main raw material containing at least one among antimony (Sb), nickel (Ni), aluminum (Al), copper (Cu), silver (Ag), lead (Pb), boron (B), gallium (Ga), tellurium (Te), bismuth (Bi), and indium (In) in the range of 99 to 99.999 wt % and a mixture containing Bi or Te in the range of 0.001 to 1 wt % based on a total weight of 100 wt %. For example, a main raw material of the P-type thermoelectric leg 130 may be Bi-selenium (Se)—Te, and the P-type thermoelectric leg 130 may further include Bi or Te in the range of 0.001 to 1 wt % based on a total weight. The N-type thermoelectric leg 140 may be a thermoelectric leg including a Bi—Te-based main raw material containing at least one among Se, Ni, Al, Cu, Ag, Pb, B, Ga, Te, Bi, and In in the range of 99 to 99.999 wt % and a mixture containing Bi or Te in the range of 0.001 to 1 wt % based on a total weight of 100 wt %. For example, a main raw material of the N-type thermoelectric leg 140 may be Bi—Sb—Te, and the N-type thermoelectric leg 140 may further include Bi or Te in the range of 0.001 to 1 wt % based on a total weight.

The P-type thermoelectric leg 130 and the N-type thermoelectric leg 140 may be formed as a bulk type or a stacked type. Generally, the bulk type P-type thermoelectric leg 130 or the bulk type N-type thermoelectric leg 140 may be obtained through a process of performing a thermal process on a thermoelectric material to manufacture an ingot, crushing and sieving the ingot to obtain a powder for a thermoelectric leg, sintering the powder, and cutting a sintered body. The stacked type P-type thermoelectric leg 130 or the stacked type N-type thermoelectric leg 140 may be obtained through a process of coating a sheet-shaped base with a paste including a thermoelectric material to form unit members, stacking the unit members, and cutting the stacked unit members.

Here, the pair of P-type thermoelectric leg 130 and N-type thermoelectric leg 140 may have the same shape and volume or may have different shapes and volumes. For example, since electrical conduction properties of the P-type thermoelectric leg 130 and the N-type thermoelectric leg 140 are different, a height or cross-sectional area of the N-type thermoelectric leg 140 may be formed to be different from that of the P-type thermoelectric leg 130.

The performance of the thermoelectric element according to one embodiment of the present invention may be expressed as a thermoelectric figure-of-merit. A thermoelectric figure-of-merit ZT may be expressed by Equation 1, $$ZT = \alpha^2 \cdot \sigma \cdot T/K \qquad \text{[Equation 1]}$$

where $\alpha$ is the Seebeck coefficient [V/K], $\sigma$ is electrical conductivity [S/m], and $\alpha^2\sigma$ is a power factor [W/mK$^2$]. In addition, T is temperature and k is thermal conductivity [W/mK]. k may be expressed as $a \cdot c_p \cdot \rho$, wherein a is thermal diffusivity [cm$^2$/S], $c_p$ is specific heat [J/gK], and $\rho$ is density [g/cm$^3$].

In order to obtain a figure of merit of a thermoelectric element, a Z value [V/K] is measured using a Z meter, and the figure of merit ZT may be calculated using the measured Z value.

When a temperature difference is provided between the first electrode 120 and the second electrode 150, due to the Seebeck effect, charges in the P-type thermoelectric leg 130 and the N-type thermoelectric leg 140 move, and thus electricity may be generated.

According to the embodiment of the present invention, the P-type thermoelectric leg 130 and the N-type thermoelectric leg 140 may also have a structure illustrated in FIG. 6B. Referring to FIG. 6B, the thermoelectric legs 130 and 140 include thermoelectric material layers 132 and 142, first plating layers 134 and 144 stacked on one surfaces of the thermoelectric material layers 132 and 142, second plating layers 134 and 144 stacked on the other surfaces which are disposed opposite to the one surfaces of the thermoelectric material layers 132 and 142, first bonding layers 136 and 146 disposed between the thermoelectric material layers 132 and 142 and the first plating layers 134 and 144 and second bonding layers 136 and 146 disposed between the thermoelectric material layers 132 and 142 and the second plating layers 134 and 144, and first metal layers 138 and 148 disposed on the first plating layers 134 and 144 and second metal layers 138 and 148 disposed on the second plating layers 134 and 144.

Here, the thermoelectric material layers 132 and 142 may include Bi and Te which are semiconductor materials. The thermoelectric material layers 132 and 142 may have the same material or shape as the P-type thermoelectric leg 130 or the N-type thermoelectric leg 140 which is described with reference to FIG. 6A.

In addition, each of the first metal layers 138 and 148 and the second metal layers 138 and 148 may be formed of a material selected from Cu, a Cu alloy, Al, and an Al alloy and may have a thickness in a range of 0.1 mm to 0.5 mm, and preferably 0.2 mm to 0.3 mm. A thermal expansion coefficient of each of the first metal layers 138 and 148 and the second metal layers 138 and 148 is similar to or greater than a thermal expansion coefficient of each of the thermoelectric material layers 132 and 142, and thus, during sintering, compressive stress is applied to interfaces between the first metal layers 138 and 148, the second metal layers 138 and 148, and the thermoelectric material layers 132 and 142 so that cracks or delamination may be prevented. In addition, bonding forces between the first metal layers 138 and 148, the second metal layers 138 and 148, and the electrodes 120 and 150 are high so that the thermoelectric legs 130 and 140 may be stably coupled to the electrodes 120 and 150.

Next, each of the first plating layers 134 and 144 and the second plating layers 134 and 144 may include at least one of Ni, tin (Sn), Titanium (Ti), iron (Fe), Sb, chromium (Cr), and molybdenum (Mo) and have a thickness of 1 to 20 μm, and preferably, 1 to 10 μm. The first plating layers 134 and 144 and the second plating layers 134 and 144 prevent a reaction between the semiconductor material Bi or Te in the thermoelectric material layers 132 and 142 and the first and second metal layers 138 and 148 so that degradation in performance of the thermoelectric element may be prevented and oxidation of the first metal layers 138 and 148 and the second metal layers 138 and 148 may be prevented.

Here, the first bonding layers 136 and 146 may be disposed between the thermoelectric material layers 132 and 142 and the first plating layers 134 and 144, and the second bonding layers 136 and 146 may be disposed between the thermoelectric material layers 132 and 142 and the second plating layers 134 and 144. At this point, each of the first bonding layers 136 and 146 and the second bonding layers 136 and 146 may include Te. For example, each of the first bonding layers 136 and 146 and the second bonding layers 136 and 146 may include at least one among Ni—Te, Sn—Te, Ti—Te, Fe—Te, Sb—Te, Cr—Te, and Mo—Te. According to the embodiment of the present invention, each of the first bonding layers 136 and 146 and the second bonding layers 136 and 146 may have a thickness of 0.5 μm to 100 μm, and preferably 1 μm to 50 μm. According to the embodiment of the present invention, the first bonding layers 136 and 146 and the second bonding layers 136 and 146, which include Te, are disposed in advance between the thermoelectric material layers 132 and 142 and the first plating layers 134 and 144 and the thermoelectric material layers 132 and 142 and the second plating layers 134 and 144 so that it is possible to prevent Te in the thermoelectric material layers 132 and 142 from diffusing to the first plating layers 134 and 144 and the second plating layers 134 and 144. Thus, occurrence of a Bi-rich region may be prevented.

Meanwhile, the first electrode 120 disposed between the first substrate 110 and the P-type thermoelectric leg 130 and the N-type thermoelectric leg 140 and the second electrode 150 disposed between the second substrate 160 and the P-type thermoelectric leg 130 and the N-type thermoelectric leg 140 may include at least one of Cu, Ag, and Ni and have a thickness of 0.01 mm to 0.3 mm. When the thickness of the first electrode 120 or the second electrode 150 is less than 0.01 mm, the function thereof as an electrode decrease and thus electrical conduction performance may be degraded, and, when the thickness thereof exceeds 0.3 mm, conduction efficiency may be degraded due to an increase in resistance.

In addition, the first substrate 110 and the second substrate 160 which are opposite to each other may be insulating substrates or metal substrates.

When the first substrate 110 and the second substrate 160 are metal substrates, the first substrate 110 and the second substrate 160 may include Cu, a Cu alloy, Al, an Al alloy, or a Cu—Al alloy and may have a thickness of 0.1 mm to 0.5 mm. When the thickness of the metal substrate is less than 0.1 mm or exceeds 0.5 mm, heat radiation characteristics or thermal conductivity may be excessively high, and thus reliability of the thermoelectric element may be degraded. In addition, when the first substrate 110 and the second substrate 160 are metal substrates, a resin layer 170 may be further formed between the first substrate 110 and the first electrodes 120 and between the second substrate 160 and the second electrodes 150. The resin layer 170 may include a material having heat conductivity of 5 to 20 W/mK and be formed to have a thickness of 0.01 mm to 0.15 mm. When the thickness of the resin layer 170 is less than 0.01 mm, insulation efficiency or a withstand voltage characteristic may be degraded, and, when the thickness thereof exceeds 0.15 mm, thermal conductivity may be lowered and thus heat dissipation efficiency may be degraded.

When the first substrate 110 and the second substrate 160 are insulating substrates, the insulating substrate may be an alumina substrate or a polymer resin substrate. The polymer resin substrate may include various insulating resin materials such as high transparent plastic and the like such as polyimide (PI), polystyrene (PS), polymethyl methacrylate (PMMA), cyclic olefin copoly (COC), and polyethylene terephthalate (PET).

The resin layer 170 or the polymer resin substrate may be formed of an epoxy resin composition including an epoxy resin and an inorganic filler, or a silicone resin composition including a silicone resin such as polydimethylsiloxane (PDMS) and an inorganic filler. Accordingly, when the first substrate 110 or the second substrate 160 is a metal substrate, bonding force with the thermoelectric element 100 may be increased.

Here, the inorganic filler may be included in an amount of 68 to 88 vol % of the polymer resin substrate. When the inorganic filler is included in an amount less than 68 vol %, a thermal conduction effect may be low, and when the inorganic filler is included in an amount exceeding 88 vol %, the polymer resin substrate may be easily broken.

The resin layer 170 may have a thickness of 0.02 to 0.6 mm, preferably 0.1 to 0.6 mm, and more preferably 0.2 to 0.6 mm and may have a thermal conductivity of 1 W/mK or more, preferably 10 W/mK or more, and more preferably 20 W/mK or more. When the thickness of the polymer resin substrate satisfies the above numerical range, even when the polymer resin substrate is repeatedly contracted and expanded according to a change in temperature, bonding between the polymer resin substrate and the metal substrate may not be affected.

To this end, the epoxy resin may include an epoxy compound and a curing agent. In this case, the curing agent may be included in a volume ratio of 1 to 10 with respect to a volume ratio of 10 of the epoxy compound. Here, the epoxy compound may include at least one among a crystalline epoxy compound, an amorphous epoxy compound, and a silicone epoxy compound.

The inorganic filler may include at least one of aluminum oxide and nitride, and the nitride may include at least one of boron nitride and aluminum nitride. The boron nitride may include a boron nitride agglomerate in which a plurality of plate-like boron nitrides are agglomerated. A particle size D50 of the boron nitride agglomerate may be in a range of 250 to 350 μm, and a particle size D50 of the aluminum oxide may be in a range of 10 to 30 μm. When the particle size D50 of the boron nitride agglomerate and the particle size D50 of the aluminum oxide satisfy the above numerical ranges, the boron nitride agglomerate and the aluminum oxide may be uniformly dispersed in the polymer resin substrate, and accordingly, the entire polymer resin substrate may have a uniform thermal conduction effect and bonding performance.

When the first substrate 110 and the second substrate 160 are polymer resin substrates, the first substrate 110 and the second substrate 160 may have a small thickness, a high heat dissipation performance, and a high insulating performance compared to the metal substrate. In addition, a separate adhesive layer may not be required when the electrode is disposed on the polymer resin layer in a semi-cured state, applied on the heat sink 190 or the aluminum plate 192, and then thermally pressed.

In this case, the first substrate 110 and the second substrate 160 may be formed to have different sizes. For example, a volume, a thickness, or an area of one of the first substrate 110 and the second substrate 160 may be formed to be greater than that of the other one thereof. Accordingly, heat absorption performance or heat dissipation performance of the thermoelectric element may be improved.

In addition, a heat dissipation pattern, for example, an irregular pattern, may be formed on a surface of at least one of the first substrate 110 and the second substrate 160. Accordingly, heat dissipation performance of the thermoelectric element may be improved. When the irregular pattern is formed on a surface in contact with the P-type thermoelectric leg 130 or the N-type thermoelectric leg 140, a bonding property between the thermoelectric leg and the substrate may also be improved.

Meanwhile, the P-type thermoelectric leg 130 or the N-type thermoelectric leg 140 may have a cylindrical shape, a polygonal column shape, an elliptical column shape, or the like.

According to one embodiment of the present invention, in the P-type thermoelectric leg 130 or the N-type thermoelectric leg 140, a portion bonded to the electrode may be formed to have a great width.

Hereinafter, the movement of the cooling water will be described in more detail with reference to the drawings.

FIG. 8A is a view illustrating an example of the plurality of unit modules included in the heat converter according to the first embodiment of the present invention, and FIG. 8B is a view illustrating another example of the plurality of unit modules included in the heat converter according to the first embodiment of the present invention. FIG. 9A is a view illustrating an internal structure of the cooling water passage pipe and a cooling water moving path according to the first embodiment of the present invention, and FIG. 9B is a view illustrating an example of the cooling water inlet and the cooling water outlet of the cooling water passage pipe according to the first embodiment of the present invention.

As illustrated in FIG. 8A, the cooling water passage pipe 300 included in each of the unit modules 1100 and 1200 may include both of the cooling water inlet 310 and the cooling water outlet 320. At this point, cooling water discharged from the cooling water outlet 320 of the cooling water passage pipe 300 included in the second unit module 1200 may be introduced into the cooling water inlet 310 of the cooling water passage pipe 300 included in the first unit module 1100. Alternatively, as illustrated in FIG. 8B, when the cooling water passage pipe 300 included in one unit module 1200 includes a cooling water inlet 310, the cooling water passage pipe 300 included in the other unit module 1100 may include a cooling water outlet 320.

Referring to FIG. 9A, a plurality of fins 330 having a direction from an inner side of the third surface 306 to an inner side of the fourth surface 308 may be disposed in each cooling water passage pipe 300. As described above, when the fins 330 are formed in the cooling water passage pipe 300, heat exchange between the cooling water and the cooling water passage pipe 300 may be efficiently performed. For example, a surface temperature of the cooling water passage pipe 300 in the case in which the fins 330 are formed in the cooling water passage pipe 300 may be lower than a surface temperature of the cooling water passage pipe 300 in the case in which the fins 330 are not formed in the cooling water passage pipe 300 by about 2° C. or more.

Here, some fins 332 of the plurality of fins 330 may be disposed to be in contact with the inner side of the third surface 306, the remaining fins 334 of the plurality of fins 330 may be disposed so as not to be in contact with the inner side of the third surface 306, and the plurality of fins 334 disposed so as not to be in contact with the inner side of the third surface 306 may be disposed between the plurality of fins 332 disposed to be in contact with the inner side of the third surface 306.

At this point, the plurality of fins 332 disposed to be in contact with the inner side of the third surface 306 may be disposed so as not to be in contact with the inner side of the fourth surface 308, and at least a portion of the plurality of fins 334 disposed so as not to be in contact with the inner side of the third surface 306 may also be disposed so as not to be in contact with the inner side of the fourth surface 308. Alternatively, the plurality of fins 332 disposed to be in contact the inner side of the third surface 306 may be disposed so as not to be in contact with the inner side of the fourth surface 308, and at least a portion of the plurality of fins 334 disposed so as not to be in contact with the inner side of the third surface 306 may be disposed to be in contact with the inner side of the fourth surface 308.

In addition, an inner wall 340 disposed in a direction from the inner side of the fourth surface 308 toward the inner side of the third surface 306 to be in contact with the inner side of the fourth surface 308 may be provided between the plurality of fins 334 disposed so as not to be in contact with both of the inner side of the third surface 306 and the inner side of the fourth surface 308. At this point, some of the plurality of fins 334 disposed so as not to be in contact with the inner side of the third surface 306 may be disposed to be in contact with the inner wall 340. That is, the inner wall 340 may be the inner side of the fourth surface 308, and accordingly, the plurality of fins disposed so as not to be in contact with the inner side of the third surface 306 and to be in contact with the inner side of the fourth surface 308 may be disposed between the plurality of fins disposed so as not to be in contact with both of the inner side of the third surface 306 and the inner side of the fourth surface 308. Accordingly, cooling water flows in a W shape in the cooling water passage pipe 300 so that a cooling water flow path may be lengthened, and the time for heat exchange between the cooling water and the cooling water passage pipe 300 may be increased.

Meanwhile, referring to FIG. 9B, at least one of the cooling water inlet 310 and the cooling water outlet 320 may be processed into a tap shape. Accordingly, an effect of improving a flow velocity may be obtained when the flow velocity is low.

Next, a coupling structure of the unit module and the air passage pipe will be described with reference to the drawings.

FIG. 10 is a perspective view of the air passage pipe of the heat converter according to the first embodiment of the present invention, FIG. 11A is a perspective view of the body part in which the air passage pipe of FIG. 10 is coupled, and FIG. 11B is a plan view of the body part in which the air passage pipe is coupled viewed from an air inlet side.

Referring to FIGS. 10 and 11, the air passage pipe 1300 may include a first flange 1302 joined to the air inlet pipe 2000, a second flange 1304 joined to the air outlet pipe 3000, and a pipe 1306 connecting between the first flange 1302 and the second flange 1304. The pipe 1306 may include a fifth surface 1312, a sixth surface 1314, a seventh surface 1316, and an eighth surface 1318 respectively corresponding to the first surface 302, the second surface 304, the third surface 306, and the fourth surface 308. A hole 1320 extending from the first flange 1302 to the seventh surface 1316 or from the second flange 1304 to the seventh surface 1316 may be formed. At this point, the height of the hole 1320 formed in the first flange 1302 or the second flange 1304 may be greater than the height of each of the cooling water inlet 310 and the cooling water outlet 320 formed on the third surface 306 of each cooling water passage pipe 300. Accordingly, the first unit module 1100 and the second unit module 1200 may be assembled to the air passage pipe 1300 by a method of pushing the first unit module 1100 and the second unit module 1200 through the hole 1320. When the hole 1320 is formed in the second flange 1304, the second flange 1304 may be formed to be greater than the first flange 1302.

Hereinafter, a heat converter according to a second embodiment of the present invention will be described. Repetitive descriptions of the same contents as those described in the first embodiment will be omitted.

FIG. 12 is a perspective view of the heat converter according to the second embodiment of the present invention, FIG. 13 is an enlarged view of a portion of the heat converter according to the second embodiment of the present invention, FIG. 14 is a perspective view of a unit module included in the heat converter according to the second embodiment of the present invention, FIG. 15 is an exploded view of the unit module of FIG. 14, and FIG. 16 is a cross-sectional view of the heat converter according to the second embodiment of the present invention.

Referring to FIGS. 12 to 16, a heat converter 40 includes a plurality of unit module groups and a frame 5000 configured to support the plurality of unit module groups. Here, each of the unit module groups includes a plurality of unit modules 4000.

Here, the plurality of unit modules 4000 may be arranged in both a first direction and a second direction, and the second direction may be a direction intersecting the first direction, for example, a direction perpendicular to the first direction. In the present specification, it may be described that a plurality of unit modules 4000 arranged in the first direction form one unit module group, and accordingly, the plurality of unit module groups may be arranged in the second direction. Here, the plurality of unit modules 4000 included in one unit module group may be disposed to be spaced apart from each other at predetermined intervals. For convenience of description, in the present specification, the case in which the heat converter 40 includes five unit module groups arranged in the second direction, that is, a first unit module group 4000-A, a second unit module group 4000-B, a third unit module group 4000-C, a fourth unit module group 4000-D, and a fifth unit module group 4000-E, is described as an example, but the present invention is not limited thereto.

The frame 5000 may be a frame or an edge disposed to surround an outer periphery of the plurality of unit modules 4000. At this point, a cooling water inlet pipe (not shown) for injecting cooling water into the plurality of unit modules 4000 and a cooling water outlet pipe (not shown) for discharging the cooling water that passes through interiors of the plurality of unit modules 4000 may be formed in the frame 5000. One of the cooling water inlet pipe and the cooling water outlet pipe may be formed on an edge of a unit module group disposed at one edge of the plurality of unit module groups, for example, an edge disposed at a side surface of the first unit module group 4000-A, and the other one thereof may be formed on an edge of a unit module group disposed at the other edge of the plurality of unit module groups, for example, an edge disposed at a side surface of the fifth unit module group 4000-E.

In particular, referring to FIGS. 14 and 15, each of the unit modules 4000 includes a cooling water passage chamber 4100, a first thermoelectric module 4200 disposed at one surface 4101 of the cooling water passage chamber 4100, and a second thermoelectric module 4300 disposed at the other surface 4102 of the cooling water passage chamber 4100. Here, one surface 4101 and the other surface 4102 of the cooling water passage chamber 4100 may be both surfaces of the cooling water passage chamber 4100 disposed to be spaced apart from each other at a predetermined interval in the first direction, and in the present specification, one surface 4101 and the other surface 4102 of the cooling water passage chamber 4100 may be interchangeably used with a first surface and a second surface of the cooling water passage chamber 4100.

A low-temperature part of the first thermoelectric module 4200, that is, a heat-dissipating part, may be disposed on an outer side of the first surface 4101 of the cooling water passage chamber 4100, and a high-temperature part of the first thermoelectric module 4200, that is, a heat-absorbing part, may be disposed to face a second thermoelectric module 4300 of another adjacent unit module 4000. Likewise, a low-temperature part of the second thermoelectric module 4300, that is, a heat-dissipating part, may be disposed on an outer side of the second surface 4102 of the cooling water passage chamber 4100, and a high-temperature part of the second thermoelectric module 4300, that is, a heat-absorbing part, may be disposed to face a first thermoelectric module 4200 of another adjacent unit module 4000.

The heat converter 40 according to the second embodiment of the present invention may generate power using a temperature difference between cooling water flowing through the cooling water passage chamber 4100 and high-temperature gas passing through separated spaces between the plurality of unit modules 4000, that is, a temperature difference between the heat-absorbing part and a heating part of the first thermoelectric module 4200 and a temperature difference between the heat-absorbing part and the heat-dissipating part of the second thermoelectric module 4300. Here, the cooling water may be water, but is not limited thereto, and may be various kinds of fluids having cooling performance. A temperature of the cooling water introduced into the cooling water passage chamber 4100 may be less than 100° C., preferably less than 50° C., and more preferably less than 40° C., but the present invention is not limited thereto. The temperature of the cooling water passing through the cooling water passage chamber 4100 and then being discharged may be higher than the temperature of the cooling water introduced into the cooling water passage chamber 4100. A temperature of the high-temperature gas passing through the separated spaces between the plurality of unit modules 4000 may be higher than the temperature of the cooling water. For example, the temperature of the high-temperature gas passing through the separated spaces between the plurality of unit modules 4000 may be 100° C. or more, preferably 150° C. or more, and more preferably 200° C. or more, but the present invention is not limited thereto. In this case, a width of each of the separated spaces between the plurality of unit modules 4000 may range from several millimeters to several tens of millimeters and may be varied according to a size of the heat converter, the temperature of the gas being introduced, an inflow velocity of the gas, a required amount of power generation, and the like.

The first thermoelectric module 4200 and the second thermoelectric module 4300 may each include a plurality of thermoelectric elements 100. The number of thermoelectric elements included in each thermoelectric module may be adjusted according to the required amount of power generation.

In addition, the plurality of thermoelectric elements 100 included in each thermoelectric module may be electrically connected, and at least some of the plurality of thermoelectric elements 100 may be electrically connected using a bus bar (not shown). For example, the bus bar may be disposed at an outlet side through which high-temperature gas is discharged after passing through the separated spaces between the plurality of unit modules 4000 and may be connected to an external terminal. Thus, power may be supplied to the first thermoelectric module 4200 and the second thermoelectric module 4300 without disposing a printed circuit board (PCB) for the first thermoelectric module 4200 and the second thermoelectric module 4300 in the heat converter so that it is easy to design and assemble the heat converter.

In addition, each thermoelectric module may include a plurality of group thermoelectric elements depending on a distance spaced apart from a third surface 4103 or a fourth surface 4104 in a third direction. For example, the first thermoelectric module 4200 may include a plurality of group thermoelectric elements each being spaced apart by the same minimum distance (hereinafter, referred to as a minimum separation distance) from the fourth surface 4104 in the third direction, and the plurality of group thermoelectric elements may include first to fourth group thermoelectric elements HA1 to HA4. Here, among the group thermoelectric elements of the first thermoelectric module 4200, the first group thermoelectric element HA1 may be disposed closest to the fourth surface 4104, and the fourth group thermoelectric element HA4 may be disposed closest to the third surface 4103. In addition, hereinafter, a description will be made on the basis of the above description.

In addition, each of the unit modules 4000 may further include a heat-insulating layer 4400 and a shield layer 4500 that are disposed between the plurality of thermoelectric elements 100. The heat-insulating layer 4400 may be disposed to surround at least a portion of the outer surface of the cooling water passage chamber 4100 excluding a region, in which the thermoelectric elements 100 are disposed, of the outer surface of the cooling water passage chamber 4100. In particular, when the heat-insulating layer 4400 is disposed between the thermoelectric elements 100 at the first surface 4101 and the second surface 4102 of the cooling water passage chamber 4100, on which the plurality of thermoelectric elements 100 are disposed, among the outer surfaces of the cooling water passage chamber 4100, heat insulation between a cold side and a hot side of the thermoelectric element 100 may be maintained due to the heat-insulating layer 4400 so that power generation efficiency may be increased.

In addition, the shield layer 4500 may be disposed on the heat-insulating layer 4400 and may protect the heat-insulating layer 4400 and the plurality of thermoelectric elements 100. To this end, the shield layer 4500 may include a stainless material.

The shield layer 4500 may be fastened to the cooling water passage chamber 4100 by screws. Thus, the shield layer 4500 may be stably coupled to the unit module 4000, and the first thermoelectric module 4200 or the second thermoelectric module 4300 and the heat-insulating layer 4400 may also be fixed together.

Here, the first thermoelectric module 4200 and the second thermoelectric module 4300 may be adhered to the first surface 4101 and the second surface 4102 of the cooling water passage chamber 4100, respectively, using thermal pads 4600. Since the thermal pad 4600 easily transfers heat, heat transfer between the cooling water passage chamber 4100 and the thermoelectric module may not be hindered. In addition, each of the first thermoelectric module 4200 and the second thermoelectric module 4300 may further include a heat sink 400 disposed at the hot side of the thermoelectric element 100 and a metal plate 500, for example, an aluminum plate, disposed at the cold side of the thermoelectric element 100. At this point, the heat sink 400 is disposed to face another adjacent unit module. The heat sink 400 included in the first thermoelectric module 4200 may be disposed to face a second thermoelectric module 4300 of another adjacent unit module 4000-1 (see FIG. 13), and the heat sink 400 included in the second thermoelectric module 4300 may be disposed to face a first thermoelectric module 4200 of another adjacent unit module 4000-2 (see FIG. 13). At this point, heat sinks 400 of adjacent different unit modules 4000 may be spaced apart from each other at predetermined intervals. Accordingly, the temperature of air passing between the plurality of unit modules 4000 may be efficiently transferred to the hot side of the thermoelectric element 100 through the heat sink 400. Meanwhile, since the metal plate 500, for example, an aluminum plate, has a high heat transfer efficiency, the temperature of the cooling water passing through the cooling water passage chamber 4100 may be efficiently transferred to the cold side of the thermoelectric element 100 through the metal plate 500. As illustrated in the drawings, the plurality of thermoelectric elements 100 may be disposed on one metal plate 500, but the present invention is not limited thereto, and one thermoelectric element 100 may also be disposed on one metal plate 500.

The description of each thermoelectric element 100 is given above in conjunction with the description related to the first embodiment, and thus repetitive descriptions thereof will be omitted.

Meanwhile, each of the unit modules 4000 may further include a first support frame 4700 disposed on the third surface 4103 between the first surface 4101 and the second surface 4102 of the cooling water passage chamber 4100 and a second support frame 4800 disposed on the fourth surface 4104 between the first surface 4101 and the second surface 4102 of the cooling water passage chamber 4100. Here, the third surface 4103 may be a surface facing downward in the third direction, and the fourth surface 4104 may be a surface facing the third surface 4103 and a surface facing upward in the third direction.

The shape of at least one of the first support frame 4700 and the second support frame 4800 may be an H shape, for example, an H beam. The number of each of the first support frame 4700 and the second support frame 4800 included in the heat converter 40 may be the same as the total number of the unit modules 4000 included in the heat converter 40. As illustrated in FIGS. 14 and 15, the first support frame 4700 and the second support frame 4800 disposed in the same unit module may be referred to as a pair of support frames. When the first support frame 4700 and the second support frame 4800 are disposed on the third surface 4103 and the fourth surface 4104 of the cooling water passage chamber 4100, respectively, the rigidity of the unit module may be maintained, and a problem of being bent or deformed during vibration may be prevented.

To this end, the frame 5000 may further include a support wall 5300 disposed between the first unit module group 4000-A and the second unit module group 4000-B, and each of the first support frame 4700 and the second support frame 4800 may be fastened to the support wall 5300. At this point, the support wall 5300 may be fastened to a frame or edge of the frame 5000 or may be integrally molded with the frame 5000.

More specifically, the support wall 5300 may be disposed between the first unit module group 4000-A and the second unit module group 4000-B, the first support frame 4700 and the second support frame 4800 disposed on each of the unit modules 4000 of the first unit module group 4000-A may extend from a lower portion and an upper portion of the support wall 5300, respectively, in a direction in which the second unit module group 4000-B is disposed, and the first support frame 4700 and the second support frame 4800 disposed on each of the unit modules 4000 of the second unit module group 4000-B may extend from a lower portion and an upper portion of the support wall 5300, respectively, in a direction in which the first unit module group 4000-A is disposed. At this point, an extending length of each of the first support frame 4700 and the second support frame 4800 should not exceed half of a thickness of the support wall 5300. In addition, the first support frame 4700 may be fastened to the lower portion of the support wall 5300 by screws, and the second support frame 4800 may be fastened to the upper portion of the support wall 5300 by screws. Accordingly, assembly may be facilitated because the unit module itself does not need to be directly fixed to the frame by screws. In addition, the number of the unit modules may be easily adjusted according to the required amount of power generation.

Here, a pair of support frames is illustrated as supporting a single module, but the present invention is not limited thereto. Each of the first support frame 4700 and the second support frame 4800 may extend in the second direction to simultaneously support one of the plurality of unit modules included in one unit module group and one of the plurality of unit modules included in another adjacent unit module group. Accordingly, the number of each of the first support frame 4700 and the second support frame 4800 included in the heat converter 40 may be the same as the number of the unit modules 4000 included in the first unit module group 4000-A or may be a multiple of the number of the unit modules 4000 included in the first unit module group 4000-A.

To this end, a plurality of grooves, in each of which the first support frame 4700 is disposed, may be formed at a lower end of the support wall 5300, and a plurality of grooves, in each of which the second support frame 4800 is disposed, may be formed at an upper end of the support wall 5300, and each of the first support frame 4700 and the second support frame 4800 may be fastened to the support wall 5300 by fastening members such as screws. The number of grooves formed at each of the lower end and the upper end of one support wall 5300 may be the same as the number of unit modules 4000 arranged in one unit module group.

According to the embodiment of the present invention, a cooling water inlet is formed on one side surface of the cooling water passage chamber 4100, and a cooling water outlet is formed on the other side surface of the cooling water passage chamber 4100.

That is, a cooling water inlet 4110 may be formed on a fifth surface 4105, which is one of two surfaces between the first surface 4101, the second surface 4102, the third surface 4103, and the fourth surface 4104 of the cooling water passage chamber 4100, and a cooling water outlet 4120 may be formed on a sixth surface 4106 that is the other surface of two surfaces between the first surface 4101, the second surface 4102, the third surface 4103, and the fourth surface 4104. In FIG. 12, when the first unit module group 4000-A, the second unit module group 4000-B, the third unit module group 4000-C, the fourth unit module group 4000-D, and the fifth unit module group 4000-E are arranged sequentially in the second direction and the cooling water flows in a direction from the first unit module group 4000-A toward the fifth unit module group 4000-E, the cooling water inlet 4110 may be formed on one side surface of the cooling water passage chamber 4100 of each of the unit modules 4000 included in the first unit module group 4000-A, that is, the fifth surface 4105 which is an outer side surface of the cooling water passage chamber 4100, and the cooling water outlet 4120 may be formed on the other side of the cooling water passage chamber 4100 of each of the unit modules 4000 included in the first unit module group 4000-A, that is, the sixth surface 4106 which is a side surface of the cooling water passage chamber 4100 disposed to face the second unit module group 4000-B. Likewise, the cooling water inlet 4110 may be formed on one side surface of the cooling water passage chamber 4100 of each of the unit modules 4000 included in the second unit module group 4000-B, that is, the fifth surface 4105 which is a side surface of the cooling water passage chamber 4100 disposed to face the first unit module group 4000-A, and the cooling water outlet 4120 may be formed on the other side of the cooling water passage chamber 4100 of each of the unit modules 4000 included in the second unit module group 4000-B, that is, the sixth surface 4106 which is a side surface of the cooling water passage chamber 4100 disposed to face the third unit module group 4000-C.

Here, in order to allow the cooling water to flow in the direction from the first unit module group 4000-A toward the fifth unit module group 4000-E, holes 5310 may be formed in the support wall 5300, which is disposed between two unit module groups, so as to correspond to positions of the cooling water inlet 4110 and the cooling water outlet 4120. For example, the holes 5310 may be formed to simultaneously correspond to the position of the cooling water outlet 4120 formed in the cooling water passage chamber 4100 of each of the unit modules 4000 included in the first unit module group 4000-A and the position of the cooling water inlet 4110 formed in the cooling water passage chamber 4100 of each of the unit modules 4000 included in the second unit module group 4000-B. Accordingly, the cooling water outlet 4120 formed in the cooling water passage chamber 4100 of each of the unit modules 4000 included in the first unit module group 4000-A may be connected to the cooling water inlet 4110 formed in the cooling water passage chamber 4100 of each of the unit modules 4000 included in the second unit module group 4000-B through the holes 5310, and the cooling water may flow from the cooling water passage chamber 4100 of each of the unit modules 4000 included in the first unit module group 4000-A to the cooling water passage chamber 4100 of each of the unit modules 4000 included in the second unit module group 4000-B. Such a structure may be similarly applied to the second unit module group 4000-*b*, the third unit module group 4000-*c*, the fourth unit module group 4000-*d*, and the fifth unit module group 4000-*e*.

According to the embodiment of the present invention, as illustrated in FIG. 16, a first fitting member 4112 may be connected to each cooling water inlet 4110, and a second fitting member 4122 may be connected to each cooling water outlet 4120. At this point, the first fitting member 4112 and the second fitting member 4122 may be fitted into the cooling water inlet 4110 and the cooling water outlet 4120, respectively, and may each have a hollow tubular shape to allow the cooling water to pass therethrough. In addition, the first fitting member 4112 and the second fitting member 4122 may be simultaneously inserted into one hole 5310. For example, the second fitting member 4122 connected to the cooling water outlet 4120 formed in the cooling water passage chamber 4100 of each of the unit modules 4000 included in the first unit module group 4000-A and the first fitting member 4112 connected to the cooling water inlet 4110 formed in the cooling water passage chamber 4100 of each of the unit modules 4000 included in the second unit module group 4000-B may be fitted together in one of a plurality of holes 5310 formed in the support wall 5300 disposed between the first unit module group 4000-A and the second unit module group 4000-B. Here, in order to prevent the problem that the cooling water leaks between the second fitting member 4122 and the first fitting member 4112, an outer circumferential surface of the first fitting member 4112, an outer circumferential surface of the second fitting member 4122, and an inner circumferential surface of the hole 5310 may be sealed together.

According to the embodiment of the present invention, a plurality of cooling water inlets 4110 and a plurality of cooling water outlets 4120 may be respectively formed in the fifth surface 4105 and the sixth surface 4106 of each cooling water passage chamber 4100, and the plurality of holes 5310 may be formed in the support wall 5300 to correspond to positions of the plurality of cooling water inlets 4110 and the plurality of cooling water outlets 4120.

Here, a plurality of cooling water passing pipes 4130 may be formed in the cooling water passage chamber 4100 for smooth flow of cooling water. The cooling water passing pipes 4130 are connected from the cooling water inlets 4110 to the cooling water outlets 4120 in the cooling water passage chamber 4100, and the cooling water may flow in the second direction through the cooling water passing pipes 4130. Accordingly, the cooling water may be uniformly distributed in each cooling water passage chamber 4100 even when a flow rate of the cooling water is not sufficient to fill an interior of each cooling water passage chamber 4100 so that uniform thermoelectric conversion efficiency may be obtained with respect to the entire surface of each cooling water passage chamber 4100.

As described above, the cooling water is introduced into the first unit module group 4000-A, and then is discharged from the fifth unit module group 4000-E through the second unit module group 4000-B, the third unit module group 4000-C, and the fourth unit module group 4000-D in the second direction.

In addition, high-temperature gas flows from an upper end of the cooling water passage chamber 4100 toward a lower end of the cooling water passage chamber 4100. For example, the high-temperature gas may flow from the fourth surface 4104 toward the third surface 4103. In addition, when the second support frame 4800 is disposed at an upper end of the unit module 4000 as in the embodiment of the present invention, the problem in that the performance of the thermoelectric element is degraded due to a high temperature of the high-temperature gas may be prevented.

Further, although not illustrated in the drawing, according to the embodiment of the present invention, a cooling water inlet pipe may be formed on one side surface of the first unit module group 4000-A, for example, on a frame or edge of the frame 5000 facing the fifth surface 4105, and a cooling water outlet pipe may be formed on another side surface of the fifth unit module group 4000-E, for example, a frame or edge of the frame 5000 facing the sixth surface 4106. The cooling water introduced into the cooling water inlet pipe may be distributed and introduced into the cooling water inlet 4110 of the cooling water passage chamber 4100 of each of the plurality of unit modules 4000 included in the first unit module group 4000-A. In addition, the cooling water discharged from the cooling water outlet 4120 of the cooling water passage chamber 4100 of each of the plurality of unit modules 4000 included in the fifth unit module group 4000-E may be collected in the cooling water outlet pipe and then discharged to the outside.

According to still another embodiment of the present invention, heat dissipation fins may be disposed on an inner wall of each cooling water passage chamber 4100 or an inner wall of the cooling water passing pipe 4130. Shapes and the number of the heat dissipation fins and an area of the heat dissipation fins occupying the inner wall of each cooling water passage chamber 4100 may be variously changed according to the temperature of the cooling water, a temperature of waste heat, a required power generation capacity, and the like. An area of the heat dissipation fins occupying the inner wall of each cooling water passage chamber 4100 may be, for example, 1 to 40% of a sectional area of each cooling water passage chamber 4100. Thus, it is possible to obtain high thermoelectric conversion efficiency without disturbing the flow of the cooling water. In addition, the cooling water moves in the second direction and the gas moves in the third direction so that the cooling water and the gas may move in directions crossing each other.

FIG. 17 is a view for describing an operation of the high-temperature gas and the cooling water flowing in the heat converter according to the second embodiment of the present invention.

Referring to FIG. 17, in the unit module 4000, the cooling water may be introduced into the cooling water inlet 4110 disposed on the fifth surface 4105 as described above. In addition, the cooling water may move in the second direction through the inside cooling water passage chamber and may be discharged through the cooling water outlet 4120. Alternatively, the high-temperature gas may flow in the third direction. For example, the high-temperature gas may flow from the fourth surface 4104 toward the third surface 4103. In addition, since the plurality of group thermoelectric elements are sequentially arranged in the third direction, the high-temperature gas may be heat-exchanged with the plurality of group thermoelectric elements arranged in the third direction. Thus, the temperature may be higher in a direction adjacent to the third surface 4103 or farther away from the fourth surface 4104 due to the heat exchange of the high-temperature gas with the plurality of group thermoelectric elements. That is, the temperature may be decreased by the heat exchange performed while the high-temperature gas passes through the thermoelectric module.

For example, the first group thermoelectric element HA1, the second group thermoelectric element HA2, the third group thermoelectric element HA3, and the fourth group thermoelectric element HA4 may be arranged to be parallel in the third direction. Accordingly, minimum separation distances from the first group thermoelectric element HA1, the second group thermoelectric element HA2, the third group thermoelectric element HA3, and the fourth group thermoelectric element HA4 to the fourth surface 4104 may gradually increase. For example, a minimum separation distance d1 between the fourth surface 4104 and the first group thermoelectric element HA1, a minimum separation distance d2 between the fourth surface 4104 and the second group thermoelectric element HA2, a minimum separation distance d3 between the fourth surface 4104 and the third group thermoelectric element HA3, and a minimum separation distance d4 between the fourth surface 4104 and the fourth group thermoelectric element HA4 may gradually increase.

In addition, as described above, the temperature of the high-temperature gas sequentially passing through the first group thermoelectric element HA1, the second group thermoelectric element HA2, the third group thermoelectric element HA3, and the fourth group thermoelectric element HA4 may gradually decrease due to the heat exchange.

That is, a (1-1a)th thermoelectric element 100-1a may be disposed to be parallel with a (2-1a)th thermoelectric element 100-2a of the second group thermoelectric element HA2, a (3-1a)th thermoelectric element 100-3a of the third group thermoelectric element HA3, and a (4-1a)th thermoelectric element 100-4a of the fourth group thermoelectric element HA4 in the third direction, and the (1-1a)th thermoelectric element 100-1a, the (2-1a)th thermoelectric element 100-2a, the (3-1a)th thermoelectric element 100-3a, and the (4-1a)th thermoelectric element 100-4a may be in contact with a gas, which has a temperature relatively lowered in this order, to be heat-exchanged.

Similarly, the cooling water may be heat-exchanged with a plurality of first thermoelectric elements and a plurality of second thermoelectric elements arranged in the second direction while moving through the cooling water inlet 4110. Thus, as described above, the temperature of the cooling water passing through the cooling water passage chamber and then discharged may be higher than the temperature of the cooling water introduced into the cooling water passage chamber 4100.

Specifically, the first group thermoelectric element HA1 may include a plurality of first thermoelectric elements 100-1 arranged in the second direction and including the (1-1a)th thermoelectric element 100-1a, a (1-1b)th thermoelectric element 100-1b, a (1-1c)th thermoelectric element 100-1c, a (1-1d)th thermoelectric element 100-1d, a (1-1e)th thermoelectric element 100-1e, a (1-1f)th thermoelectric element 100-1f, a (1-1g)th thermoelectric element 100-1g, and a (1-1h)th thermoelectric element 100-1h. In addition, the temperature of the cooling water in a region (a region in which the (1-1a)th thermoelectric element 100-1a overlaps the cooling water passage chamber in the first direction) in which the (1-1a)th thermoelectric element 100-1a is in contact with the cooling water passage chamber may be lower than the temperature of the cooling water in a region in which the (1-1h)th thermoelectric element 100-1h is in contact with the cooling water passage chamber.

However, the gas may have a greater amount of heat exchanged than the cooling water with respect to the same volume. This may occur because the specific heat of gas (e.g., air) is greater than the specific heat of liquid (e.g., water).

Further, the temperature of the gas in contact with the first group thermoelectric element HA1, the second group thermoelectric element HA2, the third group thermoelectric element HA3, and the fourth group thermoelectric element HA4 decreases in this order, and a temperature drop rate of the gas is greater than a temperature drop rate of the cooling water, and thus a temperature difference between the heat-absorbing part and the heating part of the first thermoelectric module 4200 may decrease in the order of the first group thermoelectric element HA1, the second group thermoelectric element HA2, the third group thermoelectric element HA3, and the fourth group thermoelectric element HA4. Thus, power generated by each thermoelectric element may also be reduced in the order of the first group thermoelectric element HA1, the second group thermoelectric element HA2, the third group thermoelectric element HA3, and the fourth group thermoelectric element HA4. However, the heat converter according to the embodiment may have a structure that enables power generation efficiency to be improved even when the temperature difference between the heat-absorbing part and the heating part increases in the order of the first group thermoelectric element HA1, the second group thermoelectric element HA2, the third group thermoelectric element HA3, and the fourth group thermoelectric element HA4. This will be described in more detail below.

FIG. 18 is a cross-sectional view of the heat converter according to the second embodiment of the present invention.

Referring to FIG. 18, as illustrated in FIG. 16, the cooling water may move in the second direction through the cooling water passage chamber, and the cooling water passage chamber 4100 may be in contact with the thermoelectric element 100 of the first thermoelectric module 4200 and the thermoelectric element 100 of the second thermoelectric module 4300 at the first surface 4101 and the second surface 4102, respectively. As described above, the heat-dissipating part (cooling) of the thermoelectric element 100 of the first thermoelectric module 4200 may be in contact with the first surface 4101, and the heat-dissipating part (cooling) of the thermoelectric element 100 of the second thermoelectric module 4300 may be in contact with the second surface 4102. In addition, the heat-absorbing part of the thermoelectric element 100 of the first thermoelectric module 4200 may be in contact with the heat sink 400 and may be heat-exchanged with the gas. Likewise, the heat-absorbing part of the thermoelectric element 100 of the second thermoelectric module 4300 may be in contact with the heat sink 400 and may be heat-exchanged with the gas.

FIG. 19 is a view illustrating the first thermoelectric module and the first thermoelectric element in the heat converter according to the second embodiment of the present invention.

Descriptions will be made on the basis of the first thermoelectric module 4200 and the first thermoelectric elements 100 in the first thermoelectric module 4200 with reference to FIG. 19. However, the structure described below may be similarly applied to the thermoelectric module of each of the other unit modules 4000 as well as the second thermoelectric module 4300.

As described above, the first thermoelectric module 4200 may include the first group thermoelectric element HA1, the second group thermoelectric element HA2, the third group thermoelectric element HA3, and the fourth group thermoelectric element HA4 arranged to be parallel in the third direction, and the temperature of the heat-absorbing part is decreased due to the heat exchange with the gas in the order of the first group thermoelectric element HA1, the second group thermoelectric element HA2, the third group thermoelectric element HA3, and the fourth group thermoelectric element HA4, so that the temperature difference between the heating part and the heat-absorbing part may increase.

Accordingly, in the heat converter according to one embodiment, the thermoelectric elements of the group thermoelectric elements HA1 to HA4, which have the same minimum separation distance, may be electrically connected to each other, and in particular, adjacent thermoelectric elements may be connected in series.

Specifically, as described with reference to FIG. 17, the first group thermoelectric element HA1 may include a plurality of first thermoelectric elements 100-1 arranged in the second direction and including the (1-1a)th thermoelectric element 100-1a, the (1-1b)th thermoelectric element 100-1b, the (1-1c)th thermoelectric element 100-1c, the (1-1d)th thermoelectric element 100-1d, the (1-1e)th thermoelectric element 100-1e, the (1-10th thermoelectric element 100-1f, the (1-1g)th thermoelectric element 100-1g, and the (1-1h)th thermoelectric element 100-1h.

In addition, the (1-1a)th thermoelectric element 100-1a, the (1-1b)th thermoelectric element 100-1b, the (1-1c)th thermoelectric element 100-1c, the (1-1d)th thermoelectric element 100-1d, the (1-1e)th thermoelectric element 100-1e, the (1-10th thermoelectric element 100-1f, the (1-1g)th thermoelectric element 100-1g, and the (1-1h)th thermoelectric element 100-1h may be electrically connected to each other and may be connected in series with adjacent thermoelectric elements. Accordingly, all the thermoelectric elements in the group thermoelectric element may have similar values of temperature difference between the heating part and the heat-absorbing part. For example, the temperature difference may be within a predetermined error range. In contrast, when the values of the temperature differences of the electrically connected thermoelectric elements have a great difference, currents corresponding to the generated optimal power are different, and thus there may be a problem of decreasing power generation performance. Thus, in the heat converter according to the embodiment, thermoelectric elements with similar temperature differences are electrically connected to each other to maintain the same power output, thereby improving power efficiency. In addition, even when a failure such as open circuit of the thermoelectric elements occurs, the failure of the thermoelectric elements may be easily identified through power detection.

As described above, the second group thermoelectric element HA2 may include the plurality of thermoelectric elements arranged in the second direction, and the plurality of arranged thermoelectric elements may be electrically connected to each other, and adjacent thermoelectric elements may be connected in series.

Likewise, the third group thermoelectric element HA3 and the fourth group thermoelectric element HA4 may each include the plurality of thermoelectric elements arranged in the second direction, and the plurality of arranged thermoelectric elements may be electrically connected to each other, and adjacent thermoelectric elements may be connected in series.

In addition, in the first group thermoelectric element HA1, the second group thermoelectric element HA2, the third group thermoelectric element HA3, and the fourth group thermoelectric element HA4 in the heat converter, a maximum temperature difference in each of the group thermoelectric elements may be greater than a minimum temperature difference between adjacent group thermoelectric elements. Here, the maximum temperature difference refers to the difference between a highest temperature difference between the heating part and the heat-absorbing part and a lowest temperature difference between the heating part and the heat-absorbing part in each group thermoelectric element. In addition, the minimum temperature difference refers to a minimum deviation of the temperature differences between the heating parts and the heat-absorbing parts between adjacent different group thermoelectric elements. For example, the maximum temperature difference refers to the difference between a temperature difference (the highest temperature difference) between the heating part and the heat-absorbing part of the (1-1a)th thermoelectric element 100-1a and a temperature difference (the lowest temperature difference) between the heating part and the heat-absorbing part of the (1-8)th thermoelectric element 100-1h in the first group thermoelectric element HA1, In addition, the minimum temperature difference refers to a temperature deviation between a temperature difference between the heating part and the heat-absorbing part of the (1-8)th thermoelectric element (100-1h) and a temperature difference between the heating part and the heat-absorbing part of the (2-1)th thermoelectric element (100-2a) in the first group thermoelectric element HA1 and the second group thermoelectric element HA2.

Accordingly, in the heat converter according to the embodiment, the thermoelectric elements in the same group thermoelectric element may be connected in series, thereby improving power generation performance of the heat converter.

Further, electrical connections between all thermoelectric legs and electrodes in the thermoelectric element may be made in various directions, and when descriptions are made on the basis of a first electrode, a plurality of first electrodes may be variously connected in a third-second direction, a third-first direction, and the second direction. Even in the following, the electrical connection in the thermoelectric elements will be described on the basis of the first electrode. Here, the third-first direction is a direction from the third surface toward the fourth surface, and the third-second direction is a direction from the fourth surface toward the third surface and may be the same as a direction in which gas flows.

FIG. 20 is a view illustrating a first thermoelectric module and a first thermoelectric element in a heat converter according to another embodiment of the present invention.

Referring to FIG. 20, in the heat converter according to another embodiment, each of a plurality of thermoelectric elements in the same group thermoelectric element may be electrically connected to thermoelectric legs or electrodes having the same minimum separation distance from a fourth surface in a third direction, and in particular, adjacent thermoelectric legs or electrodes may be connected in series with each other. However, as described above, the following descriptions will be made on the basis of the first electrode (since both a P-type thermoelectric leg and an N-type thermoelectric leg are disposed on the first electrode), and the following description may also be similarly applied to the thermoelectric leg.

Specifically, descriptions will be made on the basis of a (1-1a)th thermoelectric element 100-1a and a (1-1b)th thermoelectric element 100-1b in a first group thermoelectric element HA1, First, the (1-1a)th thermoelectric element 100-1a may include a plurality of thermoelectric legs and a plurality of electrodes. In particular, the (1-1a)th thermoelectric element 100-1a may include a first-first electrode 110-1, a first-second electrode 110-2, a first-third electrode 110-3, and a first-fourth electrode 110-4 that are sequentially arranged in the third-second direction. Minimum separation distances from the first-first electrode 110-1, the first-second electrode 110-2, the first-third electrode 110-3, and the first-fourth electrode 110-4 to the fourth surface in the third-second direction may increase in this order. In addition, the (1-1b)th thermoelectric element 100-1b may include a first-fifth electrode 110-5, a first-sixth electrode 110-6, a first-seventh electrode 110-7, and a first-eighth electrode 110-8 that are sequentially arranged in the third-second direction. Minimum separation distances from the first-fifth electrode 110-5, the first-sixth electrode 110-6, the first-seventh electrode 110-7, and the first-eighth electrode 110-8 to the fourth surface in the third-second direction may increase in this order. That is, positions of the thermoelectric legs or electrodes may be different or identical to each other with the third direction as an axis even in each of the plurality of thermoelectric elements.

In the heat converter according to another embodiment, electrical connection may be made between thermoelectric legs or electrodes having the same minimum separation distance from the fourth surface within the plurality of thermoelectric elements.

First, in the (1-1a)th thermoelectric element 100-1a, the first-first electrode 110-1 may include a plurality of first sub-electrodes 110-1a to 110-1c arranged in the second direction. In addition, it may be said that the first-first electrode 110-1 refers to a "first group sub-electrode," and the plurality of thermoelectric elements include a "plurality of group sub-electrodes," but, hereinafter, descriptions will be made on the basis of the first-first electrode. For example, the first-first electrode 110-1 may include a first-first sub-electrode 110-1a, a first-second sub-electrode 110-1b, and a first-third sub-electrode 110-1c. In addition, the first-first sub-electrode 110-1a, the first-second sub-electrode 110-1b, and the first-third sub-electrode 110-1c may be arranged in series in the second direction and may have the same minimum separation distance from the fourth surface in the third-second direction. That is, the temperature of gas heat-exchanged with the first-first sub-electrode 110-1a, the first-second sub-electrode 110-1b, and the first-third sub-electrode 110-1c may be substantially similar. Accordingly, the first-first sub-electrode 110-1a, the first-second sub-electrode 110-1b, and the first-third sub-electrode 110-1c are electrically connected in series so that power generation performance of the heat converter may be improved.

Like the first-first electrode 110-1, the first-second electrode 110-2, the first-third electrode 110-3, and the first-fourth electrode 110-4 may each include a plurality of sub-electrodes, and the plurality of sub-electrodes of each of the first-second electrode 110-2, the first-third electrode 110-3, and the first-fourth electrode 110-4 may have the same minimum separation distance from the fourth surface in the third-second direction and may be heat exchanged with gas of similar temperature.

Likewise, in the (1-1b)th thermoelectric element 100-1b, the first-fifth electrode 110-5 may have a plurality of sub-electrodes arranged in the second direction, and the plurality of sub-electrodes may be fifth sub-electrodes 110-5a to 110-5c.

Further, the first-fifth electrode 110-5 may include a fifth-first sub-electrode 110-5a, a fifth-second sub-electrode 110-5b, and a fifth-third sub-electrode 110-5c. In addition, the fifth-first sub-electrode 110-5a, the fifth-second sub-electrode 110-5b, and the fifth-third sub-electrode 110-5c may be arranged in series in the second direction and may have the same minimum separation distance from the fourth surface in the third-second direction. That is, the temperature of gas heat-exchanged with the fifth-first sub-electrode 110-5a, the fifth-second sub-electrode 110-5b, and the fifth-third sub-electrode 110-5c may be substantially similar. Accordingly, the fifth-first sub-electrode 110-5a, the fifth-second sub-electrode 110-5b, and the fifth-third sub-electrode 110-5c are electrically connected in series so that power generation performance of the heat converter may be improved.

In addition, the first-fifth electrode 110-5 may be disposed in series with the first-first electrode 110-1 of the (1-1a)th thermoelectric element 100-1a, which is the adjacent thermoelectric element, in the second direction and may be electrically connected thereto. Specifically, the fifth-first sub-electrode 110-5a of the first-fifth electrode 110-5 may be electrically connected in series with the first-third sub-electrode 110-1c. In addition, the first-fifth electrode 110-5 and the first-first electrode 110-1 may have the same minimum separation distance from the fourth surface in the third-second direction and may be heat exchanged with gas of similar temperature. Accordingly, the power generation performance of the heat converter may be further improved.

Similarly, the first-sixth electrodes 110-5 may be electrically connected to the first-second electrode 110-2, the first-seventh electrode 110-7 may be electrically connected to the third electrode 110-3, and the first-eighth electrode 110-8 may be electrically connected to the first-fourth electrode 110-4.

As described above, according to the heat converter according to another embodiment, in each group thermoelectric element, connections between the plurality of electrodes in the thermoelectric element may be made depending on whether the minimum separation distance from the fourth surface to the third direction is the same. Thus, the heat conversion efficiency of heat converter may be further improved.

FIG. 21 is a view illustrating a first thermoelectric module and a first thermoelectric element in a heat converter according to still another embodiment of the present invention.

Referring to FIG. 21, according to the heat converter according to still another embodiment, in at least one of a plurality of thermoelectric elements in the same group thermoelectric element, thermoelectric legs or electrodes having the same minimum separation distance from a fourth surface in a third direction may be electrically connected to each other. In particular, adjacent thermoelectric legs or electrodes may be connected in series with each other.

Specifically, descriptions will be made on the basis of a (1-1a)th thermoelectric element 100-1a and a (1-1b)th thermoelectric element 100-1b in a first group thermoelectric element HA1, First, the (1-1a)th thermoelectric element 100-1a may include a plurality of thermoelectric legs and electrodes (however, as described above, description will be made on the basis of a first electrode). In particular, the (1-1a)th thermoelectric element 100-1a may include a first-first electrode, a first-second electrode, a first-third electrode, and a first-fourth electrode that are sequentially arranged in a third-second direction. The above description is the same as that described with reference to FIG. 20, and the description of first-fifth to first-eighth electrodes of the (1-1b)th thermoelectric element 100-1b may be applied in the same manner as described with reference to FIG. 20.

Accordingly, minimum separation distances from the fourth surface in the third-second direction may increase in the order of the first-first electrode, the first-second electrode, the first-third electrode, and the first-fourth electrode. In addition, the (1-1b)th thermoelectric element 100-1b may include a first-fifth electrode, a first-sixth electrode, a first-seventh electrode, and a first-eighth electrode that are sequentially arranged in the third-second direction. In addition, the minimum separation distance from the fourth surface in the third-second direction may increase in the order of the first-fifth electrode, the first-sixth electrode, the first-seventh electrode, and the first-eighth electrode. As described above, the positions of the thermoelectric legs or electrodes may be different or identical to each other with the third direction as an axis even in each of the plurality of thermoelectric elements.

However, in the heat converter according to still another embodiment, the first-first electrode may include first-first to first-fourth sub-electrodes 110-1a to 110-1d. Unlike in FIG. 20, the heat converter according to still another embodiment further includes the first-fourth sub-electrode 110-1d, but the number of the sub-electrodes may be changed according to the size of the thermoelectric element or the like.

In addition, the first-second electrode may include second-first to second-fourth sub-electrodes 110-2a to 110-2d. At this point, the first-first electrode and the first-second electrode may be electrically connected to each other. For example, the first-first sub-electrode 110-1a may be connected in series with the second-first sub-electrode 110-2a, and the second-first sub-electrode 110-2a may be connected in series with the second-second sub-electrode 110-2b. In addition, sequentially, the second-second sub-electrode 110-2b may be connected in series with the first-second sub-electrode 110-1b, the first-second sub-electrode 110-1b may be connected in series with the first-third sub-electrode 110-1c, the first-third sub-electrode 110-1c may be connected in series with the second-third sub-electrode 110-2c, and the second-third sub-electrode 110-2c may be connected in series with the first-fourth sub-electrode 110-1d.

Likewise, the first-fifth electrode may include fifth-first to fifth-fourth sub-electrodes 110-5a to 110-5d, and the first-sixth electrode may include sixth-first to sixth-fourth sub-electrodes 110-6a to 110-6d. At this point, the first-fifth electrode and the first-sixth electrode may be electrically connected to each other. For example, the fifth-first sub-electrode 110-5a may be connected in series with the sixth-first sub-electrode 110-6a, and the sixth-first sub-electrode 110-6a may be connected in series with the sixth-second sub-electrode 110-6b. In addition, sequentially, the sixth-second sub-electrode 110-6b may be connected in series with the fifth-second sub-electrode 110-5b, the fifth-second sub-electrode 110-5b may be connected in series with the fifth-third sub-electrode 110-5c, the fifth-third sub-electrode 110-5c may be connected in series with the sixth-third sub-electrode 110-6c, and the sixth-third sub-electrode 110-6c may be connected in series with the fifth-fourth sub-electrode 110-5d.

However, the first-third electrode may be connected in series with the first-seventh electrode, and the first-fourth electrode may be connected in series with the first-eighth electrode. The contents described with reference to FIG. 21 may be similarly applied to a plurality of sub-electrodes. In addition, with such a configuration, power generation performance of the heat converter may be improved. In addition, a desired power generation performance may be easily controlled by adjusting the connection relationship between the sub-electrodes.

FIG. 22 is a view illustrating a modified example of FIG. 19.

Referring to FIG. 22, a group thermoelectric element and at least one of the plurality of group thermoelectric elements, which have the same minimum separation distance from the fourth surface in the third direction, may be electrically connected to each other.

Specifically, the first group thermoelectric element HA1 may include a plurality of thermoelectric elements arranged in series in the second direction, and the plurality of thermoelectric elements may be connected in series to each other in the second direction. Likewise, the second group thermoelectric element HA2 may include a plurality of thermoelectric elements arranged in series in the second direction, and the plurality of thermoelectric elements may be connected in series to each other in the second direction.

Meanwhile, the third group thermoelectric element HA3 and the fourth group thermoelectric element HA4 may each include a plurality of thermoelectric elements, and the plurality of thermoelectric elements may be electrically connected in the third-second direction or the third-first direction.

FIGS. 23 and 24 are graphs describing the effect of the first thermoelectric modules according to the second embodiment.

Referring to FIGS. 23 and 24, when the temperature difference between the heat-absorbing part and the heating part is set differently for three identical thermoelectric elements (hereinafter, referred to as a first thermoelectric element TE1, a second thermoelectric element TE2, and a third thermoelectric element TE3), generated power with respect to current for each of the three thermoelectric elements is illustrated in FIG. 24, and generated power with respect to current for the three thermoelectric elements in the case that the first to third thermoelectric elements TE1 to TE3 are connected in series is illustrated in FIG. 23.

Here, in the thermoelectric element, an internal resistance is 1.73Ω when the temperature difference between the heating part and the heat-absorbing part is 100° C., the internal resistance is 1.94Ω when the temperature difference is 150° C., and the internal resistance is 2.11Ω when the temperature difference is 200° C.

First, referring to FIG. 24, in the case of the first thermoelectric element TE1 in which the temperature difference between the heating part and the heat-absorbing part is 100° C., a maximum generated power (about 3.43 W) may be provided at a first current CA1 of about 1.4 A. In addition, in the case of the second thermoelectric element TE2 in which the temperature difference between the heating part and the heat-absorbing part is 150° C., a maximum generated power (about 6.79 W) may be provided at a second current CA2 of about 1.8 A. In addition, in the case of the third thermoelectric element TE3 in which the temperature difference between the heating part and the heat-absorbing part is 200° C., a maximum generated power (about 10.26 W) may be provided at a third current CA3 of about 2.2 A. In addition, when a plurality of each of the first to third thermoelectric elements TE1 to TE3 are connected in series, the amount of power may increase in proportion to the number of thermoelectric elements.

Alternatively, referring to FIG. 23, when the first thermoelectric element TE1, the second thermoelectric element TE2, and the third thermoelectric element TE3 are connected in series, an average of the temperature differences between the heating parts and the heat-absorbing parts is 150° C. (that is, (100° C.+150° C.+200° C.)/3), and a maximum generated power (18.22 W) may be provided at about 1.72 A which is similar to the value of the second current CA. That is, the maximum generated power (18.22 W) may be less than a maximum generated power (about 20.4 W) when three second thermoelectric elements TE2 are connected in series. In addition, the above-described value may be less than the sum of the maximum generated power of each of the first to third thermoelectric elements TE1 to TE3 (20.48 W, 3.43+6.79+10.26).

That is, it can be seen that a series connection of thermoelectric elements each having a great temperature difference decreases a maximum generated power. Accordingly, in the heat converter according to various embodiments described above, power generation performance may be improved by connecting thermoelectric elements or thermoelectric legs (electrodes) with similar temperature differences in series.

FIG. 25 is a perspective view of a heat converter according to a third embodiment of the present invention, FIGS. 26 and 27 illustrate an interior of a frame of the heat converter of FIG. 25, and FIG. 28 is a front view of a cooling water inlet of a heat converter according to another embodiment of the present invention. FIG. 29 is a perspective view of a structure in which a frame is removed from the heat converter of FIG. 25, and FIG. 30 is an exploded perspective view of the structure in which the frame is removed from the heat converter of FIG. 25. FIG. 31 is a front view of the structure in which the frame is removed from the heat converter of FIG. 25 viewed from a cooling water inlet side, and FIG. 32 is a front view of the structure in which the frame is removed from the heat converter of FIG. 25 viewed from a cooling water outlet side. FIG. 33 is a cross-sectional view of the heat converter of FIG. 25 in a first direction and FIG. 34 is a partially enlarged view of FIG. 33. FIG. 35 is a cross-sectional view of the structure in which the frame is removed from the heat converter of FIG. 25 in a second direction, and FIG. 36 is a set of views illustrating results obtained by simulating gas flows.

Referring to FIGS. 25 to 36, a heat converter 60 includes a unit module 6000 and a frame 7000.

The unit module 6000 includes a plurality of thermoelectric modules 6100 and a cooling member 6200.

The cooling member 6200 includes a cooling water passage pipe 6210, a first flange 6220 disposed at a cooling water inlet In of the cooling water passage pipe 6210, and a second flange 6230 disposed at a cooling water outlet Out of the cooling water passage pipe 6210.

The plurality of thermoelectric modules 6100 include a first thermoelectric module 6100-1 disposed on a first outer wall surface 6212 of the cooling water passage pipe 6210 and a second thermoelectric module 6100-2 disposed on a second outer wall surface 6214 of the cooling water passage pipe 6210.

Here, the second outer wall surface 6214 is a surface opposite to the first outer wall surface 6212.

The frame 7000 supports the unit module 6000 and accommodates the plurality of thermoelectric modules 6100 and further accommodates the cooling water passage pipe 6210 and the second flange 6230 of the cooling member 6200.

To this end, the frame 7000 includes a first wall 7100, a second wall 7200, a third wall 7300, and a fourth wall 7400. The first wall 7100 and the second wall 7200 may be disposed to face each other, the third wall 7300 and the fourth wall 7400 may be disposed to face each other, and each of the third wall 7300 and the fourth wall 7400 may be disposed between the first wall 7100 and the second wall 7200. Accordingly, the first wall 7100, the second wall 7200, the third wall 7300, and the fourth wall 7400 may be connected to each other to form one interior space. In addition, the frame 7000 may include a first opening 7002 surrounded by the first wall 7100, the second wall 7200, the third wall 7300, and the fourth wall 7400 and a second opening 7004 surrounded by the first wall 7100, the second wall 7200, the third wall 7300, and the fourth wall 7400.

The first wall 7100 is disposed on a side of the first flange 6220 of the cooling member 6200 included in the unit module 6000, and a first hole 7110 corresponding to the cooling water inlet In is formed in the first wall 7100. The second wall 7200 is disposed on a side of the second flange 6230 of the cooling member 6200 included in the unit module 6000, and a second hole 7210 corresponding to the cooling water outlet Out is formed in the second wall 7200. The third wall 7300 is disposed on a side of the first thermoelectric module 6100-1 included in the unit module 6000 to be spaced apart from and to face the first thermoelectric module 6100-1. In addition, the fourth wall 7400 is disposed on a side of the second thermoelectric module 6100-2 included in the unit module 6000 to be spaced apart from and to face the second thermoelectric module 6100-2.

Accordingly, cooling water may flow in a direction from the first flange 6220 toward the second flange 6230. That is, the cooling water may be introduced into the cooling water inlet In of the first wall 7100, pass through the cooling water passage pipe 6210, and be discharged through the cooling water outlet Out of the second wall 7200. In addition, a high-temperature gas having a temperature higher than a temperature of the cooling water may flow between the first thermoelectric module 6100-1 and the third wall 7300 and between the second thermoelectric module 6100-2 and the fourth wall 7400 to be parallel to a direction in which the first thermoelectric module 6100-1 and the second thermoelectric module 6100-2 are disposed and to be perpendicular to a direction in which the cooling water flows. That is, the high-temperature gas having the temperature higher than the temperature of the cooling water is introduced into the first opening 7002 of the frame 7000 and discharged through the second opening 7004. For convenience of description, in the present specification, the direction in which the cooling water flows may be referred to as a first direction, a direction in which the high-temperature gas flows may be referred to as a second direction, and a direction perpendicular to the first direction and the second direction, that is, a direction from the first thermoelectric module 6100-1 to the second thermoelectric module 6100-2, may be referred to as a third direction.

Accordingly, among both surfaces of the plurality of thermoelectric modules 6100, a surface disposed on a side of the cooling water passage pipe 6210 may be a low-temperature part, that is, a heat-dissipating part, and a surface disposed to face a wall surface of the frame 7000, for example, a surface of the third wall 7300 or the fourth wall 7400, may be a high-temperature part, that is, a heat-absorbing part.

The heat converter 60 according to the third embodiment of the present invention may generate power using a temperature difference between cooling water flowing through the cooling water passage pipe 6210 and high-temperature gas passing through separated spaces between the plurality of thermoelectric modules 6100 and the wall surface of the frame 7000, that is, a temperature difference between the heat-dissipating part and the heat-absorbing part of the thermoelectric module 6100. Here, the cooling water may be water but is not limited thereto and may be various kinds of fluids exhibiting cooling performance. The temperature of the cooling water introduced into the cooling water passage pipe 6210 may be less than 100° C., preferably less than 50° C., and more preferably less than 40° C., but the present invention is not limited thereto. The temperature of the cooling water passing through the cooling water passage pipe 6210 and then being discharged may be higher than the temperature of the cooling water introduced into the cooling water passage pipe 6210. The temperature of the high-temperature gas passing through the separated spaces between the plurality of thermoelectric modules 6100 and the wall surface of the frame 7000 may be higher than the temperature of the cooling water. For example, the temperature of the high-temperature gas passing through the separated spaces between the plurality of thermoelectric modules 6100 and the wall surface of the frame 7000 may be 100° C. or more, preferably 150° C. or more, and more preferably 200° C. or more, but the present invention is not limited thereto. In this case, a width of each of the separated spaces between the plurality of thermoelectric modules 6100 and the wall surface of the frame 7000 may range from several millimeters to several tens of millimeters and may be varied according to a size of the heat converter, the temperature of the gas being introduced, an inflow velocity of the gas, a required amount of power generation, and the like.

In the present specification, descriptions are focused on an example in which the frame 7000 accommodates one unit module 6000, but the present invention is not limited thereto. As illustrated in FIG. 28, a frame may accommodate a plurality of unit modules 6000.

To this end, a plurality of first holes corresponding to a plurality of cooling water inlets of the plurality of unit modules 6000 may be formed in a first wall 7100 of a frame 7000, and a plurality of second holes corresponding to a plurality of cooling water outlets of the plurality of unit modules 6000 may be formed in a second wall 7200 of a frame 7000. In addition, the plurality of unit modules may be arranged to be parallel by being spaced apart from each other. For example, a first thermoelectric module 6100-1 of each of the unit modules 6000 may be disposed parallel to and spaced apart from a second thermoelectric module 6000-2 of the adjacent unit module 6000 so as to face thereto. The number of the unit modules 6000 accommodated in the frame 7000 may be varied according to a size of the heat converter, the temperature of the gas being introduced, an inflow velocity of the gas, a required amount of power generation, and the like.

Here, thermal conductivity of the cooling member 6200 may be higher than thermal conductivity of the frame 7000. For example, the cooling member 6200 may be made of aluminum and the frame 7000 may be made of stainless steel. Thus, a temperature difference between a low-temperature part and a high-temperature part of the thermoelectric module may be maximized so that the performance of the heat converter may be improved.

The first thermoelectric module 6100-1 and the second thermoelectric module 6100-2 may each include a plurality of thermoelectric elements 100. The number of thermoelectric elements included in each thermoelectric module may be adjusted according to the required amount of power generation.

The plurality of thermoelectric elements 100 included in each thermoelectric module may be electrically connected to each other, and at least some of the plurality of thermoelectric elements 100 may be electrically connected using a bus bar (not shown). The busbar may be disposed, for example, on an outlet through which high-temperature gas passes and then is discharged and may be connected to an external terminal. Thus, power may be supplied to the first thermoelectric module 6100-1 and the second thermoelectric module 6100-2 without disposing a PCB for the first thermoelectric module 6100-1 and the second thermoelectric module 6100-1 in the heat converter so that it is easy to design and assemble the heat converter.

According to the third embodiment of the present invention, the unit module 6000 may further include a heat-insulating layer 6400 and a shield layer 6500. The heat-insulating layer 6400 may be disposed to surround at least a portion of outer surfaces of the cooling water passage pipe 6210 excluding a region, in which the thermoelectric module 6100 is disposed, of the outer surfaces of the cooling water passage pipe 6210. Heat insulation between a hot side and a cold side of the thermoelectric module 6100 may be maintained due to the heat-insulating layer 6400 so that power generation efficiency may be increased.

In addition, the shield layer 6500 may be disposed on the heat-insulating layer 6400 and may protect the heat-insulating layer 6400 and the thermoelectric module 6100. To this end, the shield layer 6500 may include a stainless material.

The shield layer 6500 may be fastened to the cooling water passage pipe 6200 by screws. Thus, the shield layer 6500 may be stably coupled to the unit module 6000.

Here, each of the first thermoelectric module 6100-1 and the second thermoelectric module 6100-2 may be adhered to the first outer wall surface 6210 and the second outer wall surface 6220 of the cooling water passage pipe 6200, respectively, using thermal pads. Since the thermal pad easily transfers heat, heat transfer between the cooling water passage pipe 6210 and the thermoelectric module may not be hindered. In addition, each of the first thermoelectric module 6100-1 and the second thermoelectric module 6100-2 may further include a heat sink (not shown) disposed at a hot side of the thermoelectric element 100 and a metal plate (not shown), for example, an aluminum plate, disposed at a cold side of the thermoelectric element 100. At this point, the heat sink may be disposed toward the wall surface of the adjacent frame 7000, and the heat sink and the wall surface of the frame 7000 may be spaced apart from each other by a predetermined interval. Accordingly, the high-temperature gas passing through the heat converter 60 according to the embodiment of the present invention may be efficiently transferred to the hot side of the thermoelectric element 100 through the heat sink. Meanwhile, since the metal plate, for example, an aluminum plate, has a high heat transfer efficiency, the temperature of the cooling water passing through the cooling water passage pipe 6210 may be efficiently transferred to the cold side of the thermoelectric element 100 through the metal plate.

Hereinafter, the structure of the cooling member of the heat converter according to the third embodiment of the present invention will be described in more detail.

According to the embodiment of the present invention, a size of the first flange 6220 disposed at the cooling water inlet In of the cooling water passage pipe 6210 is greater than a size of the second flange 6230 disposed at the cooling water outlet Out of the cooling water passage pipe 6210, the first flange 6220 is disposed on an outer wall surface 7120 of the first wall 7100 of the frame 7000, and the second flange 6230 is disposed on an inner wall surface 7220 of the second wall 7200 of the frame 7000.

Here, each of the size of the first flange 6220 and the size of the second flange 6230 may refer to at least one of a height H and a width W.

To this end, a size of the first hole 7110 formed in the first wall 7100 of the frame 7000 may be less than a size of the first flange 6220 and may be greater than the size of the second flange 6230, and a size of the second hole 7210 formed in the second wall 7200 of the frame 7000 may be less than the size of the second flange 6230. Accordingly, as illustrated in FIG. 27, when the heat converter 60 is assembled, the second flange 6230 of the unit module 6000 may be inserted first through the first hole 7110 of the frame 7000, the second flange 6230 may disposed on the inner wall surface 7220 of the second wall 7200, and the first flange 6220 may be disposed on the outer wall surface 7120 of the first wall 7100 of the frame 7000.

As described above, when the first flange 6220 is disposed on the outer wall surface 7120 of the first wall 7100 of the frame 7000 and when the second flange 6230 is disposed on the inner wall surface 7130 of the second wall 7200 of the frame 7000, the assemblability of the heat converter 60 may be improved as described above, and also, heat exchange between the cooling water and the cooling member may be efficiently performed.

That is, when cooling water is to be injected through the cooling water inlet In, an external cooling water supply part (not shown) may inject the cooling water while being fixed to the outer wall surface 7120 of the first wall 7100 of the frame 7000. At this point, the cooling water supply part (not shown) may be disposed to surround the entire first flange 6220, and accordingly, the entire area of the cooling member 6200 in contact with the cooling water may be increased. When the cooling member 6200 is made of a material having high thermal conductivity, for example, aluminum, as described above, the first flange 6220, which is disposed on a side of the cooling water inlet In and is in direct contact with the supplied cooling water, may be rapidly cooled, and cooled air of the first flange 6220 may be transferred to the low-temperature part the thermoelectric module 6100 through the cooling water passage pipe 6210.

Further, when the first flange 6220 is disposed on the outer wall surface 7120 of the first wall 7100 of the frame 7000 and the second flange 6230 is disposed on the inner wall surface 7130 of the second wall 7200 of the frame 7000, the leakage of the cooling water may be prevented.

That is, when cooling water is to be injected through the cooling water inlet In, the external cooling water supply part (not shown) may inject the cooling water while being fixed to the outer wall surface 7120 of the first wall 7100 of the frame 2000. At this point, the cooling water supply part (not shown) may be disposed to surround the entire first flange 6220, and the cooling water supplied from the cooling water supply part (not shown) may be introduced into the cooling water passage pipe 6210 through the cooling water inlet In connected to the first flange 6220.

As illustrated in FIG. 34, when the flange disposed on the inner wall surface of the frame 7000, that is, the second flange 6230, becomes the cooling water inlet, the cooling water may flow out through a space between the inner wall surface of the frame 7000 and the flange, and thus the cooling water may penetrate into the hot side of the thermoelectric module 6100.

Meanwhile, according to the third embodiment of the present invention, a gas guide member configured to control the flow of the high-temperature gas may be further provided.

To this end, referring to FIG. 35, a gas guide member 6600 may be disposed in a direction in which the high-temperature gas is introduced. For example, the cooling water passage pipe 6210 further includes a third outer wall surface 6216 disposed between the first outer wall surface 6212 and the second outer wall surface 6214 to face a side through which the high-temperature gas is introduced, that is, the first opening 7002, and a fourth outer wall surface 6218 disposed between the first outer wall surface 6212 and the second outer wall surface 6214 to face a side through which the high-temperature gas is discharged, that is, the second opening 7004, and may further include the gas guide member 6600 that is disposed on the third outer wall surface 6216 and has a shape in which a distance from the third outer wall surface 6216 increases toward a center between the first outer wall surface 6212 and the second outer wall surface 6214. That is, the gas guide member 6600 may have an umbrella shape or a roof shape. Accordingly, when high-temperature gas is introduced, the high-temperature gas may be guided to pass through a side surface of the unit module 6000, that is, a separated space between the unit module 6000 and the frame 7000. In addition, when the gas guide member 6600 has an umbrella shape or a roof shape, an air layer may be formed between the third outer wall surface 6216 of the cooling water passage pipe 6210 and the gas guide member 6600 so that heat insulation performance may be improved.

Here, in order to increase the heat insulation performance of the third outer wall surface 6216 of the cooling water passage pipe 6210 disposed in the direction in which the high-temperature gas is introduced, the third outer wall surface 6216 may further include the heat-insulating layer 6400. In addition, the shield layer 6500 may be further disposed between the heat-insulating layer 6400 and the gas guide member 6600 to protect the cooling water passage pipe 6210 and the heat-insulating layer 6500. Here, the shield layer may have a C-shape so as to be disposed on a portion of the first outer wall surface 6212 and a portion of the second outer wall surface 6214 as well as the third outer wall surface 6216 on which the heat-insulating layer 6400 is disposed, and the gas guide member 6600, the shield layer 6500, and the cooling water passage pipe 6210 may be fastened together. Alternatively, although not illustrated in the drawing, the gas guide member 6600 and the shield layer 6500 may be integrally formed.

FIG. 36 is a set of views illustrating simulation results for describing the effect of the gas guide member. It can be seen that gas is more uniformly distributed and flows in a structure having the gas guide member as shown in FIGS. 36B and 36C compared to a structure having no gas guide member as shown in FIG. 36A. In addition, referring to FIG. 36, it can be seen that gas is more uniformly distributed and flows as the height of the gas guide member increases as shown in FIG. 36C. However, when a highest point of the gas guide member 6600 is higher than the second flange 6230, high-temperature gas may be introduced into a space between the gas guide member 6600 and the shield layer 6500, and thus cooling performance may be affected. Accordingly, the highest point of the gas guide member may be disposed not to be higher than the second flange 6230. Alternatively, when the highest point of the gas guide member is formed to be higher than the second flange 6230, the space between the gas guide member 6600 and the shield layer 6500 may be sealed to prevent the high-temperature gas from being introduced into the space between the gas guide member 6600 and the shield layer 6500.

Although the exemplary embodiments of the present invention have been described above, it may be understood by those skilled in the art that a variety of modifications and changes may be made without departing from the concept and scope of the present invention disclosed within the range of the following claims.

The invention claimed is:
1. A heat converter comprising:
    a flow path member including a flow path, and having an upper surface and a lower surface that are spaced apart from each other in a first direction, and a first side surface and a second side surface that are disposed between the upper surface and the lower surface and spaced apart from each other in a second direction perpendicular to the first direction;
    a first thermoelectric module and a second thermoelectric module disposed on the first side surface and the second side surface of the flow path member, respectively;
    a heat-insulating layer disposed on the upper surface of the flow path member;
    a guide member disposed on the heat-insulating layer and having a width in the second direction which is gradually reduced in the first direction; and a shield member disposed between the heat-insulating layer and the guide member, wherein the shield member extends toward the first and second side surfaces of the flow path member, on the upper surface of the flow path member, the first thermoelectric module protrudes further in the second direction than the shield member extending toward the first side surface, and the second thermoelectric module protrudes further in the second direction than the shield member extending toward the second side surface.

2. The heat converter of claim 1, wherein the first thermoelectric module includes a first thermoelectric element disposed on the first side surface and a first heat sink disposed on the first thermoelectric element, the second thermoelectric module includes a second thermoelectric element disposed on the second side surface and a second heat sink disposed on the second thermoelectric element, the first heat sink protrudes further in the second direction than the shield member extending toward the first side surface, and the second heat sink protrudes further in the second direction than the shield member extending toward the second side surface.

3. The heat converter of claim 1, wherein the flow path member includes a third side surface and a fourth side surface that are perpendicular to the first side surface and the second side surface and face each other, the heat converter further includes a first flange disposed on the third side surface and a second flange disposed on the fourth side surface, and a size of the first flange is greater than a size of the second flange.

4. The heat converter of claim 3, further comprising a frame configured to accommodate the flow path member, the first thermoelectric module, and the second thermoelectric module, wherein the first flange is disposed outside the frame, and the second flange is disposed inside the frame.

5. The heat converter of claim 4, wherein the frame includes a first wall in which a first hole corresponding to the third side surface is formed, a second wall facing the first wall and in which a second hole corresponding to the fourth side surface is formed, a third wall disposed between the first wall and the second wall to face the first thermoelectric module, and a fourth wall disposed between the first wall and the second wall to face the second thermoelectric module, the first flange is disposed on an outer wall surface of the first wall, and the second flange is disposed on an inner wall surface of the second wall.

6. The heat converter of claim 5, wherein a size of the first hole is less than the size of the first flange and is greater than the size of the second flange, and a size of the second hole is less than the size of the second flange.

7. The heat converter of claim 6, wherein the first flange is fastened to the first wall, and the second flange is fastened to the second wall.

8. The heat converter of claim 6, wherein a sealing material is disposed on at least one of positions between the first flange and the outer wall surface of the first wall and between the second flange and the inner wall surface of the second wall.

9. The heat converter of claim 5, wherein the frame includes a first opening and a second opening that are formed by the first wall, the second wall, the third wall, and the fourth wall, the upper surface of the flow path member is disposed toward the first opening, and the lower surface of the flow path member is disposed toward the second opening.

10. The heat converter of claim 9, wherein the first thermoelectric module and the third wall are disposed spaced apart from each other, and the second thermoelectric module and the fourth wall are disposed spaced apart from each other.

11. The heat converter of claim 10, wherein the first thermoelectric module includes a first thermoelectric element disposed on the first side surface and a first heat sink disposed on the first thermoelectric element, the second thermoelectric module includes a second thermoelectric element disposed on the second side surface and a second heat sink disposed on the second thermoelectric element, the first heat sink is spaced apart from the third wall, and the second heat sink is spaced apart from the fourth wall.

12. The heat converter of claim 11, further comprising a metal plate disposed on at least one of positions between the first side surface and the first thermoelectric element and between the second side surface and the second thermoelectric element.

13. The heat converter of claim 1, wherein the first thermoelectric module includes a plurality of thermoelectric element groups sequentially arranged in a direction toward the lower surface from the upper surface, and each of the thermoelectric element groups includes a plurality of thermoelectric elements sequentially arranged in a direction perpendicular to the direction toward the lower surface from the upper surface.

14. The heat converter of claim 13, wherein the plurality of thermoelectric elements in each of the thermoelectric element groups are connected to each other in series.

15. The heat converter of claim 13, wherein a first thermoelectric element included in a first thermoelectric element group of the plurality of thermoelectric element groups is electrically connected to a second thermoelectric element included in a second thermoelectric element group of the plurality of thermoelectric element groups.

16. The heat converter of claim 13, wherein a coupling hole is formed at the first side surface between some of the plurality of thermoelectric elements.

17. The heat converter of claim 1, wherein the shield member is fastened to the flow path member.

18. A heat converter comprising:

a plurality of unit modules arranged spaced apart from and parallel to each other; and a frame configured to accommodate the plurality of unit modules, wherein each of the unit modules includes:

a flow path member including a flow path, and having an upper surface and a lower surface that are spaced apart from each other in a first direction, and a first side surface and a second side surface that are disposed between the upper surface and the lower surface and spaced apart from each other in a second direction perpendicular to the first direction;

a first thermoelectric module and a second thermoelectric module disposed on the first side surface and the second side surface of the flow path member, respectively;

a heat-insulating layer disposed on the upper surface of the flow path member;

a guide member disposed on the heat-insulating layer and having a width in the second direction which is gradually reduced in the first direction; and a shield member disposed between the heat-insulating layer and the guide member, the shield member extends toward the first and second side surfaces of the flow path member, on the upper surface of the flow path member, the first thermoelectric module protrudes further in the second direction than the shield member extending toward the first side surface, the second thermoelectric module protrudes further in the second direction than the shield member extending toward the second side surface, and the plurality of unit modules are spaced apart from each other in the second direction.

19. The heat converter of claim 18, wherein the flow path member includes a third side surface and a fourth side surface that are perpendicular to the first side surface and the second side surface and face each other, a plurality of first holes corresponding to the third side surface of each of the unit modules are formed in a first wall of the frame, and a plurality of second holes corresponding to the fourth side surface of each of the unit modules are formed in a second wall of the frame, which faces the first wall.

* * * * *